(12) United States Patent
Yokoi et al.

(10) Patent No.: US 8,368,082 B2
(45) Date of Patent: Feb. 5, 2013

(54) METHOD FOR MANUFACTURING SEMICONDUCTOR DEVICE, SEMICONDUCTOR DEVICE AND ELECTRONIC APPLIANCE

(75) Inventors: Tomokazu Yokoi, Kanagawa (JP); Yujiro Sakurada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/282,557

(22) Filed: Oct. 27, 2011

(65) Prior Publication Data

US 2012/0037903 A1 Feb. 16, 2012

Related U.S. Application Data

(62) Division of application No. 12/275,840, filed on Nov. 21, 2008, now Pat. No. 8,048,771.

(30) Foreign Application Priority Data

Nov. 27, 2007 (JP) ................................. 2007-305289

(51) Int. Cl.
*H01L 27/14* (2006.01)
(52) U.S. Cl. ........................................................ 257/72
(58) Field of Classification Search .................... 257/59, 257/72
See application file for complete search history.

(56) References Cited

U.S. PATENT DOCUMENTS

| 5,744,824 | A | 4/1998 | Kousai et al. |
|---|---|---|---|
| 6,127,199 | A | 10/2000 | Inoue et al. |
| 6,306,694 | B1 | 10/2001 | Yamazaki et al. |
| 6,818,529 | B2 | 11/2004 | Bachrach et al. |
| 7,317,438 | B2 | 1/2008 | Yamazaki et al. |
| 7,508,034 | B2 | 3/2009 | Takafuji et al. |
| 2004/0183133 | A1 | 9/2004 | Takafuji et al. |
| 2004/0219723 | A1 | 11/2004 | Peng et al. |
| 2005/0173761 | A1 | 8/2005 | Takafuji et al. |
| 2008/0245406 | A1 | 10/2008 | Yamazaki et al. |
| 2008/0246109 | A1 | 10/2008 | Ohnuma et al. |
| 2008/0280424 | A1 | 11/2008 | Yamazaki et al. |
| 2008/0308810 | A1 | 12/2008 | Akimoto |

FOREIGN PATENT DOCUMENTS

| JP | 08-006053 B2 | 1/1996 |
|---|---|---|
| JP | 10-125929 A | 5/1998 |
| JP | 10-125931 A | 5/1998 |
| JP | 2004-134675 A | 4/2004 |
| JP | 2005-539259 A | 12/2005 |

*Primary Examiner* — Bradley K Smith
(74) *Attorney, Agent, or Firm* — Fish & Richardson P.C.

(57) ABSTRACT

A non-single-crystal semiconductor layer is formed over a substrate, and then a single crystal semiconductor layer is formed over part of the non-single-crystal semiconductor layer. Thus, a semiconductor element of a region which requires a large area (e.g. a pixel region in a display device) can be formed using the non-single-crystal semiconductor layer, and a semiconductor element of a region which requires high speed operation (e.g. a driver circuit region in a display device) can be formed using the single crystal semiconductor layer.

4 Claims, 28 Drawing Sheets

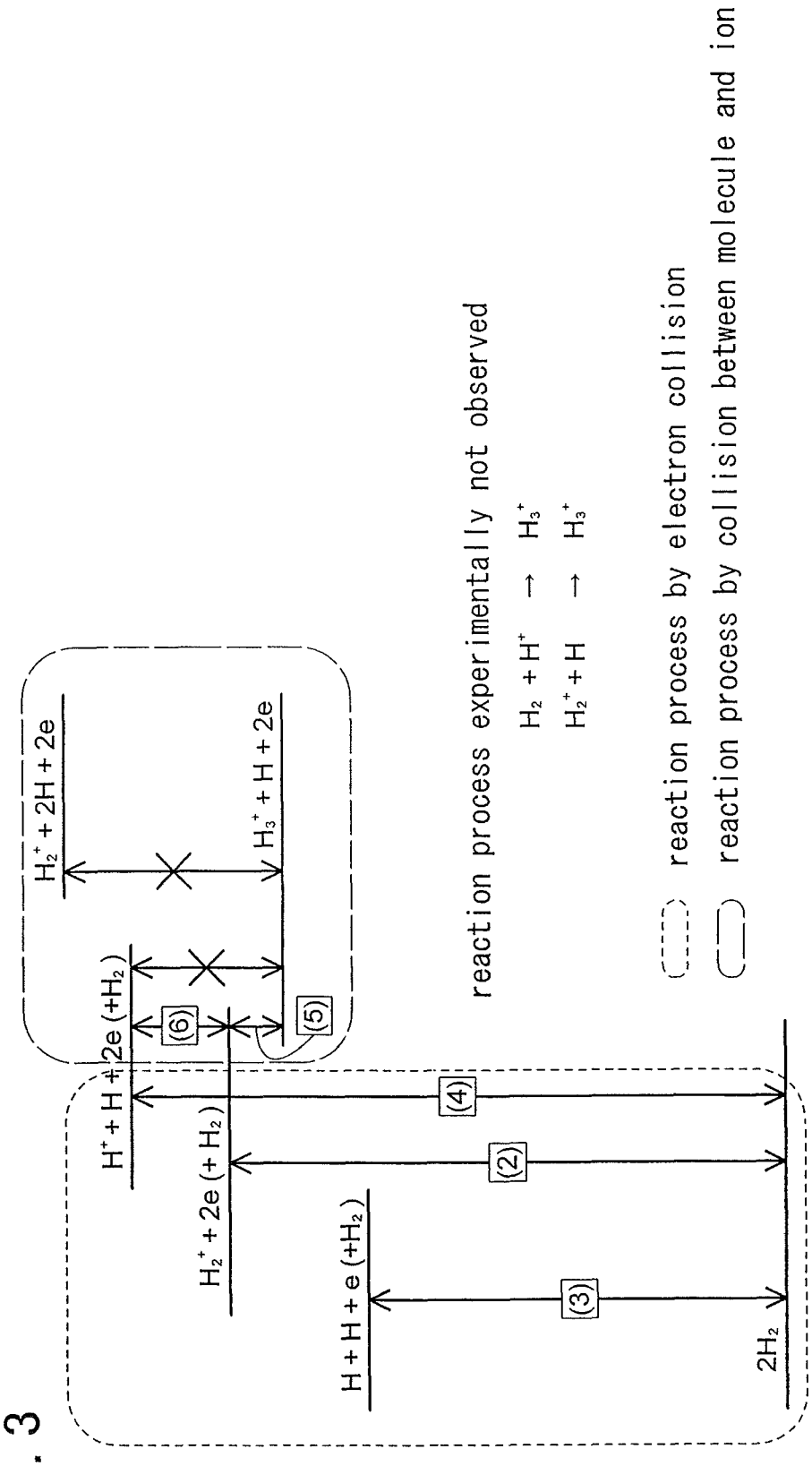

104 112 420 416 408 420   426 418 410 426 102

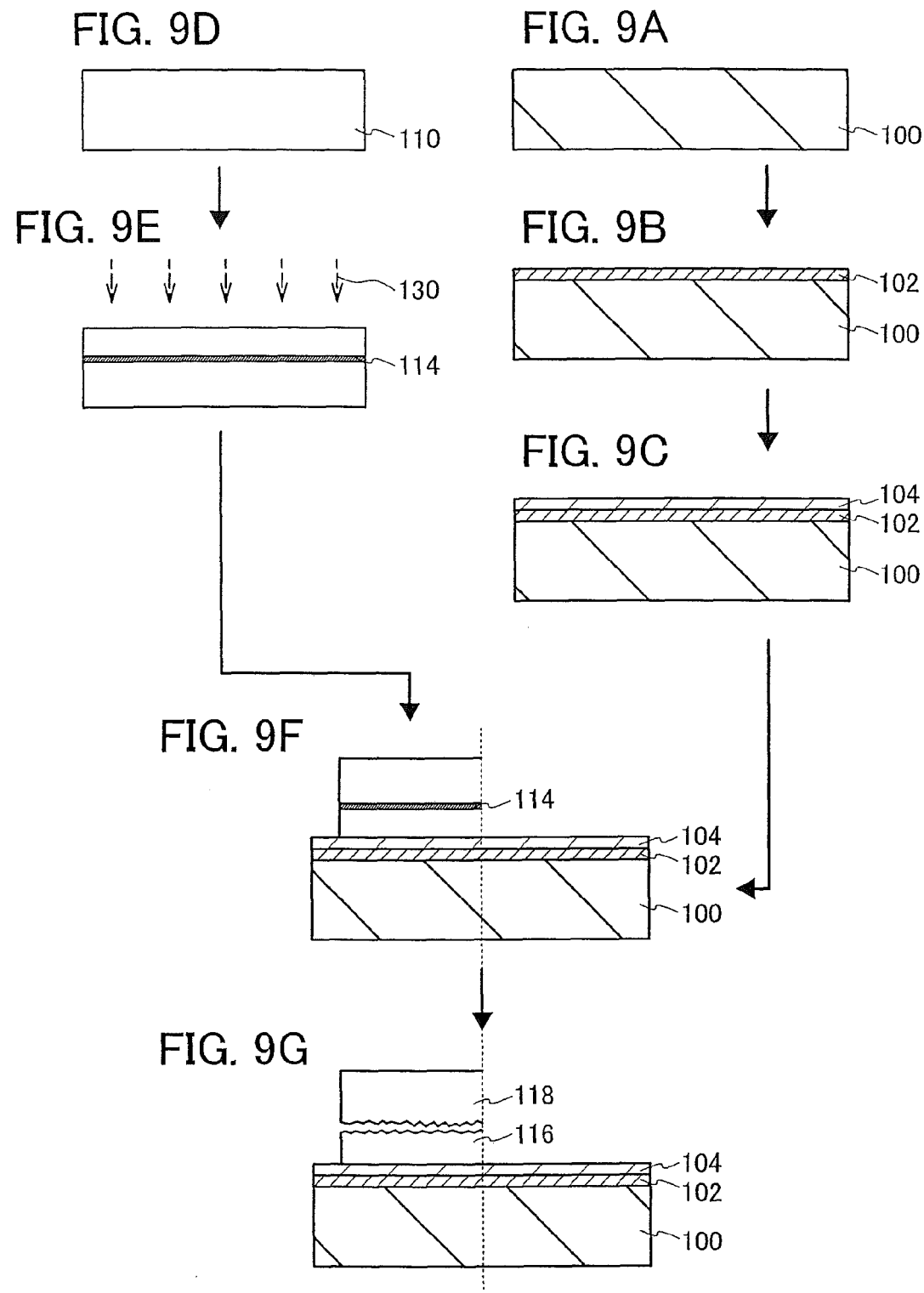

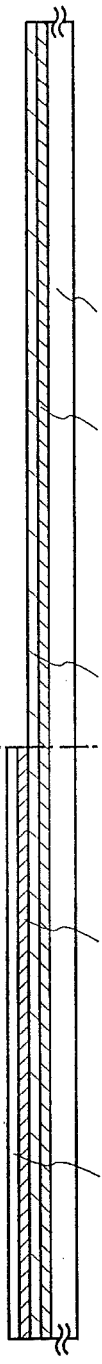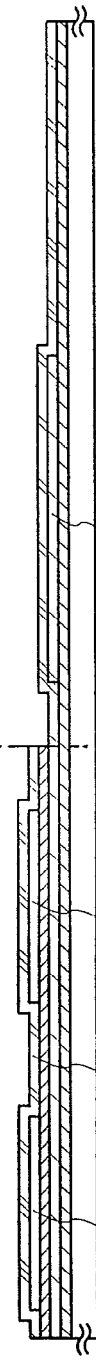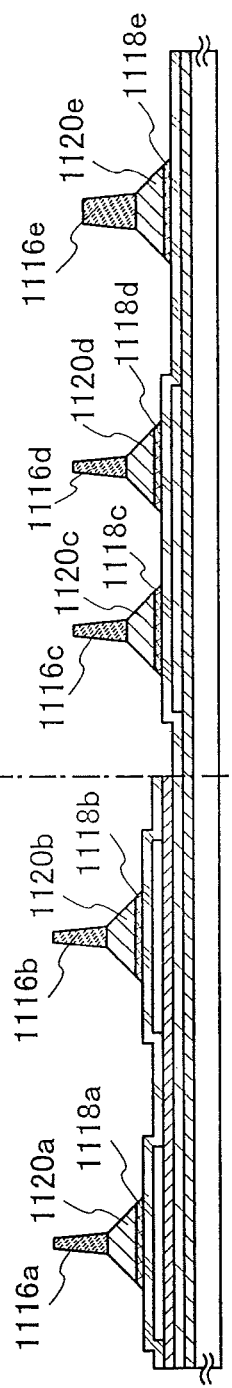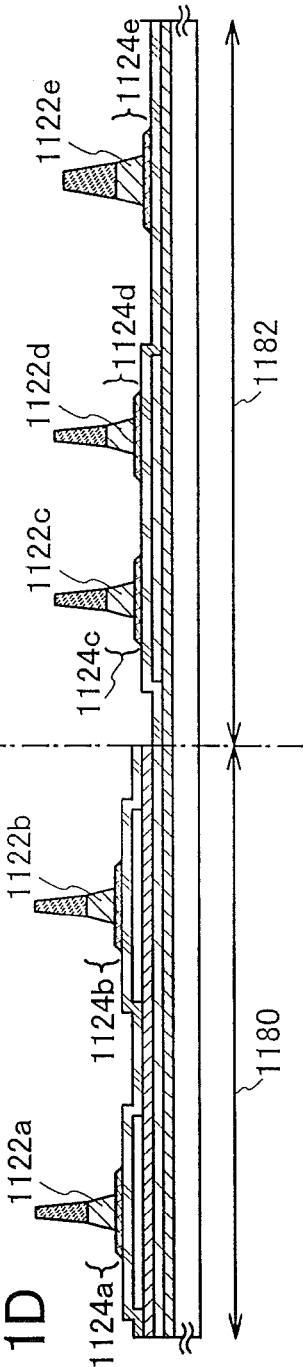

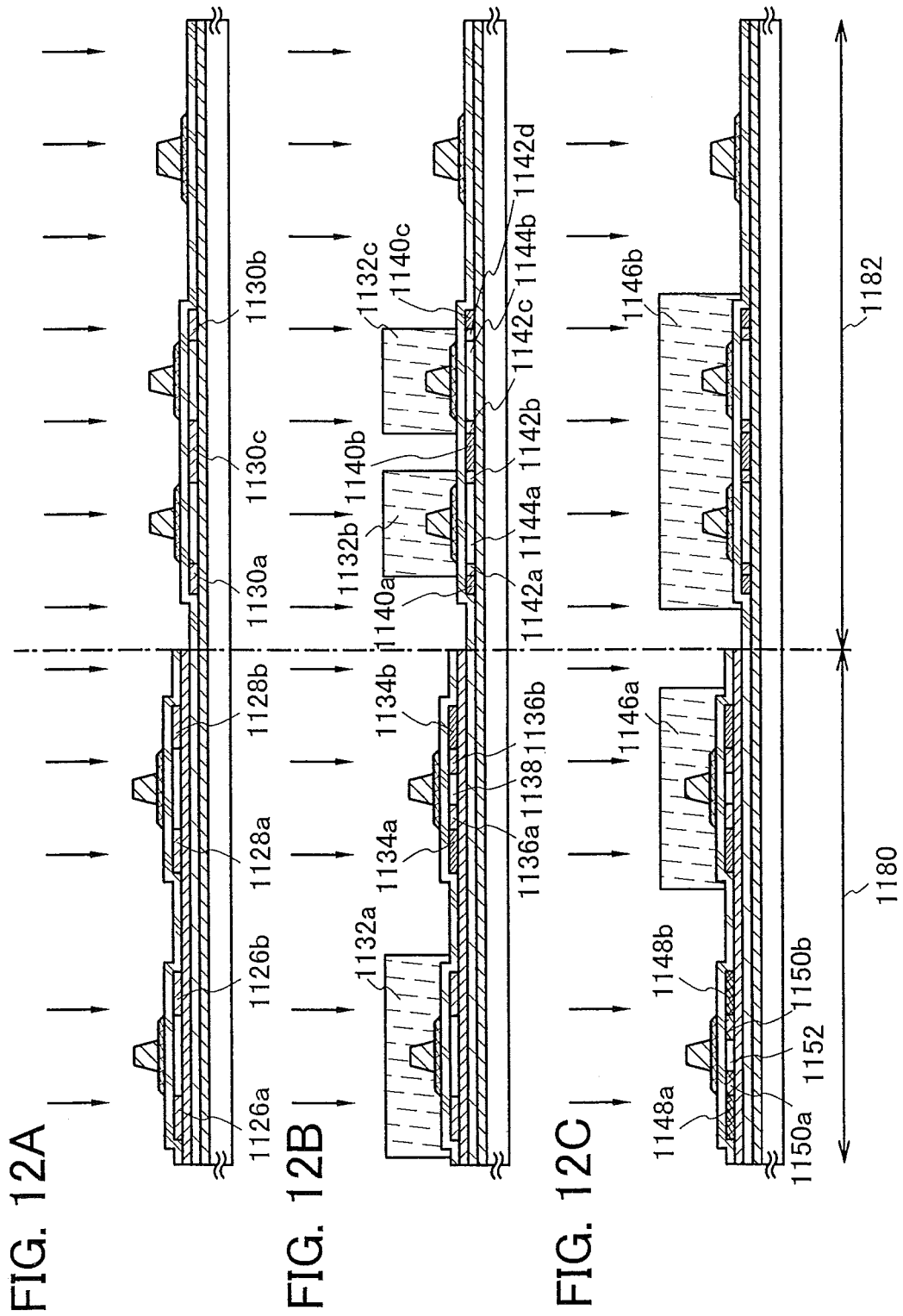

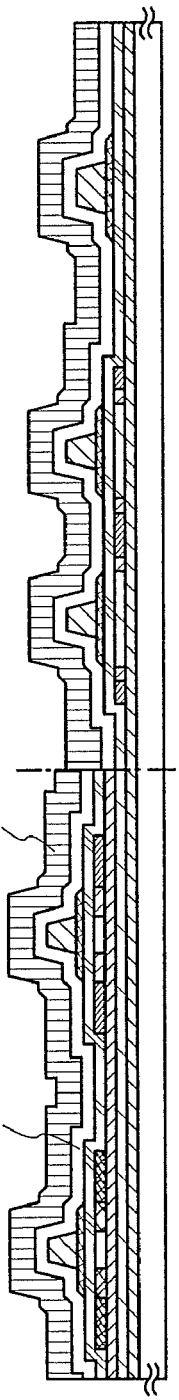
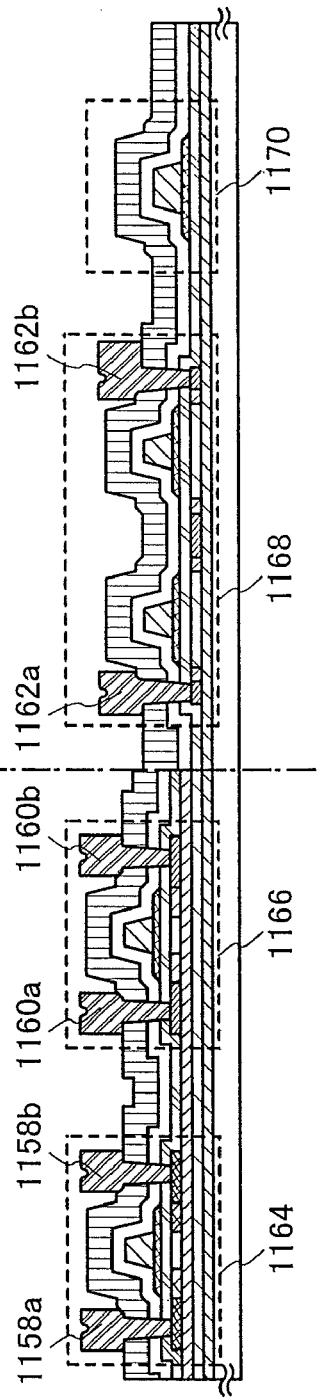
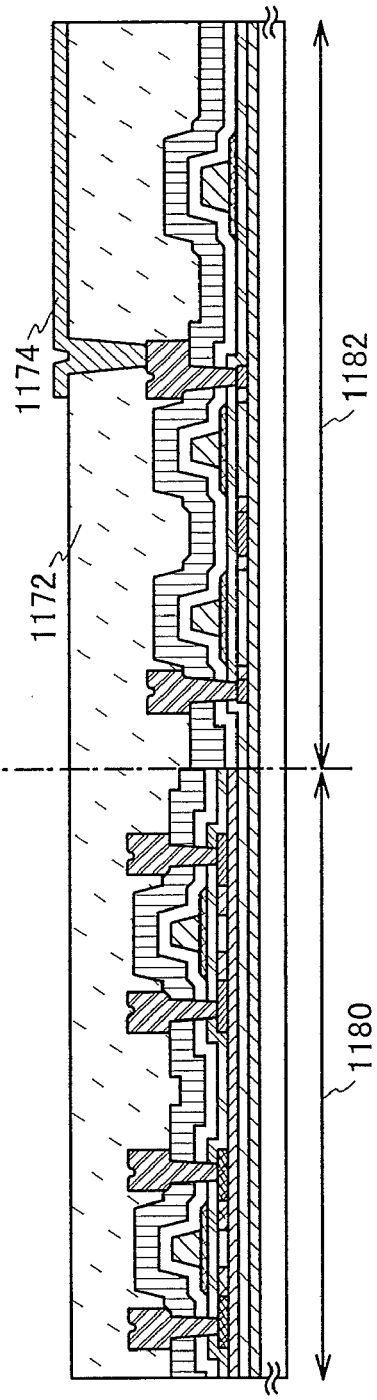
FIG. 13A
FIG. 13B
FIG. 13C

FIG. 28

| Accelerating voltage | Ratio of hydrogen atom (H) (X : Y) | Ratio of hydrogen ion species (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

US 8,368,082 B2

METHOD FOR MANUFACTURING SEMICONDUCTOR DEVICE, SEMICONDUCTOR DEVICE AND ELECTRONIC APPLIANCE

CROSS-REFERENCE TO RELATED APPLICATIONS

This application is a divisional of U.S. application Ser. No. 12/275,840, filed Nov. 21, 2008, now allowed, which claims the benefit of a foreign priority application filed in Japan as Serial No. 2007-305289 on Nov. 27, 2007, both of which are incorporated by reference.

BACKGROUND OF THE INVENTION

1. Field of the Invention

The present invention relates to a method for manufacturing a semiconductor device, a semiconductor device and an electronic appliance.

2. Description of the Related Art

In recent years, flat panel displays such as liquid crystal display devices and electroluminescence (EL) display devices have attracted attention.

Driving methods of the flat panel displays include a passive matrix method and an active matrix method. An active matrix method has advantages over a passive matrix method in low power consumption, high definition, a large-sized substrate, and the like.

Here, a structural example of an active matrix panel is briefly described with reference to FIGS. 21A and 21B. FIG. 21A illustrates an example of a structure in which a driver circuit is provided using a tape automated bonding (TAB) method.

In FIG. 21A, a pixel portion 2101 in which pixels 2102 are arranged in matrix is formed over a substrate 2100 having an insulating surface. The pixels 2102 are arranged in matrix at intersections of scan lines extending from a scan line side input terminal 2103 and signal lines extending from a signal line side input terminal 2104. Each of the pixels in the pixel portion 2101 is provided with a switching element and a pixel electrode layer connected to the switching element. A typical example of the switching element is a TFT. A gate electrode layer side of the TFT is connected to a scan line, and a source or drain side of the TFT is connected to a signal line. In addition, an IC 2151 included in a driver circuit is connected to a flexible printed circuit (FPC) 2150.

In a structure where a driver circuit is provided outside a panel as in FIG. 21A, it is possible to use a driver circuit formed using a single crystal silicon substrate. However, when a driver circuit is provided in this manner, a manufacturing cost cannot be reduced sufficiently because of necessity of preparing a panel and a driver circuit separately, necessity of a step of connecting the panel and the driver circuit, and the like.

In terms of reduction in cost or the like, a method in which a pixel region and a driver circuit region are formed over the same substrate has been employed (e.g., see Patent Document 1: Japanese Published Patent Application No. H8-6053). FIG. 21B illustrates an example of a structure in which a pixel region and a driver circuit region are formed over the same substrate.

SUMMARY OF THE INVENTION

In FIG. 21B, non-single-crystal silicon such as amorphous silicon, microcrystalline silicon, or polycrystalline silicon is used as a semiconductor layer of a driver circuit 2160, similar to the pixel region. However, even in a case where microcrystalline silicon or polycrystalline silicon as well as amorphous silicon is used, there is a problem in that characteristics thereof are incomparable to characteristics of single crystal silicon. In particular, in a semiconductor element which is used for a panel where a driver circuit is integrated, characteristics which are necessary and sufficient (for example, mobility or a subthreshold swing (S value) of a transistor) cannot be obtained. This has caused a big problem in manufacturing a driver circuit, that is, a semiconductor device which requires high speed operation.

In view of the above-described problem, it is an object of the present invention to provide a method for manufacturing a semiconductor device having a circuit capable of high speed operation at reduced manufacturing cost. It is another object of the present invention to provide a method for manufacturing a semiconductor substrate for providing the semiconductor device and to provide an electronic appliance using the semiconductor device.

In the present invention, after formation of a non-single-crystal semiconductor layer over a substrate (e.g. a substrate made of an insulator), a single crystal semiconductor layer is formed over part of the non-single-crystal semiconductor layer. Thus, a semiconductor element of a region which requires a large area (e.g. a pixel region in a display device) can be formed using the non-single-crystal semiconductor layer, and a semiconductor element of a region which requires high speed operation (e.g. a driver circuit region in a display device) can be formed using the single crystal semiconductor layer. That is, a panel where a driver circuit formed using the single crystal semiconductor layer is integrated can be provided. Note that the single crystal semiconductor layer can be formed, for example, by the steps of irradiating a single crystal semiconductor substrate with ions; bonding the single crystal semiconductor substrate to a surface over which the single crystal semiconductor layer is formed; separating the single crystal semiconductor substrate at a region which is irradiated with the ions by subsequent heat treatment; and leaving the single crystal semiconductor layer over the surface over which the single crystal semiconductor layer is formed.

Accordingly, one aspect of the present invention is a method for manufacturing a semiconductor device, which includes the steps of forming an insulating layer over a substrate; forming a non-single-crystal semiconductor layer over the insulating layer; forming a damaged region in a single crystal semiconductor substrate by irradiating the single crystal semiconductor substrate with ions; bonding (attaching) the non-single-crystal semiconductor layer and a surface of the single crystal semiconductor substrate to each other; separating the single crystal semiconductor substrate at the damaged region to form a single crystal semiconductor layer over part of the non-single-crystal semiconductor layer (a first portion of the non-single-crystal semiconductor layer); forming a semiconductor element of a pixel region using part of the non-single-crystal semiconductor layer except the part of the non-single-crystal semiconductor layer (a second portion of the non-single-crystal semiconductor layer); and forming a semiconductor element of a driver circuit region using the single crystal semiconductor layer.

Another aspect of the present invention is a method for manufacturing a semiconductor device, which includes the steps of forming a first insulating layer over a substrate; forming a non-single-crystal semiconductor layer over the first insulating layer; forming a second insulating layer over a surface of a single crystal semiconductor substrate; irradiating the single crystal semiconductor substrate with ions to form a damaged region in the single crystal semiconductor substrate; bonding the non-single-crystal semiconductor layer and the second insulating layer to each other; separating the single crystal semiconductor substrate at the damaged region to form a single crystal semiconductor layer over part of the non-single-crystal semiconductor layer; forming a semiconductor element of a pixel region using the non-single-crystal semiconductor layer except the part of the non-single-crystal semiconductor layer; and forming a semiconductor element of a driver circuit region using the single crystal semiconductor layer.

Another aspect of the present invention is a method for manufacturing a semiconductor device, which includes the steps of forming a first insulating layer over a substrate; forming a non-single-crystal semiconductor layer over the first insulating layer; irradiating a single crystal semiconductor substrate with ions to form a damaged region in the single crystal semiconductor substrate; forming a second insulating layer over a surface of the single crystal semiconductor substrate; bonding (attaching) the non-single-crystal semiconductor layer and the second insulating layer to each other; separating the single crystal semiconductor substrate at the damaged region to form a single crystal semiconductor layer over part of the non-single-crystal semiconductor layer (a first portion of the non-single-crystal semiconductor layer); forming a semiconductor element of a pixel region using part of the non-single-crystal semiconductor layer except the part of the non-single-crystal semiconductor layer (a second portion of the non-single-crystal semiconductor layer); and forming a semiconductor element of a driver circuit region using the single crystal semiconductor layer.

In the above, before formation of the semiconductor element of the pixel region and the semiconductor element of the driver circuit region, by irradiation of the non-single-crystal semiconductor layer and the single crystal semiconductor layer with laser light, the non-single-crystal semiconductor layer may be changed into a microcrystalline semiconductor or a polycrystalline semiconductor and the surface planarity of the single crystal semiconductor layer may be improved.

An aspect of the present invention is a method for manufacturing a semiconductor substrate included in the semiconductor device, which includes the steps of forming an insulating layer over a substrate; forming a non-single-crystal semiconductor layer over the insulating layer; irradiating a single crystal semiconductor substrate with ions to form a damaged region in the single crystal semiconductor substrate; bonding the non-single-crystal semiconductor layer and the single crystal semiconductor substrate to each other; and separating the single crystal semiconductor substrate at the damaged region to form a single crystal semiconductor layer over part of the non-single-crystal semiconductor layer. Another aspect of the present invention is a method for manufacturing a semiconductor substrate included in the semiconductor device, which includes the steps of forming a first insulating layer over a substrate; forming a non-single-crystal semiconductor layer over the first insulating layer; forming a second insulating layer over a single crystal semiconductor substrate; irradiating the single crystal semiconductor substrate with ions to form a damaged region in the single crystal semiconductor substrate; bonding the non-single-crystal semiconductor substrate and the second insulating layer to each other; and separating the single crystal semiconductor substrate at the damaged region to form a single crystal semiconductor layer over part of the non-single-crystal semiconductor layer. Another aspect of the present invention is a method for manufacturing a semiconductor substrate included in the semiconductor device, which includes the steps of forming a first insulating layer over a substrate; forming a non-single-crystal semiconductor layer over the first insulating layer; irradiating a single crystal semiconductor substrate with ions to form a damaged region in the single crystal semiconductor substrate; forming a second insulating layer over the single crystal semiconductor substrate; bonding the non-single-crystal semiconductor layer and the second insulating layer to each other; and separating the single crystal semiconductor substrate at the damaged region to form a single crystal semiconductor layer over part of the non-single-crystal semiconductor layer.

One aspect of the present invention is a semiconductor device including an insulating layer over a substrate; a first non-single-crystal semiconductor layer over the insulating layer; a second non-single-crystal semiconductor layer over the insulating layer; and a single crystal semiconductor layer over the second non-single-crystal semiconductor layer. In the semiconductor device, a semiconductor element of a pixel region is formed using the first non-single-crystal semiconductor layer and a semiconductor element of a driver circuit region is formed using the single crystal semiconductor layer.

Another aspect of the present invention is a semiconductor device including a first insulating layer over a substrate; a first non-single-crystal semiconductor layer over the first insulating layer; a second non-single-crystal semiconductor layer over the first insulating layer; a second insulating layer over the second non-single-crystal semiconductor layer; and a single crystal semiconductor layer over the second insulating layer. In the semiconductor device, a semiconductor element of a pixel region is formed using the first non-single-crystal semiconductor layer and a semiconductor element of a driver circuit region is formed using the single crystal semiconductor layer.

Another aspect of the present invention is a semiconductor substrate of the above-described semiconductor device, including a first insulating layer over a substrate; a first non-single-crystal semiconductor layer over the first insulating layer; a second non-single-crystal semiconductor layer over the first insulating layer; and a single crystal semiconductor layer over the second non-single-crystal semiconductor layer. Another aspect of the present invention is a semiconductor substrate of the above-described semiconductor device, including a first insulating layer over a substrate; a first non-single-crystal semiconductor layer over the first insulating layer; a second non-single-crystal semiconductor layer over the first insulating layer; a second insulating layer over the second non-single-crystal semiconductor layer; and a single crystal semiconductor layer over the second insulating layer.

Note that a wide variety of electronic appliances can be provided using the above-described semiconductor device.

Note that in the above description, there is no particular limitation on the crystallinity of the non-single-crystal semiconductor layer as long as the crystallinity is not single crystal. For example, the crystallinity of the non-single-crystal semiconductor layer can be amorphous, microcrystalline or polycrystalline. Here, the term "single crystal" has a regular crystal structure and crystal axes which are oriented in the same direction in all portions of the crystal. Note that it is not a matter of how many defects there are.

By the present invention, a semiconductor element of a circuit region (e.g. a pixel region) which requires a large area can be formed using the non-single-crystal semiconductor layer, and a semiconductor element of a circuit region (e.g. a driver circuit region) which requires high speed operation can be formed using the singe crystal semiconductor layer. Thus, a semiconductor device having an excellent driver circuit can be provided. Further, since the semiconductor device is a device where a driver circuit is integrated, reduction in thickness of the semiconductor device, a reduction in area of a frame region thereof or the like can be realized. Furthermore, since a pixel region can be formed using the non-single-crystal semiconductor layer, the semiconductor device can be made larger very easily.

Note that in the present invention, by using extremely high planarity of the surface of the non-single-crystal semiconductor layer, a single crystal semiconductor layer is formed over the non-single-crystal semiconductor layer. Therefore, it is not necessary to provide a layer for bonding (attaching) separately, so that manufacturing cost of a semiconductor substrate can be reduced. Here, the single crystal semiconductor layer may be formed so as to be in contact with the non-single-crystal semiconductor layer or may be formed after an insulating layer or the like is formed over the non-single-crystal semiconductor layer.

Note that when laser irradiation is performed, characteristics of the non-single-crystal semiconductor layer and the single crystal semiconductor layer can be improved at one time. That is, a step of microcrystallizing or polycrystallizing the non-single-crystal semiconductor layer and a step of reducing defects of the single crystal semiconductor layer and improving planarity thereof can be performed at one time. Needless to say, laser irradiation may be performed on either the non-single-crystal semiconductor layer or the single crystal semiconductor layer.

BRIEF DESCRIPTION OF THE DRAWINGS

In the accompanying drawings:

FIG. 3 is an energy diagram of hydrogen ion species;

FIGS. 9A to 9G are views illustrating a method for manufacturing a semiconductor substrate;

FIGS. 11A to 11D are cross-sectional views illustrating a manufacturing process of a semiconductor device;

FIGS. 12A to 12C are cross-sectional views illustrating a manufacturing process of a semiconductor device;

FIGS. 13A to 13C are cross-sectional views illustrating a manufacturing process of a semiconductor device;

FIG. 28 is a list of ratios of fitting parameters (hydrogen atom ratios and hydrogen ion species ratios).

DETAILED DESCRIPTION OF THE INVENTION

Figure 1D:
FIGS. 1A to 1H are views illustrating a method for manufacturing a semiconductor substrate.

Embodiment modes of the present invention will be explained with reference to the drawings. However, the present invention is not limited to the following description, and it is to be easily understood by those skilled in the art that the modes and details can be changed in various ways without departing from the spirit and scope of the present invention. Thus, the present invention is not interpreted while limiting to the following description of the embodiment modes. Note that in the structure of the present invention which is hereinafter described, the reference numerals denoting the same portions are used in common in different drawings.

Embodiment Mode 1

In this embodiment mode, a method for manufacturing a semiconductor substrate which is used for manufacture of a semiconductor device will be described with reference to FIGS. 1A to 1H, FIGS. 2A to 2C, and FIG. 3.

Figure 1A:
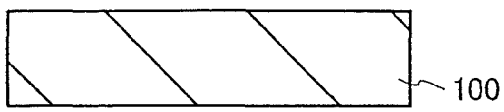

First, a base substrate 100 is prepared (see FIG. 1A). As the base substrate 100, a light-transmitting glass substrate used for a liquid crystal display device or the like can be used. As a glass substrate, a substrate having a strain point of greater than or equal to 580° C. and less than or equal to 680° C. (preferably, greater than or equal to 600° C. and less than or equal to 680° C.) may be used. Further, a non-alkali glass substrate is preferable as the glass substrate. As a material of the non-alkali glass substrate, a glass material such as aluminosilicate glass, aluminoborosilicate glass, or barium borosilicate glass is used, for example.

As the base substrate 100, as well as the glass substrate, a substrate which is formed of an insulator, such as a ceramic substrate, a quartz substrate, or a sapphire substrate (including a glass substrate); a substrate which is formed of a conductor such as metal or stainless steel or the like can be used.

Figure 1E:
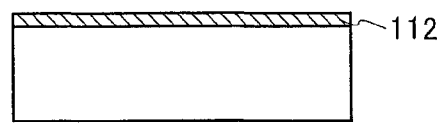
Figure 1B:
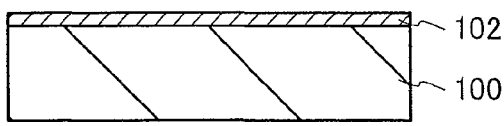

Next, an insulating layer 102 is formed over a surface of the base substrate 100 (see FIG. 1B). The insulating layer 102 may have a single layer structure or a stacked layer structure. As a material of the insulating layer 102, an insulating material containing silicon or germanium as its composition, such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as an aluminum oxynitride; or a metal nitride oxide such as an aluminum nitride oxide may also be used.

Note that in this specification, the term "oxynitride" means a substance which has a larger number of oxygen atoms than that of nitrogen atoms. For example, the term "silicon oxynitride" means a substance which contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the term "nitride oxide" means a substance which has a larger number of nitrogen atoms than that of oxygen atoms. For example, the term "silicon nitride oxide" means a substance which contains oxygen, nitrogen, silicon, and hydrogen at concentrations ranging from 5 k at. % to 30 at. %, 20 at. % to 55 at. %, 25 at. % to 35 at. %, and 10 at. % to 25 at. %, respectively. Note that percentages of oxygen, nitrogen, silicon, and hydrogen fall within the above-described ranges in the case where measurements are performed by rutherford backscattering spectrometry (RBS) and hydrogen forward scattering (HFS). Furthermore, the total of the percentages of the constituent elements does not exceed 100 at. %.

Note that it is possible to employ a structure in which the insulating layer 102 is not formed; however, when a substrate including an impurity which may decrease the reliability of a semiconductor device, such as alkali metal or alkaline-earth metal, is used as the base substrate 100, the insulating layer 102 is preferably provided in order to prevent diffusion of the impurity from the base substrate 100 into the semiconductor layer. In particular, silicon nitride, silicon nitride oxide, aluminum nitride, aluminum nitride oxide or the like is suitable for such an application as preventing the impurity diffusion.

Figure 1F:
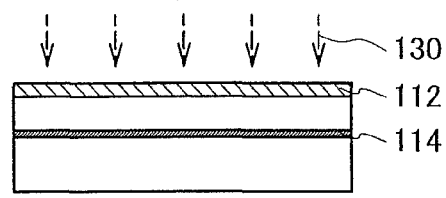
Figure 1C:
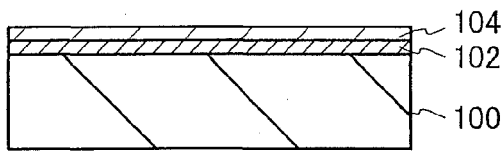

After that, a non-single-crystal semiconductor layer 104 is formed over the surface of the insulating layer 102 (see FIG. 1C). As a material of the non-single-crystal semiconductor layer 104, a semiconductor material including a Group 4 element such as silicon, germanium or silicon germanium or a material of a compound semiconductor such as gallium arsenide, indium phosphide or the like can be used. There is no particular limitation on the crystallinity of the non-single-crystal semiconductor layer 104 as long as the non-single-crystal semiconductor layer 104 has crystallinity other than that of a single crystal semiconductor. For example, a semiconductor layer with various crystallinity, such as an amorphous semiconductor layer, a microcrystalline semiconductor layer having a crystal grain of approximately 1 nm to 100 nm, or a polycrystalline semiconductor layer having a crystal grain of greater than or equal to 100 nm can be used as the non-single-crystal semiconductor layer 104. For example, when an amorphous semiconductor is used for the non-single-crystal semiconductor layer 104, the non-single-crystal semiconductor layer 104 may be formed by a sputtering method, a CVD method or the like. When a microcrystalline semiconductor is used for the non-single-crystal semiconductor layer 104, the non-single-crystal semiconductor layer 104 can be formed by a CVD method using a source gas in which the content of hydrogen is increased. When a polycrystalline semiconductor is used for the non-single-crystal semiconductor layer 104, for example, an amorphous semiconductor may be formed and then crystallized.

Note that in the present invention, it is possible to perform laser irradiation on a single crystal semiconductor layer to be formed later and the non-single-crystal semiconductor layer 104 at the same time; therefore, in performing laser irradiation on the single crystal semiconductor layer, the non-single-crystal semiconductor layer 104 may be microcrystallized or polycrystallized. Further, if necessary, a slight amount of an impurity element (phosphorus, arsenic, boron, or the like) may be contained in the non-single-crystal semiconductor layer 104 in addition to the above main component.

The non-single-crystal semiconductor layer 104 serves as an active layer of a semiconductor element and as a layer for bonding (a layer which is to form a bond or a layer for attaching) as well. In order to make the non-single-crystal semiconductor layer 104 serve as a layer for bonding, it is necessary to form the non-single-crystal semiconductor layer 104 of which surface planarity is sufficiently high. Amorphous silicon formed by a CVD method is suitable for a layer for bonding due to its high surface planarity.

Note that when amorphous silicon is formed as the non-single-crystal semiconductor layer 104 by a plasma CVD method, heat treatment may be performed in order to purge hydrogen from the amorphous silicon. This is because a large amount of hydrogen may be contained in the amorphous silicon formed by a plasma CVD method. When laser irradiation or the like is performed without removing the hydrogen, the surface roughness of a semiconductor layer obtained becomes large, and further, a pin hole is formed in some cases. Therefore, when amorphous silicon with high hydrogen content is used, heat treatment may be preferably performed in order to purge hydrogen.

As the conditions of the heat treatment, for example, the temperature can be set at 500° C. and period of time for the heat treatment can be one hour; however, the conditions are not limited thereto. Heat treatment may be performed at a higher temperature for a shorter time as long as a substrate can withstand the temperature.

Next, a single crystal semiconductor substrate 110 is prepared (see FIG. 1D). A single crystal semiconductor layer formed by thinning the single crystal semiconductor substrate 110 is bonded to the base substrate 100, whereby a semiconductor substrate is manufactured. As the single crystal semiconductor substrate 110, for example, a semiconductor substrate made of an element belonging to Group 4 of the periodic table, such as silicon, germanium, silicon-germanium, or silicon carbide can be used. Needless to say, a substrate made of a compound semiconductor such as gallium arsenide or indium phosphide may be used. In this embodiment mode, as the single crystal semiconductor substrate 110, a single crystal silicon substrate is used. Although there is no limitation on the size of the single crystal semiconductor substrate 110, for example, it is preferable to process a circular semiconductor substrate of 8 inches (200 mm) in diameter, 12 inches (300 mm) in diameter, 18 inches (450 mm) in diameter or the like, into a rectangular shape and to use the processed substrate.

Note that in this embodiment mode, a structure is employed in which the base substrate 100 is processed, and then the single crystal semiconductor substrate 110 is processed for convenience of the description; however, the present invention is not interpreted as being limited to this order for processing the substrates. In other words, a structure may be employed in which the single crystal semiconductor substrate 110 is processed, and then the base substrate 100 is processed, or a structure may also be employed in which the base substrate 100 and the single crystal semiconductor substrate 110 are processed in parallel.

After the single crystal semiconductor substrate 110 is cleaned, an insulating layer 112 is formed over a surface of the single crystal semiconductor substrate 110 (see FIG. 1E). The insulating layer 112 can have a single layer structure or a multilayer structure including two or more layers. The thickness of the insulating layer 112 is preferably greater than or equal to 10 nm and less than or equal to 400 nm.

As a material of the insulating layer 112, an insulating material containing silicon or germanium as its composition, such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as an aluminum oxynitride film; or a metal nitride oxide such as an aluminum nitride oxide film may also be used.

The insulating layer 112 can be formed by a CVD method, a sputtering method, a method using oxidation (or nitridation) of the single crystal semiconductor substrate 110, or the like. Since the insulating layer 112 serves as a layer for bonding, the insulating layer 112 is preferably an insulating layer of which surface has high planarity. Note that although the insulating layer 112 is not necessarily formed, the insulating layer 112 is preferably formed in order to secure insulation between the non-single-crystal semiconductor layer 104 and the single crystal semiconductor layer to be formed later.

Next, the single crystal semiconductor substrate 110 is irradiated with an ion beam 130 including ions accelerated by an electric field through the insulating layer 112, so that a damaged region 114 is formed in a region at a predetermined depth from a surface of the single crystal semiconductor substrate 110 (see FIG. 1F). By forming the insulating layer 112 before irradiation with the ion beam 130, the single crystal semiconductor substrate 110 can be prevented from being contaminated in the ion irradiation and from being damaged by impact of ions in the irradiation. The depth of the damaged region 114 can be controlled by acceleration energy and incident angle of the ion beam 130. The damaged region 114 is formed in a region at a depth the same or substantially the same as the average depth at which the ions have entered.

The thickness of the single crystal semiconductor layer which is separated from the single crystal semiconductor substrate 110 is determined depending on the depth at which the damaged region 114 is formed. The depth at which the damaged region 114 is formed is greater than or equal to 50 nm and less than or equal to 500 nm, preferably greater than or equal to 50 nm and less than or equal to 200 nm, from the surface of the single crystal semiconductor substrate 110.

When the single crystal semiconductor substrate 110 is irradiated with ions, an ion implantation apparatus or an ion doping apparatus can be used. In an ion implantation apparatus, a source gas is excited to produce ion species, the produced ion species are mass-separated, and the ion species having a predetermined mass are implanted into an object to be processed. In an ion doping apparatus, a process gas is excited to produce ion species and the object is irradiated with the produced ion species which are not mass-separated. In an ion doping apparatus provided with a mass separator, ion implantation with mass separation can be performed similarly to the ion implantation apparatus. In this specification, the use of one of an ion implantation apparatus and an ion doping apparatus is specified only in the case where one of them needs to be used, whereas in the case where there is not specific description, either of them may be used to perform ion irradiation.

In the case of using an ion doping apparatus, an ion irradiation step can be performed, for example, under the following conditions:

Accelerating Voltage: greater than or equal to 10 kV and less than or equal to 100 kV (preferably, greater than or equal to 30 kV and less than or equal to 80 kV);

Dose: greater than or equal to $1\times10^{16}$ ions/cm$^2$ and less than or equal to $4\times10^{16}$ ions/cm$^2$; and Beam Current Density: greater than or equal to 2 μA/cm$^2$ (preferably, greater than or equal to 5 μA/cm$^2$, and more preferably, greater than or equal to 10 μA/cm$^2$).

In the case of using an ion doping apparatus, a gas containing hydrogen can be used as a source gas for an ion irradiation step. With the gas containing hydrogen, $H^+$, $H_2^+$, and $H_3^+$ can be produced as ion species. In the case where the gas containing hydrogen is used as a source gas, it is preferable that irradiation with a large amount of $H_3^+$ be performed. Specifically, the proportion of $H_3^+$ ions which are included in the ion beam 130 is preferably greater than or equal to 70% with respect to the total amount of $H^+$, $H_2^+$, and $H_3^+$; more preferably, the proportion of $H_3^+$ ions is greater than or equal to 80%. By increasing the proportion of $H_3^+$ included in the ion beam 130, the damaged region 114 can contain hydrogen at a concentration of greater than or equal to $1\times10^{20}$ atoms/cm$^3$. Thus, separation at the damaged region 114 can be performed easily. By irradiation with a large amount of $H_3^+$ ions, efficiency of the ion irradiation can be improved compared to the irradiation with $H^+$ and $H_2^+$. That is, the time needed for the ion irradiation can be reduced. In addition, by using $H_3^+$, the average depth at which the ions have entered can be shallower. Thus, the damaged region 114 can be formed in a shallower region.

In the case of using an ion implantation apparatus, it is preferable to perform mass separation to implant $H_3^+$ ions. Of course, $H_2^+$ ions may be implanted. Note that, in the case of using an ion implantation apparatus, efficiency of the ion irradiation may be reduced compared to the case of using an ion doping apparatus. This is because ion species are selectively implanted.

As a source gas for the ion irradiation step, as well as a gas containing hydrogen, one or more kinds of gases selected from a rare gas such as helium or argon; a halogen gas typified by a fluorine gas or a chlorine gas; and a halogen compound gas such as a fluorine compound gas (e.g., $BF_3$) can be used. In the case where helium is used as a source gas, the ion beam 130 with a high proportion of He ions can be formed without mass separation. By using the ion beam 130, the damaged region 114 can be efficiently formed.

Further, the damaged region 114 may be formed by performing ion irradiation steps plural times. In this case, different source gases may be used in each of the steps, or the same source gas may be used in all of the steps. For example, ion irradiation can be performed using a gas containing hydrogen as a source gas after ion irradiation is performed using a rare gas as a source gas. Alternatively, first, ion irradiation can be performed using a halogen gas or a halogen compound gas, and then, ion irradiation can be performed using a gas containing hydrogen.

An ion irradiation method, which is one aspect of the present invention, is considered below.

In the present invention, a single crystal semiconductor substrate is irradiated with ions that are derived from hydrogen (H) (hereinafter referred to as "hydrogen ion species"). More specifically, a hydrogen gas or a gas which contains hydrogen in its composition is used as a source material; a hydrogen plasma is generated; and a single crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 = e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ e \rightarrow + H^+ + H + H \quad (7)$$

$$e + H_3^+ \rightarrow + H \quad (8)$$

$$e + H_3^+ \rightarrow H + H + H \quad (9)$$

FIG. 3 is an energy diagram which schematically shows some of the above reactions. Note that the energy diagram shown in FIG. 3 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between potential energies at both each ends of the period during which the charged particle moves. That is, in a situation in which a charged particle can move a long distance in an electric field without colliding with another particle, the kinetic energy (or the average thereof) of the charged particle tends to be higher than that in a situation in which the charged particle cannot. Such a tendency toward an increase in kinetic energy of a charged particle can be shown in a situation in which the mean free path of a particle is long, that is, in a situation in which pressure is low.

Even in a situation in which the mean free path is short, the kinetic energy of a charged particle is high if the charged particle can gain a high amount of kinetic energy while traveling through the path. That is, it can be said that, even in the situation in which the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation in which the pressure inside the chamber is low and the kinetic energy of $H_2^+$ is low in a situation in which the pressure inside the chamber is high. That is, because the reaction of the reaction equation (6) is the main reaction in the situation in which the pressure inside the chamber is low, the amount of $H_3^+$ tends to be decreased, and because the reaction of the reaction equation (5) is the main reaction in the situation in which the pressure inside the chamber is high, the amount of $H_3^+$ tends to be increased. In addition, in a situation in which an electric field in a plasma generation region is high, that is, in a situation in which the potential difference between given two points is large, the kinetic energy of $H_2^+$ is high, and in the opposite situation, the kinetic energy of $H_2^+$ is low. That is, because the reaction of the reaction equation (6) is the main reaction in the situation in which the electric field is high, the amount of $H_3^+$ tends to be decreased, and because the reaction of the reaction equation (5) is the main reaction in a situation in which the electric field is low, the amount of $H_3^+$ tends to be increased.

(Differences Depending on Ion Source)

Figure 22:
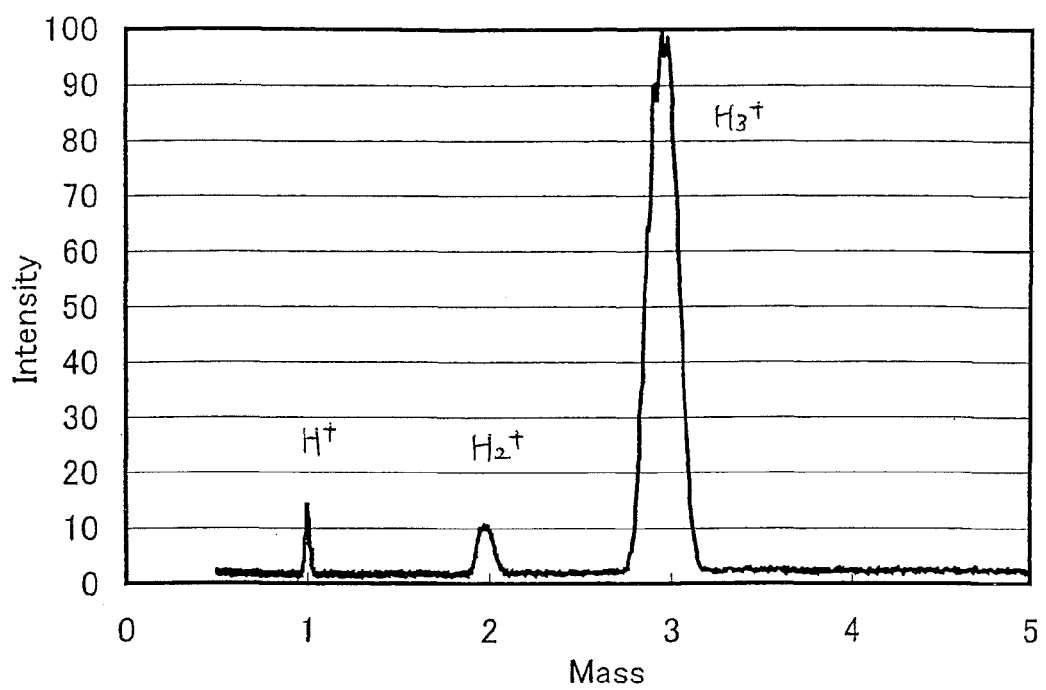
FIG. 22 is a diagram illustrating the results of ion mass spectrometry.

Here, an example, in which the proportions of ion species (particularly, the proportion of $H_3^+$) are different, is described. FIG. 22 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 22, the number of ions with different masses is expressed as a relative proportion where the number of ions with a mass of 3 is defined as 100. It can be seen from FIG. 22 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 23:
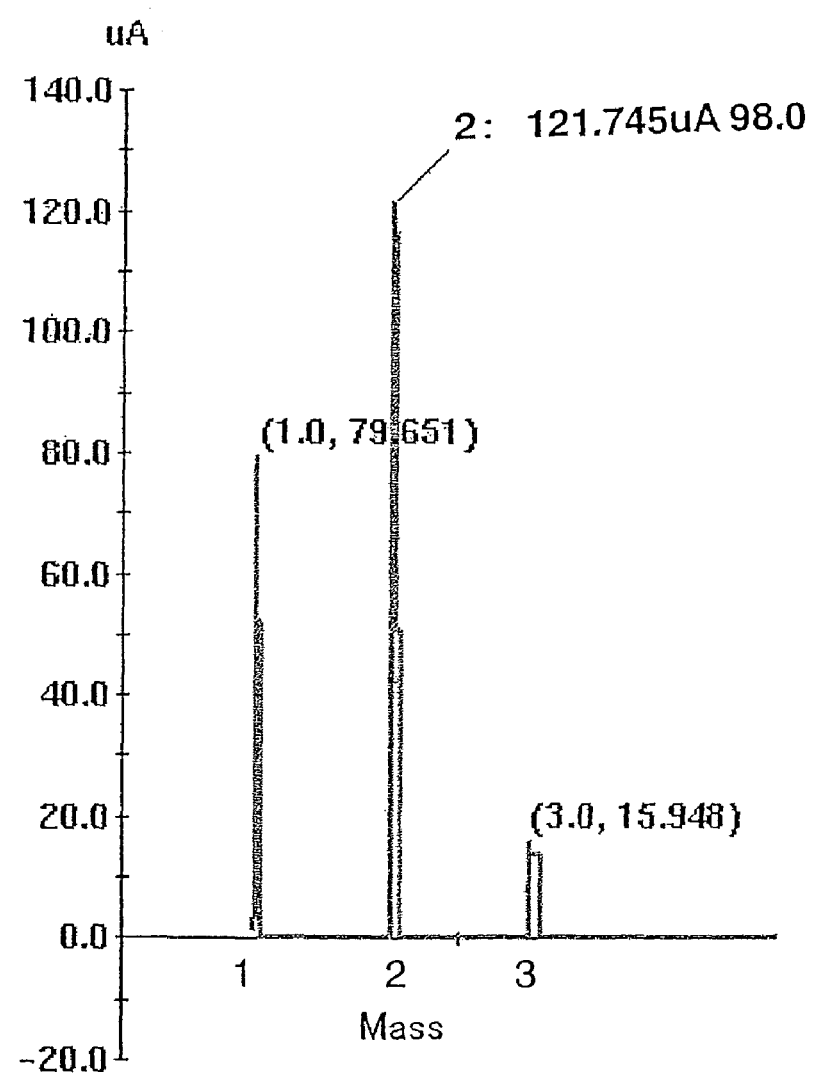
FIG. 23 is a diagram illustrating the results of ion mass spectrometry.

FIG. 23 is a graph showing the results of mass spectrometry of ions that are generated from $PH_3$ when an ion source different from that for the case of FIG. 22 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 22, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 23 that the ratio between ion species in a plasma, i.e., the ratio between $H^+$, $H_2^+$, and $H_3^+$, is about 37:56:7. Note that, although FIG. 23 shows the data obtained when the source gas is $PH_3$, the ratio between the hydrogen ion species is about the same when a 100% hydrogen gas is used as a source gas, as well.

In the case of the ion source from which the data shown in FIG. 23 is obtained, $H_3^+$, of $H^+$, $H_2^+$, and $H_3^+$, is generated at a proportion of only about 7%. On the other hand, in the case of the ion source from which the data shown in FIG. 22 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 22 is generated and a single crystal semiconductor substrate is irradiated with the generated ion species without any mass separation being performed, the surface of the single crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H_3^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^{++}$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystalline structure due to the collision of the hydrogen ion species with Si atoms.

Figure 24:
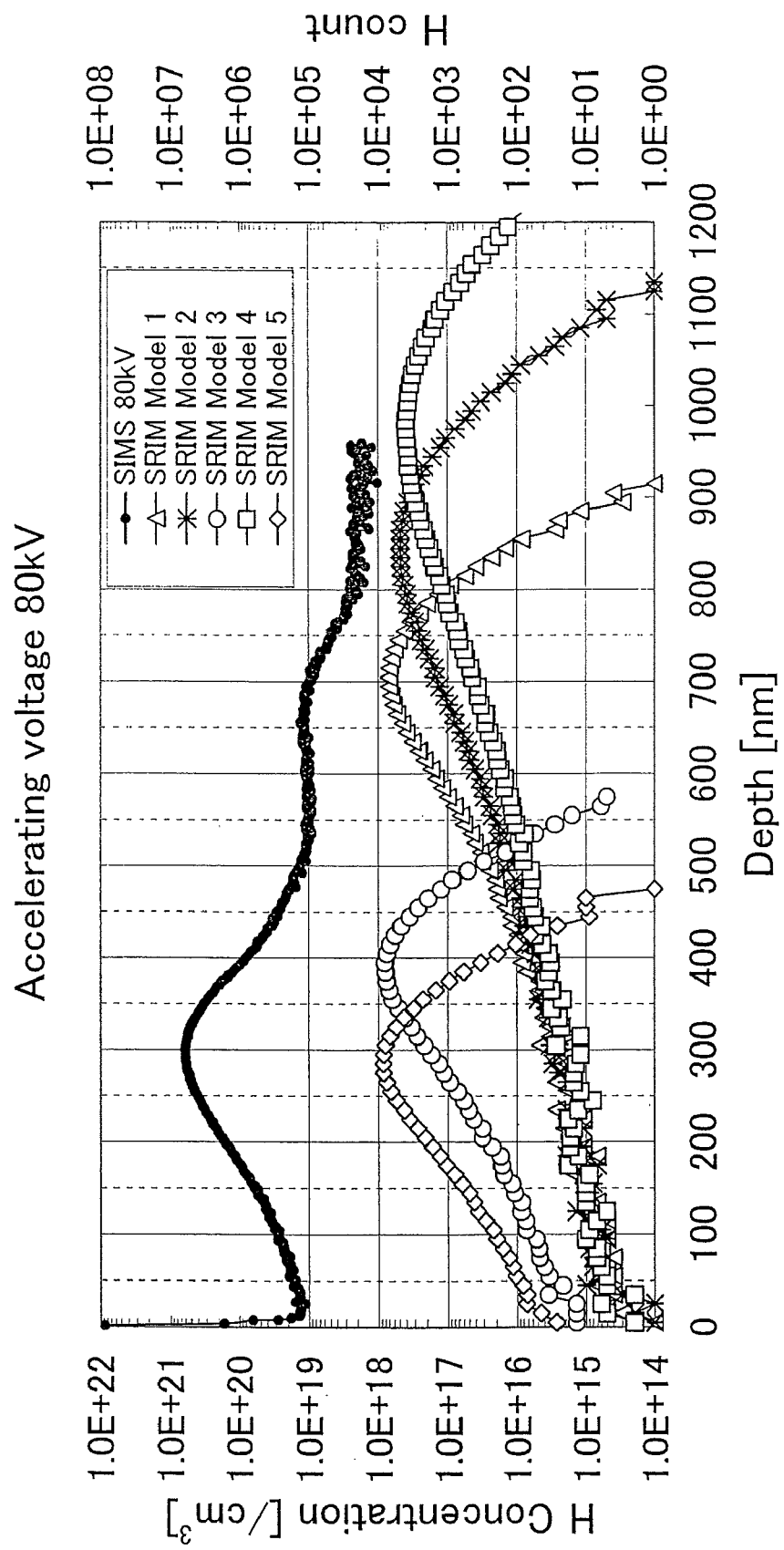
FIG. 24 is a diagram illustrating the profile (measured values and calculated values) of hydrogen in the depth direction when the accelerating voltage is 80 kV.

FIG. 24 shows the calculation results obtained when irradiation with the hydrogen ion species (irradiation with 100,000 atoms for H) is performed using Models 1 to 5. FIG. 24 also shows the hydrogen concentration (secondary ion mass spectrometry (SIMS) data) in an Si substrate irradiated with the hydrogen ion species of FIG. 22. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 25:
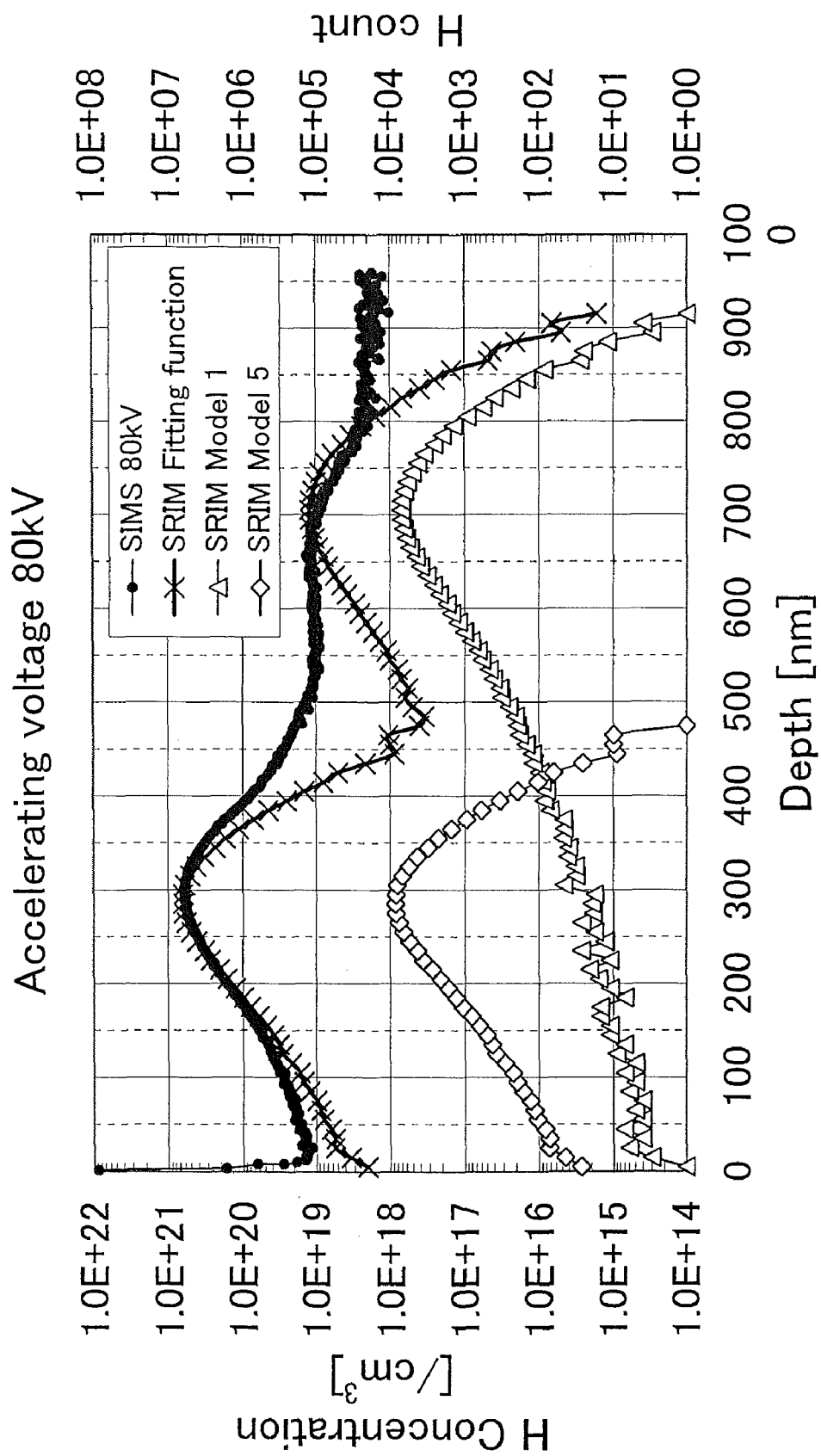
FIG. 25 is a diagram illustrating the profile (measured values, calculated values, and fitting functions) of hydrogen in the depth direction when the accelerating voltage is 80 kV.
Figure 26:
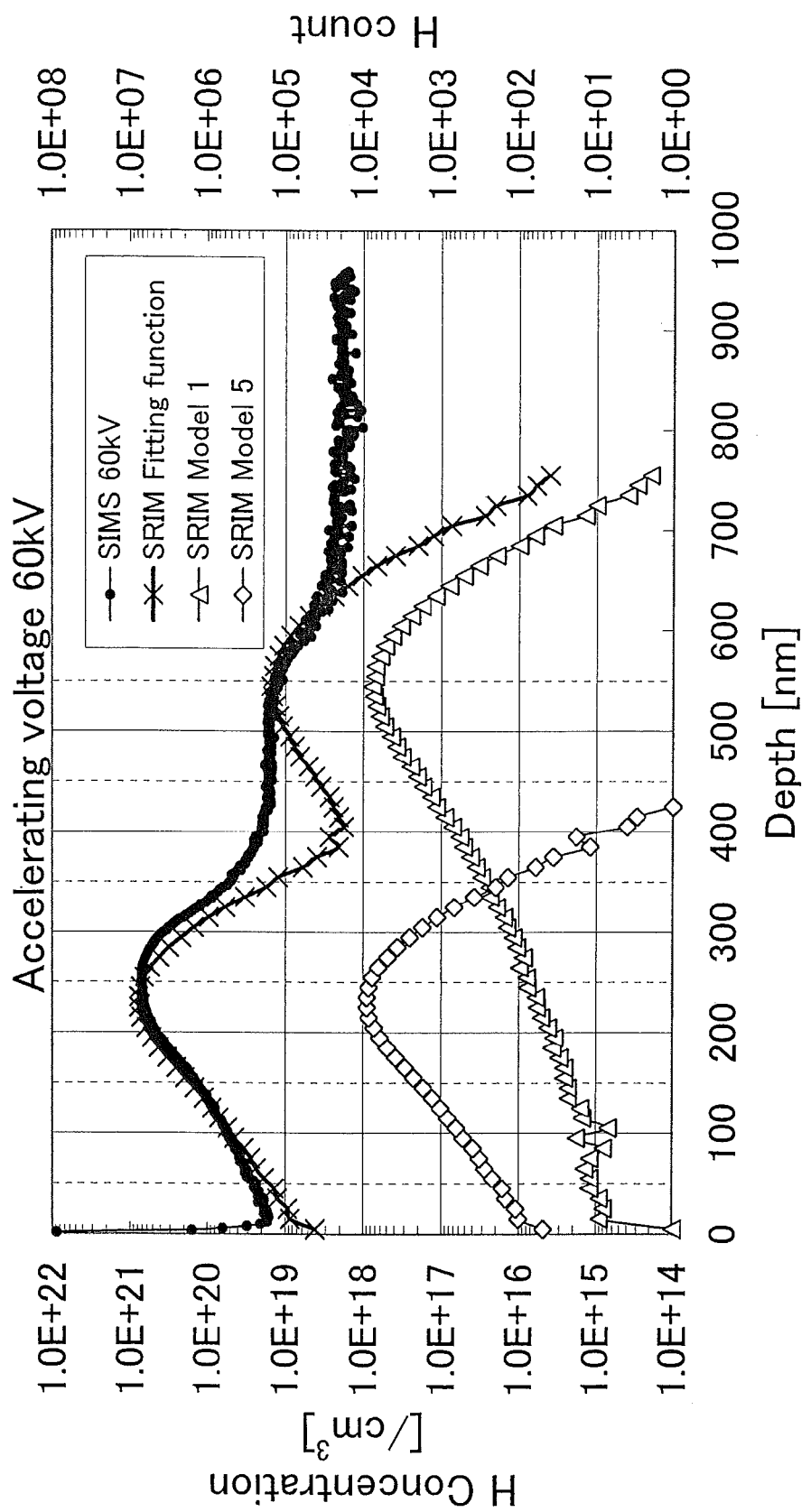
FIG. 26 is a diagram illustrating the profile (measured values, calculated values, and fitting functions) of hydrogen in the depth direction when the accelerating voltage is 60 kV.
Figure 27:
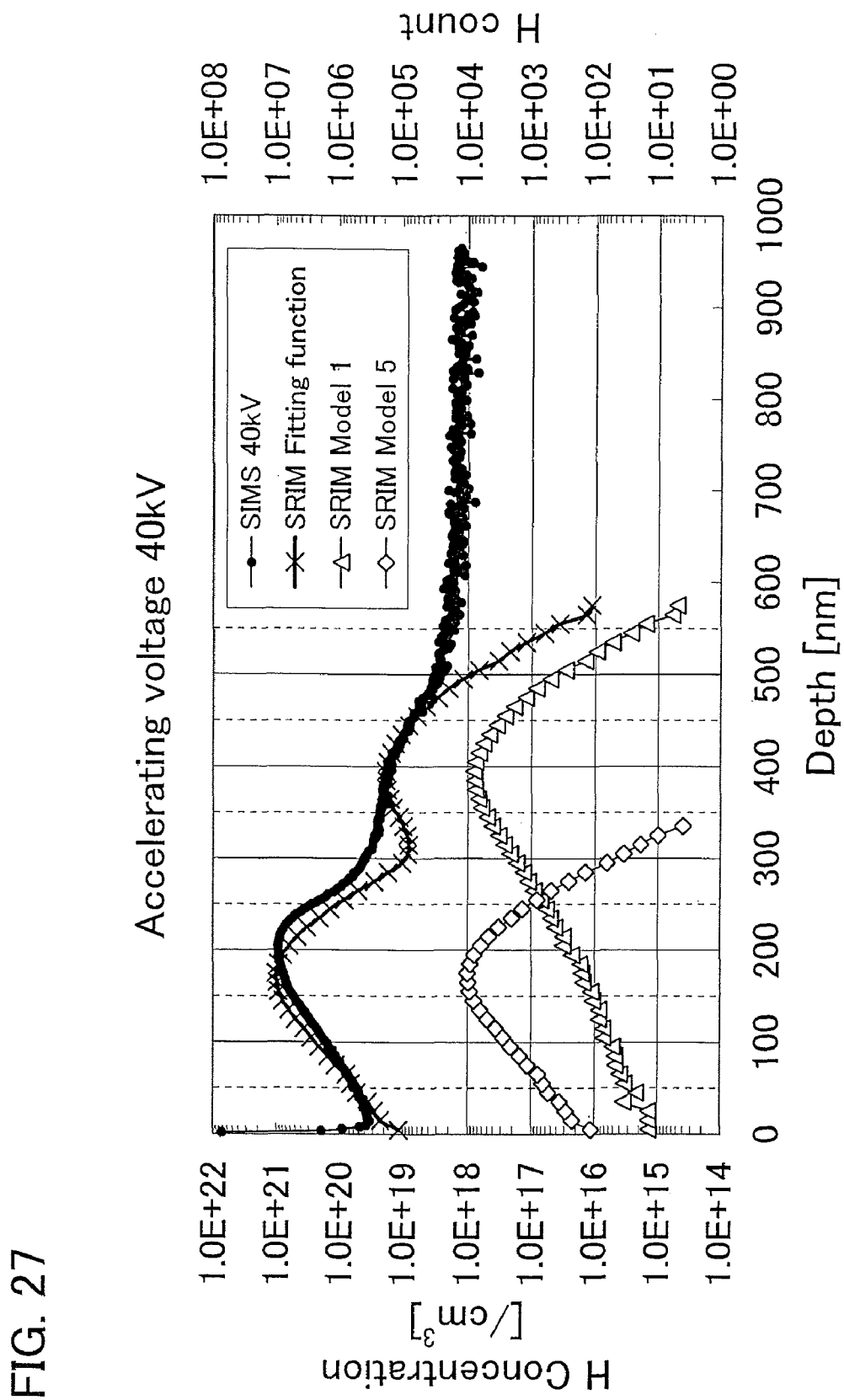
FIG. 27 is a diagram illustrating the profile (measured values, calculated values, and fitting functions) of hydrogen in the depth direction when the accelerating voltage is 40 kV.

Accordingly, Models 2 to 4 will not be considered hereinafter. FIG. 25, FIG. 26 and FIG. 27 each show the calculation results obtained when irradiation with the hydrogen ion species (irradiation with 100,000 atoms for H) is performed using Models 1 and 5. FIG. 25, FIG. 26 and FIG. 27 also each show the hydrogen concentration (SIMS data) in a Si substrate irradiated with the hydrogen ion species of FIG. 22, and the simulation results fitted to the SIMS data (hereinafter referred to as a fitting function). Here, FIG. 25 shows the case where the accelerating voltage is 80 kV; FIG. 26, the case where the accelerating voltage is 60 kV; and FIG. 27, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+$:$H_2^+$:$H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 28 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+$:$H_2^+$:$H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 22. For example, because $H_3^+$ splits into $H^+$, H, or the like to be introduced into a substrate, ion introduction efficiency can be improved compared to the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 22 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

Note that in this embodiment mode, the insulating layer 112 is formed before ion irradiation; however, the insulating layer 112 may be formed after ion irradiation or the insulating layer 112 is not necessarily formed.

Figure 1G:
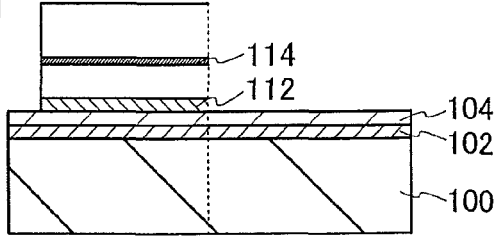

The single crystal semiconductor substrate 110 is bonded to part of the base substrate 100 on which the above-described treatment is performed (see FIG. 1G). Specifically, the base substrate 100 over which the non-single-crystal semiconductor layer 104 is formed and the single crystal semiconductor substrate 110 over which the insulating layer 112 is formed are cleaned by ultrasonic cleaning or the like. After that, part of the non-single-crystal semiconductor layer 104 and the insulating layer 112 are disposed in close contact with each other. In this manner, the non-single-crystal semiconductor layer 104 and the insulating layer 112 are bonded to each other. When the insulating layer 112 is not formed over the single crystal semiconductor substrate 110, the non-single-crystal semiconductor layer 104 and the single crystal semiconductor substrate 110 may be disposed in close contact with each other to be bonded. Note that as a mechanism of the bond, a mechanism involving van der Waals forces, a mechanism involving hydrogen bonding, or the like is given.

One feature of the present invention is to use a non-single-crystal semiconductor layer as a layer for bonding. The non-single-crystal semiconductor layer can be used as a layer for bonding because it has extremely high surface planarity and is suitable for a layer for bonding. As such a non-single-crystal semiconductor layer having high planarity, an amorphous semiconductor layer or a microcrystalline semiconductor layer is preferable in particular. Here, in order to secure planarity of the above-described non-single-crystal semiconductor layer, it is preferable to avoid treatment which may have an adverse influence on the planarity, such as laser irradiation, as much as possible, after formation of the non-single-crystal semiconductor layer. Needless to say, after forming a bond, laser irradiation may be performed. Before forming a bond, treatment which has no adverse influence on planarity or treatment by which planarity is improved may also be performed.

In this manner, by using the non-single-crystal semiconductor layer 104 as a layer for bonding, the non-single-crystal semiconductor layer 104 and the insulating layer 112 can be bonded (attached) to each other at normal temperature. Accordingly, as the base substrate 100, a substrate with low heat resistance, such as a glass substrate, can be used. Note that it is preferable to use silicon oxide which is formed by a plasma CVD method using organosilane as a bonding portion of the insulating layer 112 because the bond can be formed more favorably.

In order to form a stronger bond between the non-single-crystal semiconductor layer 104 and the insulating layer 112, oxygen plasma treatment or ozone treatment may be performed on a surface of the non-single-crystal semiconductor layer 104 or a surface of the insulating layer 112 so that the surface may be hydrophilic. In this treatment, a hydroxyl group is added to the surface of the non-single-crystal semiconductor layer 104 or the surface of the insulating layer 112. Therefore, a hydrogen bond is formed at the bonding interface. Note that, in the case where the insulating layer 112 is not formed over the single crystal semiconductor substrate 110, a treatment by which the surface of the single crystal semiconductor substrate 110 is made hydrophilic may be performed.

After the non-single-crystal semiconductor layer 104 and the insulating layer 112 are disposed in close contact with each other, heat treatment or pressure treatment is preferably performed. By performing heat treatment or pressure treatment, bonding strength between the non-single-crystal semiconductor layer 104 and the insulating layer 112 can be improved. The temperature of heat treatment may be determined depending on heat resistance of the base substrate 100. For example, when a glass substrate is used as the base substrate 100, the temperature of heat treatment needs to be lowered to less than or equal to the strain point of glass. In the case of performing the pressure treatment, pressure is preferably applied so that force is applied in a direction perpendicular to the bonding interface. The applied pressure can be determined in consideration of the strength of the base substrate 100 and the single crystal semiconductor substrate 110. Note that in this embodiment mode, heat treatment is performed at 200° C. for two hours.

Figure 1H:
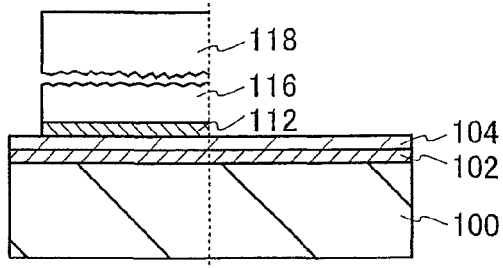

Next, the single crystal semiconductor substrate 110 is separated into a single crystal semiconductor layer 116 and a single crystal semiconductor substrate 118 (see FIG. 1H). The single crystal semiconductor substrate 110 is separated by heating the single crystal semiconductor substrate 110 after the non-single-crystal semiconductor layer 104 and the insulating layer 112 are bonded to each other. In this case as well, the temperature of heat treatment may be determined depending on the upper temperature limit of the base substrate 100. For example, when a glass substrate is used as the base substrate 100, the temperature of heat treatment is preferably greater than or equal to 400° C. and less than or equal to the strain point of glass. However, heat treatment can be performed at a temperature of greater than or equal to the strain point of glass in a short time. Note that in this embodiment mode, heat treatment is performed at 600° C. for two hours.

By performing the heat treatment as described above, volume change of microvoids formed in the damaged region 114 occurs, thereby generating a crack in the damaged region 114. As a result of this, the single crystal semiconductor substrate 110 is separated along the damaged region 114. Since the insulating layer 112 is bonded to the non-single-crystal semiconductor layer 104, the single crystal semiconductor layer 116 separated from the single crystal semiconductor substrate 110 remains over the base substrate 100. Further, since the bonding interface between the non-single-crystal semiconductor layer 104 and the insulating layer 112 is heated by this heat treatment, a covalent bond is formed at the bonding interface so that the bonding strength between the non-single-crystal semiconductor layer 104 and the insulating layer 112 is improved.

As described above, the single crystal semiconductor layer 116 is formed over the part of the base substrate 100. The semiconductor substrate has a structure in which the insulating layer 102 and the non-single-crystal semiconductor layer 104 are stacked in this order over the base substrate 100, and the insulating layer 112 and the single crystal semiconductor layer 116 are stacked in this order over the part of the non-single-crystal semiconductor layer 104. The bond is formed at an interface between the non-single-crystal semiconductor layer 104 and the insulating layer 112. Note that when the insulating layer 112 is not formed, the bond is formed at an interface between the non-single-crystal semiconductor layer 104 and the single crystal semiconductor layer 116.

In a semiconductor substrate formed as described above, defects due to the separation step or the ion irradiation step exist on the surface of the single crystal semiconductor layer 116, and planarity of the surface is impaired. It is difficult to form a thin gate insulating layer having high withstand voltage over such a surface having unevenness of the single crystal semiconductor layer 116. Therefore, planarization treatment is performed on the single crystal semiconductor layer 116. Further, a treatment for reducing the defects in the single crystal semiconductor layer 116 is performed because defects in the single crystal semiconductor layer 116 have an adverse effect on the performance and reliability of a transistor, such as increase of the localized state density at the interface between the single crystal semiconductor layer 116 and a gate insulating layer.

Figure 2A:
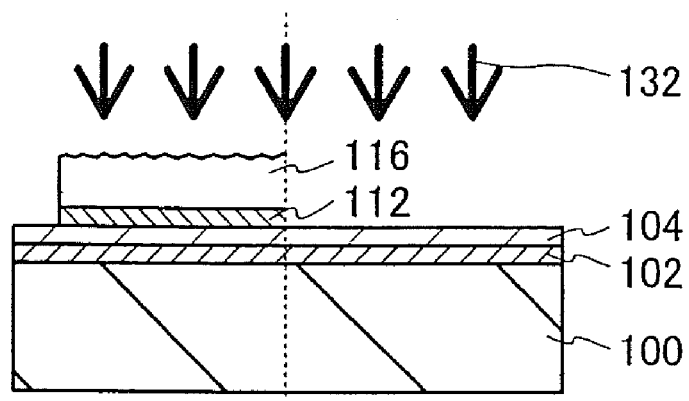
FIGS. 2A to 2C are views illustrating a method for manufacturing a semiconductor substrate.
Figure 2B:
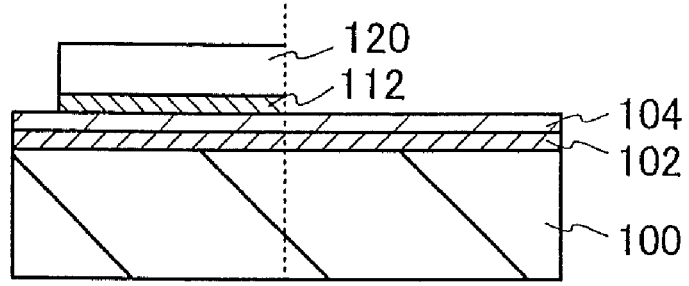
Figure 2C:
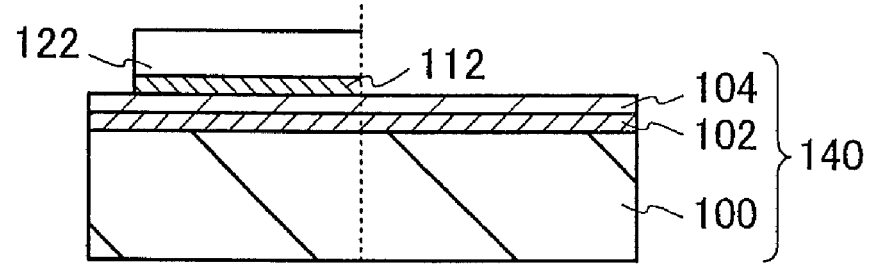

In this embodiment mode, by irradiation of the single crystal semiconductor layer 116 with the laser light 132, planarity of the single crystal semiconductor layer 116 can be improved and defects of the single crystal semiconductor layer 116 can be reduced (see FIG. 2A). An upper surface of the single crystal semiconductor layer 116 is irradiated with the laser light 132 to be melted. After melting the upper surface of the single crystal semiconductor layer 116, the single crystal semiconductor layer 116 is cooled down and solidified, whereby a single crystal semiconductor layer 120 of which upper surface planarity is improved can be obtained (see FIG. 2B). In this embodiment mode, since the single crystal semiconductor layer 116 is melted by irradiation with the laser light 132, it is not necessary to heat the base substrate 100 and temperature rise of the base substrate 100 can be suppressed. Thus, a substrate having low heat resistance such as a glass substrate can be used as the base substrate 100. Needless to say, heat treatment may be performed at a temperature in the range of the upper temperature limit of the base substrate. By heating the base substrate, even when laser light having relatively low energy density is used, the defects can be reduced effectively. On the other hand, the defects cannot be reduced by only heat treatment at a temperature of less than or equal to about 650° C. In this sense, it can be said that laser irradiation is essential.

Note that partial melting is necessarily performed as melting of the single crystal semiconductor layer 116 by irradiation with the laser light 132. In the case where the single crystal semiconductor layer 116 is melted completely, the microcrystallization of the single crystal semiconductor layer 116 is caused by disordered nucleation of the single crystal semiconductor layer 116 in a liquid phase and crystallinity of the single crystal semiconductor layer 116 is lowered. On the contrary, by partial melting, crystal growth proceeds from a solid phase part, which is not melted. Accordingly, the defects of the semiconductor layer can be reduced. Note that, the term "complete melting" means that the single crystal semiconductor layer 116 is melted to an interface between the single crystal semiconductor layer 116 and the insulating layer 112 and is in a liquid state. On the other hand, in this case, the term "partial melting" means that the upper part of the single crystal semiconductor layer 116 is melted and is in a liquid phase while the lower part thereof is not melted and is still in a solid phase.

Note that when an amorphous semiconductor is used as the non-single-crystal semiconductor layer 104, for example, the amorphous semiconductor may be microcrystallized or polycrystallized by irradiation with the laser light 132. Thus, characteristics of a semiconductor device to be formed later can be improved. Needless to say, when an amorphous semiconductor is preferable as a semiconductor layer used for a semiconductor device to be formed later, or when a microcrystalline semiconductor or a polycrystalline semiconductor is used as the non-single-crystal semiconductor layer 104 in advance, it is not necessary to irradiate the non-single-crystal semiconductor layer 104 with the laser light 132.

A pulsed laser is preferably used for the laser irradiation. This is because high-energy pulsed laser light can be emitted instantaneously and the partial melting state can be easily obtained. The repetition rate is preferably approximately greater than or equal to 1 Hz and less than or equal to 10 MHz; and more preferably greater than or equal to 10 Hz and less than or equal to 1 MHz. As examples of the above-described pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like can be given. Note that the pulsed laser is preferably used for partial melting; however, the present invention should not be construed as being limited thereto. That is, the use of continuous wave lasers is not excluded. Note that, as examples of continuous wave lasers, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

The wavelength of the laser light 132 needs to be a wavelength which is absorbed by the single crystal semiconductor layer 116. The wavelength may be determined in consideration of the skin depth of the laser light, and the like. For example, the wavelength can be in the range of greater than or equal to 250 nm and less than or equal to 700 nm. In addition, the energy density of the laser light 132 can be determined in consideration of the wavelength of the laser light 132, the skin depth of the laser light 132, the thickness of the single crystal semiconductor layer 116, or the like. The energy density of the laser light 132 may be set, for example, in the range of greater than or equal to 300 $mJ/cm^2$ and less than or equal to 800 $mJ/cm^2$. Note that the above-described energy density range is an example in the case where a XeCl excimer laser (wavelength: 308 nm) is used as a pulsed laser.

When the thickness of the single crystal semiconductor layer 116 is made to be greater than 50 nm by adjusting the depth at which the ions have entered in an ion irradiation step, adjustment of the energy density of the laser light 132 is easily carried out. Accordingly, by irradiation with the laser light 132, planarity of the surface of the semiconductor layer can be improved and the defects thereof can be reduced with high yield. Note that when the single crystal semiconductor layer 116 is formed to be thick, the energy density of the laser light 132 needs to be increased. Therefore, the thickness of the single crystal semiconductor layer 116 is preferably less than or equal to 200 nm.

The irradiation with the laser light 132 can be performed in an atmosphere containing oxygen such as an air atmosphere or an inert atmosphere such as a nitrogen atmosphere. In order to perform the irradiation with the laser light 132 in an inert atmosphere, irradiation with the laser light 132 may be performed in an airtight chamber while the atmosphere in the chamber is controlled. In the case where the chamber is not used, by blowing an inert gas such as a nitrogen gas to the surface which is irradiated with the laser light 132, a nitrogen atmosphere can be formed.

Note that the irradiation with the laser light 132 in an inert atmosphere such as a nitrogen atmosphere is more effective in improving planarity of the single crystal semiconductor layer 116 than the irradiation with the laser light 132 in an air atmosphere. In addition, an inert atmosphere is more effective in suppressing generation of cracks and ridges than an air atmosphere, and the applicable energy density range for the laser light 132 is widened. The irradiation with the laser light 132 may be performed in vacuum. In the case where the irradiation with the laser light 132 is performed in vacuum, the same effect can be obtained as that produced in the case where the irradiation with the laser light 132 is performed in an inert atmosphere.

After the irradiation with the laser light 132 is performed as described above, a step of thinning the single crystal semiconductor layer 120 may be performed. In order to thin the single crystal semiconductor layer 120 (etch back treatment), one of dry etching and wet etching or a combination of both of the etchings may be employed. For example, in the case where the single crystal semiconductor layer 120 is a layer formed using a silicon material, the single crystal semiconductor layer 120 can be thinned by dry etching treatment using $SF_6$ and $O_2$ as a process gas. Note that when the non-single-crystal semiconductor layer 104 and the single crystal semiconductor layer 120 are formed using the same semiconductor material, the non-single-crystal semiconductor layer 104 is also thinned by the above-described etching treatment. Therefore, when the above-described etching treatment is performed, the non-single-crystal semiconductor layer 104 is preferably formed to have a large thickness in advance, or a mask or the like to cover the non-single-crystal semiconductor layer 104 is preferably formed. As described above, a semiconductor substrate 140 having a thin single crystal semiconductor layer 122 over the part of the non-single-crystal semiconductor layer 104 can be manufactured (see FIG. 2C).

Note that in this embodiment mode, an example is described in which etching treatment is performed after planarization or the like of the surface by irradiation with the laser light; however, the present invention should not be construed as being limited thereto. For example, etching treatment may be performed before irradiation with the laser light. In this case, the unevenness or the defects of the surface of the semiconductor layer can be reduced to some extent by the etching treatment. Alternatively, the etching treatment may be performed before and after irradiation with the laser light. Further alternatively, the laser irradiation and the etching treatment may be alternately repeated. By using the laser irradiation and the etching treatment (etch back treatment) in combination as just described, unevenness, defects, and the like of the surface of the semiconductor layer can be significantly reduced.

Further, after irradiation with the laser light 132, heat treatment may be performed at a temperature of less than or equal to the upper temperature limit of the base substrate 100. Thus, the effect caused by irradiation with the laser light 132 is promoted, so that the defects can be removed efficiently and the planarity can be improved. Needless to say, it is not necessary that the above-described etching treatment, heat treatment, or the like is always performed. The planarity can be improved by CMP in addition to or instead of the above-described etching treatment or heat treatment.

With the use of the method described in this embodiment mode, a substrate provided with both a single crystal semiconductor layer and a non-single-crystal semiconductor layer can be provided. Thus, a high performance circuit (a circuit of a region which requires high speed operation) can be formed using a single crystal semiconductor layer and a circuit of a region which requires a large area can be formed using a non-single-crystal semiconductor layer.

Here, the non-single-crystal semiconductor layer of this embodiment mode has two functions. One of the two functions is that the non-single-crystal semiconductor layer serves as a layer for bonding the base substrate and the single crystal semiconductor layer to each other (a layer for bonding, or a layer for attaching), and the other is that the non-single-crystal semiconductor layer serves as a material layer for forming a semiconductor element. With the use of the non-single-crystal semiconductor layer having such functions, manufacturing cost of a semiconductor substrate can be reduced as compared to the case of forming a layer for bonding and a material layer for forming a semiconductor element separately.

Note that a circuit which requires high speed operation refers to a circuit where driving at a certain frequency or more is required. As an example, the circuit refers to a circuit where an operation at a frequency of greater than or equal to 1 MHz is required. A semiconductor layer which is used is defined by a required frequency because a frequency, at which a switching element used for a circuit can operate, largely depends on a semiconductor material. A switching element of a field-effect transistor which uses a single crystal semiconductor having high carrier mobility (about 500 $cm^2/V \cdot s$ in a case of electron mobility in single crystal silicon) has high transmittance speed of a signal and is suitable for high frequency operation. On the other hand, a switching element which uses a non-single-crystal semiconductor having low carrier mobility (about 1 $cm^2/V \cdot s$ in a case of electron mobility in amorphous silicon) has low transmittance speed of a signal and is not suitable for high frequency operation. Note that an upper limit of a frequency at which a switching element can operate also depends on a parameter other than the material (for example, a channel length, a channel width, the content of an impurity element or the like); therefore, it is difficult to uniformly define high speed operation by a certain frequency or more. A frequency is shown here in accordance with performance as a tentative standard, which is required for a driver circuit of a display device.

When planarity of the single crystal semiconductor layer is improved and the defects of the single crystal semiconductor layer are reduced by laser irradiation as described in this embodiment mode, the non-single-crystal semiconductor layer is also irradiated with the laser light at the same time, so that crystallinity thereof can be improved. In this case, characteristics of the single crystal semiconductor layer and the non-single-crystal semiconductor layer can be improved in one step. That is, since a step of improving characteristics of only the non-single-crystal semiconductor layer is unnecessary, increase in the number of steps can be suppressed, so that a high performance semiconductor substrate can be manufactured at low cost.

Note that although it is also possible to manufacture all semiconductor elements using a single crystal semiconductor layer, it is not realistic for a semiconductor device which requires a large area. For example, when a large display device is manufactured, a plurality of single crystal semiconductor layers need to be placed over a base substrate with no space; however, it is very difficult. Characteristics which are required for a semiconductor element of a pixel region in a display device can be obtained by using a non-single-crystal semiconductor layer and there is no so advantageous in using a single crystal semiconductor layer for a semiconductor element of a pixel region. In consideration of the above, it can be said that it is preferable, in terms of characteristics and cost which are required, to use a non-single-crystal semiconductor layer for a region where a large are is required and to use a single crystal semiconductor layer for a region where high performance (high speed operation) is required as in the present invention.

Embodiment Mode 2

In this embodiment mode, a method for manufacturing a semiconductor device using the semiconductor substrate manufactured in Embodiment Mode 1 will be described with reference to FIGS. 4A to 4D, FIGS. 5A to 5D and FIGS. 6A and 6B. Here, as an example, a method for manufacturing a semiconductor device including a plurality of transistors will be described.

Figure 4A:
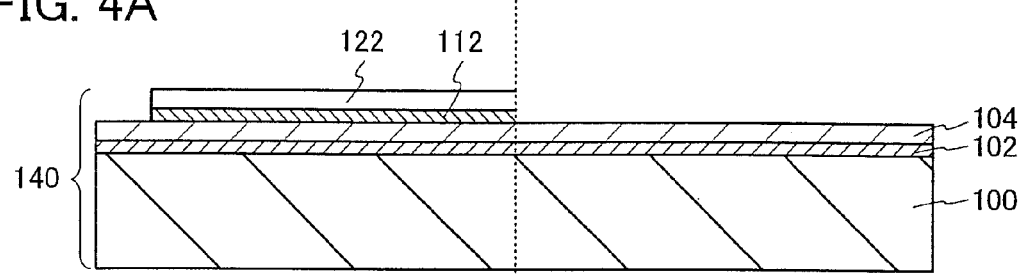
FIGS. 4A to 4D are cross-sectional views illustrating a manufacturing process of a semiconductor device.

FIG. 4A is a cross-sectional view of the semiconductor substrate 140 manufactured in Embodiment Mode 1.

An impurity element imparting p-type conductivity such as boron, aluminum, or gallium or an impurity element imparting n-type conductivity such as phosphorus, or arsenic may be added to a non-single-crystal semiconductor layer 104 and a single crystal semiconductor layer 122 in order to control a threshold voltage of a transistor. A region to which the impurity element is added and the kind of the impurity element to be added can be changed as appropriate. For example, an impurity element imparting p-type conductivity is added to a formation region of an n-channel transistor and an impurity element imparting n-type conductivity is added to a formation region of an p-channel transistor. The above impurity elements may be added at a dose of about $1 \times 10^{15}/cm^2$ to $1 \times 10^{17}/cm^2$.

Figure 4B:
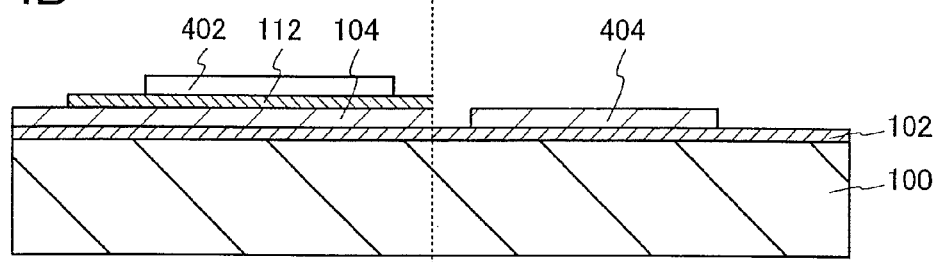

The single crystal semiconductor layer 122 and the non-single-crystal semiconductor layer 104 are etched and separated into island shapes, whereby a single crystal semiconductor layer 402 and a non-single-crystal semiconductor layer 404 are formed (see FIG. 4B). Note that in FIG. 4B, the single crystal semiconductor layer 402 has the same size as the non-single-crystal semiconductor layer 404; however, FIG. 4B is just a schematic diagram and the single crystal semiconductor layer 402 may have a different size from the non-single-crystal semiconductor layer 404. In consideration of the characteristics of the semiconductor layer, a transistor using a single crystal semiconductor layer can be made smaller than a transistor using a non-single-crystal semiconductor. In other words, the single crystal semiconductor layer 402 may be made smaller than the non-single-crystal semiconductor layer 404. Further, in this embodiment mode, the non-single-crystal semiconductor layer in the periphery of the insulating layer 112 remains; however, the present invention is not limited thereto.

Figure 4C:
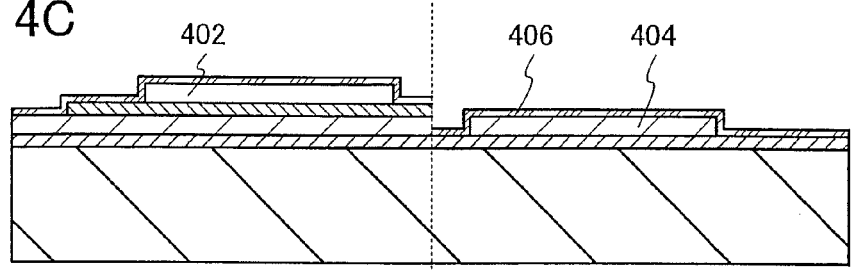

Next, a gate insulating layer 406 is formed so as to cover the single crystal semiconductor layer 402 and the non-single-crystal semiconductor layer 404 (see FIG. 4C). Here, a silicon oxide film is formed as a single layer by a plasma CVD method. Alternatively, the gate insulating layer 406 may be formed to have a single layer structure or a stacked layer structure of a film(s) containing silicon oxynitride, silicon nitride oxide, silicon nitride, hafnium oxide, aluminum oxide, tantalum oxide or the like.

As a manufacturing method except a plasma CVD method, a sputtering method or a method using oxidation or nitridation by high-density plasma treatment can be given. High-density plasma treatment is performed by using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are generated by such high-density plasma, whereby the insulating layer is formed to a thickness of 1 nm to 20 nm, preferably 2 nm to 10 nm so as to be in contact with the semiconductor layers.

Since the oxidation or nitridation of the semiconductor layers by the high-density plasma treatment proceeds by a solid-phase reaction, the interface state density between the gate insulating layer 406 and the single crystal semiconductor layer 402 or the non-single-crystal semiconductor layer 404 can be drastically decreased. Further, the semiconductor layers are directly oxidized or nitrided by the high-density plasma treatment, whereby variation in thickness of the insulating layer to be formed can be suppressed. When an insulating layer formed by high-density plasma treatment as described above is used for part of or the entire gate insulating layer of a transistor, variation in characteristic of transistors can be suppressed.

A more specific example of manufacturing method of the insulating layer by plasma treatment will be described. Surfaces of the single crystal semiconductor layer 402 and the non-single-crystal semiconductor layer 404 are oxidized or nitrided in such a manner that nitrous oxide ($N_2O$) is diluted 1- to 3-fold (the flow ratio) with argon (Ar) and microwave power (2.45 GHz) of greater than or equal to 3 kW and less than or equal to 5 kW is applied under pressure of greater than or equal to 10 Pa and less than or equal to 30 Pa. By this treatment, a lower layer of the gate insulating layer 406 with a thickness of greater than or equal to 1 nm and less than or equal to 10 nm (preferably, greater than or equal to 2 nm and less than or equal to 6 nm) is formed. Further, a silicon oxynitride film is formed as an upper layer of the gate insulating film 606 by a vapor-phase growth method in such a manner that nitrous oxide ($N_2O$) and silane ($SiH_4$) are introduced and microwave power (2.45 GHz) of greater than or equal to 3 kW and less than or equal to 5 kW is applied under pressure of greater than or equal to 10 Pa and less than or equal to 30 Pa. The gate insulating layer 406 is formed by combining solid phase reaction and reaction by a vapor-phase growth method as described above, whereby the gate insulating layer 406 with low interface state density and excellent withstand voltage can be formed. Note that in this case, the gate insulating layer 406 has a two-layer structure.

Alternatively, the gate insulating layer 406 may be formed by thermally oxidizing the single crystal semiconductor layer 402 and the non-single-crystal semiconductor layer 404. In the case of forming the gate insulating layer 406 by such thermal oxidation, a base substrate with a comparatively high resistance against heat is preferably used.

Note that after the gate insulating layer 406 including hydrogen is formed, hydrogen included in the gate insulating layer 406 may be dispersed in the single crystal semiconductor layer 402 and the non-single-crystal semiconductor layer 404 by performing heat treatment at a temperature of greater than or equal to 350° C. and less than or equal to 450° C. In this case, the gate insulating layer 406 can be formed by using silicon nitride or silicon nitride oxide by a plasma CVD method. Note that a process temperature is preferably set to less than or equal to 350° C. In this manner, hydrogen is supplied to the single crystal semiconductor layer 402 and the non-single-crystal semiconductor layer 404, whereby defects in the single crystal semiconductor layer 402 and the non-single-crystal semiconductor layer 404, at an interface between the gate insulating layer 406 and the single crystal semiconductor layer 402, and at an interface between the gate insulating layer 406 and the non-single-crystal semiconductor layer 404 can be effectively reduced.

Figure 4D:
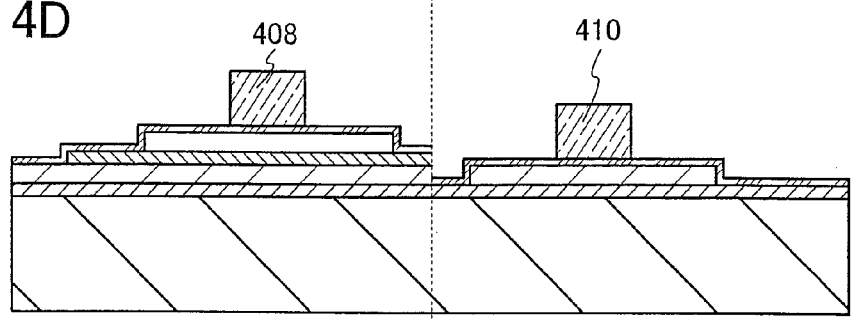

Next, a conductive layer is formed over the gate insulating layer 406, and then, the conductive layer is processed (patterned) into a predetermined shape, whereby an electrode 408 and an electrode 410 are formed over the single crystal semiconductor layer 402 and the non-single-crystal semiconductor layer 404 (see FIG. 4D). The conductive layer can be formed by a CVD method, a sputtering method, or the like. The conductive layer can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as its main component or a compound containing the above-described metal may also be used. Further alternatively, a semiconductor material such as polycrystalline silicon, which is obtained by doping a semiconductor layer with an impurity element that imparts conductivity, or the like may be used.

Although the electrode 408 and the electrode 410 are formed as a single-layer conductive layer in this embodiment mode, the semiconductor device of the present invention is not limited to the structure. The electrode 408 may be formed as a plurality of stacked conductive layers. In a case of a two-layer structure, for example, a molybdenum film, a titanium film, a titanium nitride film, or the like may be used as a lower layer, and an aluminum film or the like may be used as an upper layer. In a case of a three-layer structure, a stacked-layer structure of a molybdenum film, an aluminum film, and a molybdenum film; a stacked-layer structure of a titanium film, an aluminum film, and a titanium film; or the like may be preferably used.

Note that a mask used for forming the electrode 408 and the electrode 410 may be formed using a material such as silicon oxide, silicon nitride oxide, or the like. In this case, a process for forming a mask by patterning a silicon oxide film, a silicon nitride oxide film, or the like is added; however, the amount of the reduced film thickness of the mask formed with a silicon oxide film, a silicon nitride oxide film, or the like in etching is smaller than a mask formed with the resist material; thus, the electrode 408 and the electrode 410 with an accurate shape can be formed. Alternatively, the electrode 408 and the electrode 410 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrode 408 and the electrode 410 can be formed in such a manner that an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are controlled as appropriate, so that the conductive layer is etched so as to obtain a desired tapered shape. The tapered shape can be adjusted by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 5A:
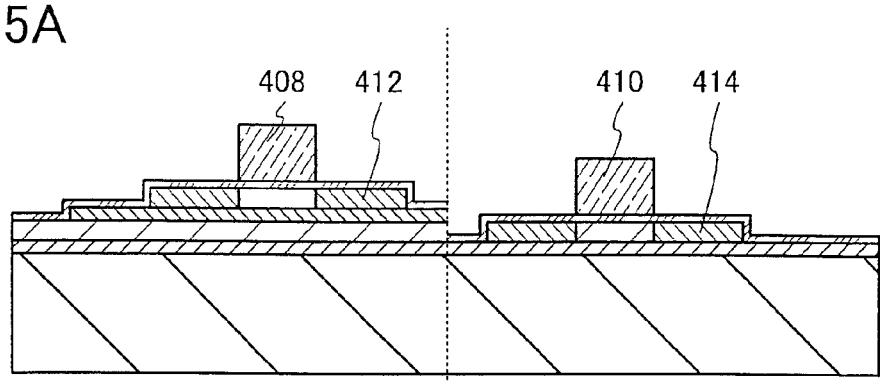
FIGS. 5A to 5D are cross-sectional views illustrating a manufacturing process of a semiconductor device.

Next, an impurity element imparting one conductivity type is added to the single crystal semiconductor layer 402 and the non-single-crystal semiconductor layer 404 using the electrode 408 and the electrode 410 as masks (see FIG. 5A). In this embodiment mode, an impurity element imparting n-type conductivity (for example, phosphorus or arsenic) is added to the single crystal semiconductor layer 402 and the non-single-crystal semiconductor layer 404, and an impurity element imparting p-type conductivity (for example, boron) may be added. Note that in order to add an impurity element imparting n-type conductivity and an impurity element imparting p-type conductivity selectively, the semiconductor layer to which an impurity element imparting p-type conductivity is to be added is covered with a mask or the like in adding an impurity element imparting n-type conductivity, and the semiconductor layer to which an impurity element imparting n-type conductivity is added is covered with a mask or the like in adding an impurity element imparting p-type conductivity. Alternatively, after an impurity element imparting one of p-type and n-type conductivities is added to all the semiconductor layers, an impurity element imparting the other may be added to part of the semiconductor layers at a higher concentration. By the addition of the impurity, impurity regions 412 are formed in the single crystal semiconductor layer 402 and impurity regions 414 are formed in the non-single-crystal semiconductor layer 404.

Figure 5B:
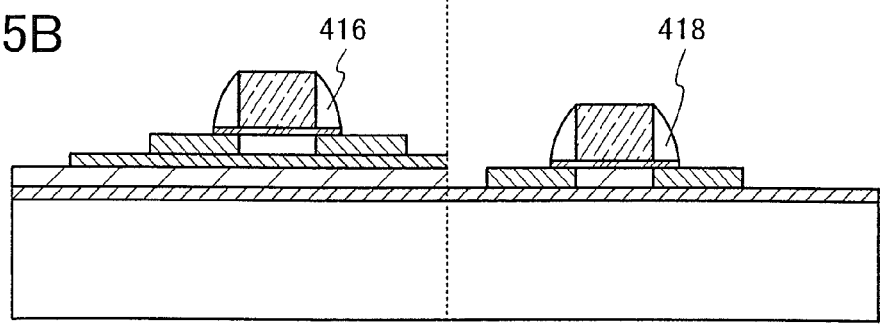

Subsequently, sidewalls 416 are formed on side surfaces of the electrode 408, and sidewalls 418 are formed on side surfaces of the electrode 410 (see FIG. 5B). The sidewalls 416 and 418 can be formed by, for example, newly forming an insulating layer so as to cover the gate insulating layer 406 and the electrodes 408 and 410 and performing anisotropic etching mainly in a perpendicular direction with respect to the insulating layer. Note that the gate insulating layer 406 may also be etched partially by the above-described anisotropic etching. In this embodiment mode, part except part of the gate insulating layer 406 which is below the electrode 408 and the sidewalls 416 and part of the gate insulating layer 406 which is below the electrode 410 and the sidewalls 418 is removed; however, the present invention is not limited thereto. As the insulating layer for forming the sidewalls 416 and 418, a film including silicon, silicon oxide, silicon nitride, silicon oxynitride, silicon nitride oxide, an organic material, or the like may be formed to have a single-layer structure or a stacked-layer structure by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that the process for forming the sidewalls 416 and 418 is not limited to these steps.

Figure 5C:
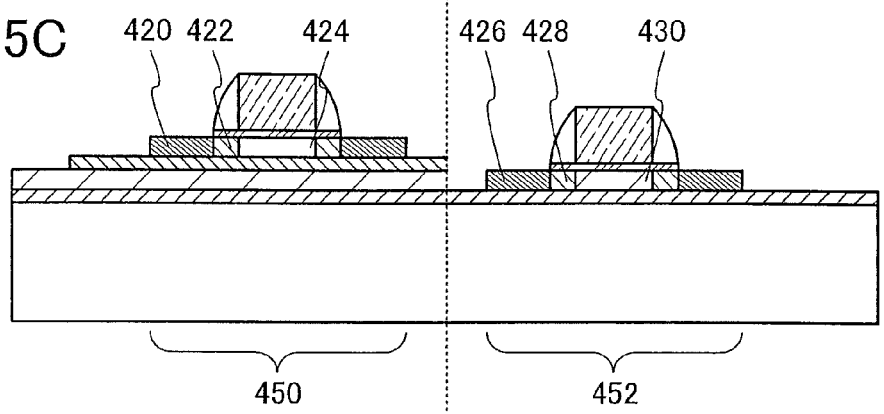

Next, an impurity element imparting one conductivity type is added to the single crystal semiconductor layer 402 and the non-single-crystal semiconductor layer 404 using the gate insulating layer 406, the electrode 408, the sidewalls 416, the electrode 410 and the sidewalls 418 as masks (see FIG. 5C). Note that the impurity element imparting the same conductivity type as the impurity element which has been added to each of the single crystal semiconductor layer 402 and the non-single-crystal semiconductor layer 404 in the previous process is added to the single crystal semiconductor layer 402 and the non-single-crystal semiconductor layer 404 at a higher concentration. In this manner, a pair of high concentration impurity regions 420, a pair of low concentration impurity regions 422, and a channel formation region 424 are formed in the single crystal semiconductor layer 402, and a pair of high concentration impurity regions 426, a pair of low concentration impurity regions 428, and a channel formation region 430 are formed in the non-single-crystal semiconductor layer 404. The high concentration impurity regions 420 and 426 serve as a source region or a drain region, and the low concentration impurity regions 422 and 428 serve as LDD (Lightly Doped Drain) regions.

Note that in FIGS. 5A to 5D, the sidewalls 416 formed over the single crystal semiconductor layer 402 has the same size as the sidewalls 418 formed over the non-single-crystal semiconductor layer 404; however, FIGS. 5A to 5D are just schematic views and the present invention is not construed as being limited thereto. Since the size of the LDD regions changes depending on the size of the sidewalls, the size of the sidewalls 416 and 418 may be set as appropriate in accordance with characteristics of a transistor required.

A silicide layer in which silicide is formed in part of the single crystal semiconductor layer 402 and the non-single-crystal semiconductor layer 404 may be formed in order to further reduce the resistance of the source region and the drain region. The silicide is formed by placing metal in contact with the semiconductor layers and causing reaction between the metal and silicon in the semiconductor layers by heat treatment (for example, a GRTA method, an LRTA method, or the like). In the case where the single crystal semiconductor layer 402 and the non-single-crystal semiconductor layer 404 are thin, silicide reaction may proceed to bottoms of the single crystal semiconductor layer 402 and the non-single-crystal semiconductor layer 404. A silicide layer can be formed by laser irradiation or the like. As a metal material used for forming silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like.

Through the aforementioned processes, an n-channel transistor 450 using a single crystal semiconductor and an n-channel transistor 452 using a non-single-crystal semiconductor are formed. Note that although conductive layers serving as source electrodes or drain electrodes are not formed in a stage illustrated in FIG. 5C, a structure including the conductive layers serving as source electrodes or drain electrodes may be referred to as a transistor.

Figure 5D:
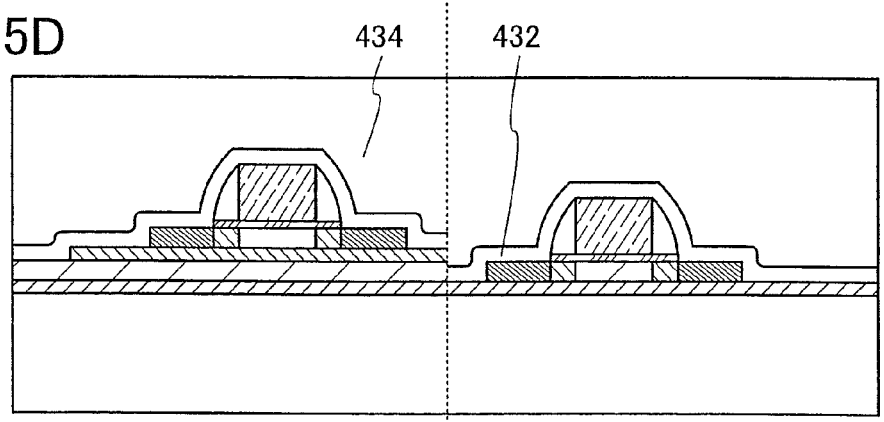

Next, an insulating layer 432 is formed to cover the n-channel transistor 450 and the n-channel transistor 452 (see FIG. 5D). The insulating layer 432 is not always necessary; however, the formation of the insulating layer 432 can prevent impurities such as alkali metal or alkaline-earth metal from entering the n-channel transistor 450 and the n-channel transistor 452. In specific, the insulating layer 432 is preferably formed using a material such as silicon oxide, silicon nitride, silicon oxynitride, silicon nitride oxide, aluminum nitride, aluminum oxide, or the like. In this embodiment mode, the insulating layer 432 is formed using a silicon nitride oxide film with a thickness of about 600 nm. In this case, the above-described hydrogenation process may be performed after the silicon nitride oxide film is formed. Note that although the insulating layer 432 is formed to have a single-layer structure in this embodiment mode, it is needless to say that the insulating layer 432 may have a stacked-layer structure. For example, in the case of a two-layer structure, the insulating layer 432 may have a stacked-layer structure of a silicon oxynitride film and a silicon nitride oxide film.

Next, an insulating layer 434 is formed over the insulating layer 432 so as to cover the n-channel transistor 450 and the n-channel transistor 452. The insulating layer 434 may be preferably formed using an organic material having resistance against heat, such as polyimide, acrylic, benzocyclobutene, polyamide, or epoxy. As an alternative to the organic materials listed above, a low-dielectric constant material (a low-k material), a siloxane-based resin, silicon oxide, silicon nitride, silicon oxynitride, silicon nitride oxide, aluminum nitride, aluminum oxide, PSG (phosphosilicate glass), BPSG (borophosphosilicate glass), or the like may be used. Here, the siloxane-based resin corresponds to a resin including a Si—O—Si bond which is formed using a siloxane-based material as a starting material. The siloxane-based resin may include at least any one of hydrogen, fluorine, an alkyl group, and aromatic hydrocarbon as a substituent. Note that the insulating layer 434 may be formed by stacking plural insulating layers formed using any of these materials. Further, the surface of the insulating layer 434 may be planarized by a CMP method or the like.

For the formation of the insulating layer 434, the following method can be used depending on the material of the insulating layer 434: a CVD method, a sputtering method, an SOG method, a spin coating method, a dip coating method, a spray coating method, a droplet discharge method (e.g., an ink-jet method, screen printing, or offset printing), a doctor knife, a roll coater, a curtain coater, a knife coater, or the like.

Next, contact holes are formed in the insulating layers 432 and 434 so that each of the single crystal semiconductor layer 402 and the non-single-crystal semiconductor layer 404 is partially exposed. Then, conductive layers 436 and conductive layers 438 are formed to be in contact with the single crystal semiconductor layer 402 and the non-single-crystal semiconductor layer 404, respectively, through the contact holes (see FIG. 6A). The conductive layers 436 and 438 serve as source and drain electrodes of the transistors. Note that in this embodiment mode, as an etching gas for forming the contact holes, a mixed gas of $CHF_3$ and He is used; however, the etching gas is not limited thereto.

The conductive layers 436 and 438 can be formed by a CVD method, a sputtering method, or the like. In specific, the conductive layers 436 and 438 can be formed using a material such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as its main component or a compound containing the above-described material may be used. The conductive layers 436 and 438 may each have a single-layer structure or a stacked-layer structure.

As an example of an alloy containing aluminum as its main component, an alloy containing aluminum as its main component and also containing nickel is given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the conductive layers 436 and 438. In particular, the aluminum silicon is preferable because a hillock can be prevented from generating. Further, a material in which Cu is mixed into aluminum at approximately 0.5% may be used instead of silicon.

In the case where each of the conductive layers 436 and 438 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming conductive layers so as to interpose an aluminum silicon film between the barrier films, generation of a hillock can be further prevented. Moreover, by forming the barrier film using titanium that is a highly reducible element, even if a thin oxide film is formed over the single crystal semiconductor layer 402 and the non-single-crystal semiconductor layer 404, the oxide film is reduced by the titanium contained in the barrier film, whereby preferable contact between the conductive layer 436 and the single crystal semiconductor layer 402 and between the conductive layer 438 and the non-single-crystal semiconductor layer 404 can be obtained. Further, it is also possible to stack a plurality of barrier films. In that case, for example, each of the conductive layers 436 and 438 can be formed to have a five-layer structure including, for example, titanium, titanium nitride, aluminum silicon, titanium, and titanium nitride in this order from the bottom; or a stacked-layer structure including more than five layers.

As the conductive layers 436 and 438, tungsten silicide formed by a chemical vapor deposition method using a $WF_6$ gas and a $SiH_4$ gas may be used. Alternatively, tungsten formed by hydrogen reduction of $WF_6$ may be used as the conductive layers 436 and 438.

Note that the conductive layers 436 are connected to the high-concentration impurity regions 420 of the n-channel transistor 450. The conductive layers 438 are connected to the high-concentration impurity regions 426 of the n-channel transistor 452.

Figure 6A:
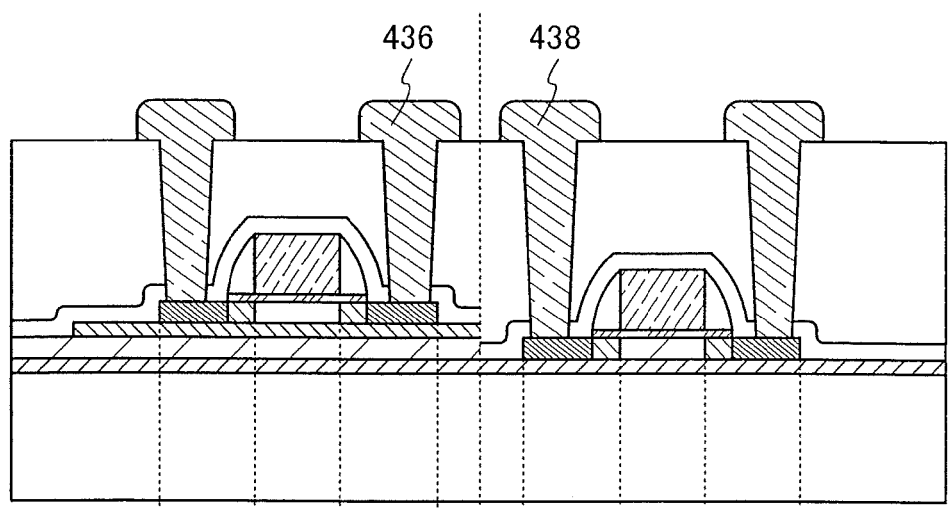
FIG. 6A and FIG. 6B are a cross-sectional view and a plane view of a semiconductor device, respectively.
Figure 6B:
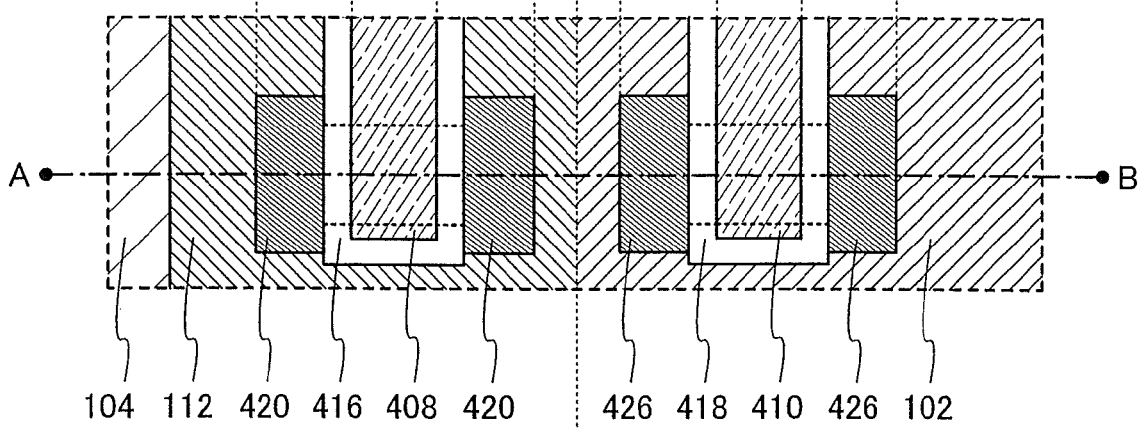

FIG. 6B illustrates a plan view of the n-channel transistor 450 and the n-channel transistor 452 which are illustrated in FIG. 6A. Here, a cross-sectional view taken along a line A-B in FIG. 6B corresponds to FIG. 6A. However, in FIG. 6B, components such as the insulating layers 432 and 434 and the conductive layers 436 and 438 are omitted for simplicity.

Note that although the case where each of the n-channel transistor 450 and the n-channel transistor 452 includes one electrode serving as the gate electrode is exemplified in this embodiment mode, the present invention is not limited to this structure. The transistor manufactured in the present invention may have a multi-gate structure in which a plurality of electrodes serving as gate electrodes are included and electrically connected to one another.

As described above, a semiconductor device having a plurality of transistors can be manufactured.

As described in this embodiment mode, a semiconductor device which utilizes characteristics of a single crystal semiconductor and a non-single-crystal semiconductor can be manufactured by using the present invention. That is, a semiconductor device in which the single crystal semiconductor layer is used for a circuit where high performance is required and the non-single-crystal semiconductor layer is used for a circuit which requires a large area can be provided.

Note that a semiconductor device having a structure which is close to that of the semiconductor device in this embodiment mode can be manufactured without using a semiconductor substrate of the present invention. For example, a method can be employed in which the single crystal semiconductor layer is formed and patterned, and then the non-single-crystal semiconductor layer is formed and patterned. Alternatively, a method can be employed in which the non-single-crystal semiconductor layer is formed and patterned, and then the single crystal semiconductor layer is formed in a region where part of the non-single-crystal semiconductor layer is removed and patterned. However, in these cases, a mask used for patterning of the single crystal semiconductor layer and a mask used for patterning of the non-single-crystal semiconductor layer need to be prepared separately, which is a disadvantage in increase in the number of steps.

In the present invention, patterning of the single crystal semiconductor layer and the non-single-crystal semiconductor layer can be performed with one mask by using the non-single-crystal semiconductor layer as a layer for bonding. Further, by using the non-single-crystal semiconductor layer as a layer for bonding, it is not necessary to provide a layer for bonding separately. Therefore, manufacturing cost of a semiconductor device can be reduced, so that cost of a semiconductor device can be reduced. Furthermore, since a semiconductor substrate in which the non-single-crystal semiconductor layer is irradiated with laser light in irradiating the single crystal semiconductor layer with laser light can be used, a large semiconductor device with excellent characteristics can be manufactured at low cost.

This embodiment mode can be implemented in combination with Embodiment Mode 1, as appropriate.

Embodiment Mode 3

In this embodiment mode, another example of a method for manufacturing a semiconductor substrate will be described with reference to FIGS. 7A to 7I and FIGS. 8A to 8C.

Figure 7D:
FIGS. 7A to 7I are views illustrating a method for manufacturing a semiconductor substrate.
Figure 7A:
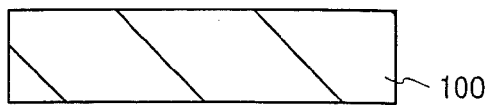

First, a base substrate 100 is prepared (see FIG. 7A). A detailed description of the base substrate 100 is omitted here because Embodiment Mode 1 can be referred to therefor.

Figure 7E:
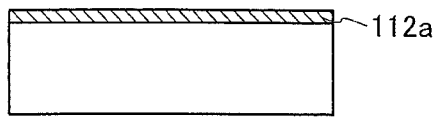
Figure 7B:
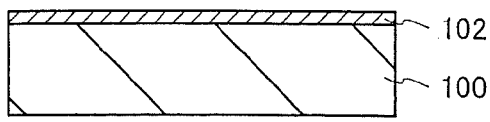

Next, an insulating layer 102 is formed over a surface of the base substrate 100 (see FIG. 7B). The insulating layer 102 may have a single layer structure or a stacked layer structure. Embodiment Mode 1 can be referred to for a detailed description of a material or the like for the insulating layer 102. It is possible to employ a structure in which the insulating layer 102 is not formed; however, when a substrate including an impurity which decreases the reliability of a semiconductor device, such as alkali metal or alkaline earth metal, is used as the base substrate 100, the insulating layer 102 is preferably provided so that such an impurity contained in the base substrate 100 is not diffused into a semiconductor layer. Silicon nitride, silicon nitride oxide, aluminum nitride, aluminum nitride oxide, or the like is particularly suitable for such an application as preventing the impurity diffusion.

Figure 7F:
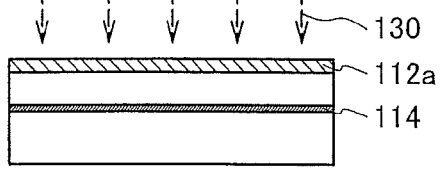
Figure 7C:
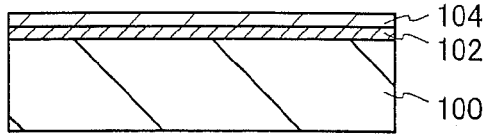

After that, a non-single-crystal semiconductor layer 104 is formed over a surface of the insulating layer 102 (see FIG. 7C). Embodiment Mode 1 can be referred to for a detailed description of the non-single-crystal semiconductor layer 104 as well.

The non-single-crystal semiconductor layer 104 serves as an active layer of a semiconductor element and a layer for bonding (a layer which is to form a bond or a layer for attachment) as well. In order to make the non-single-crystal semiconductor layer 104 serve as a layer for bonding, it is necessary to form the non-single-crystal semiconductor layer 104 of which surface planarity is sufficiently high. Amorphous silicon formed by a CVD method is suitable for a layer for bonding due to its high surface planarity.

Next, a single crystal semiconductor substrate 110 is prepared (see FIG. 7D). A single crystal semiconductor layer formed by thinning the single crystal semiconductor substrate 110 is bonded to the base substrate 100, whereby a semiconductor substrate is manufactured. Embodiment Mode 1 can be referred to for a detailed description of the single crystal semiconductor substrate 110.

Note that in this embodiment mode, a structure is employed in which the base substrate 100 is processed, and then the single crystal semiconductor substrate 110 is processed for convenience of the description, but the present invention is not interpreted as being limited to the order. In other words, a structure may be employed in which the single crystal semiconductor substrate 110 is processed, and then the base substrate 100 is processed, or a structure may also be employed in which the base substrate 100 and the single crystal semiconductor substrate 110 are processed in parallel.

After the single crystal semiconductor substrate 110 is cleaned, an insulating layer 112a is formed over a surface of the single crystal semiconductor substrate 110 (see FIG. 7E). The insulating layer 112a can have a single layer structure or a multilayer structure including two or more layers. The thickness of the insulating layer 112a is preferably greater than or equal to 10 nm and less than or equal to 400 nm.

There is no particular limitation on a material of the insulating layer 112a. For example, an insulating material containing silicon or germanium as its composition, such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as an aluminum oxynitride; or a metal nitride oxide such as an aluminum nitride oxide may also be used. The insulating layer 112a can be formed by a CVD method, a sputtering method, a method using oxidation (or nitridation) of the single crystal semiconductor substrate 110, or the like.

Next, the single crystal semiconductor substrate 110 is irradiated with an ion beam 130 including ions accelerated by an electric field through the insulating layer 112a, so that a damaged region 114 is formed in a region at a predetermined depth from the surface of the single crystal semiconductor substrate 110 (see FIG. 7F). By forming the insulating layer 112a before irradiation with the ion beam 130, the single crystal semiconductor substrate 110 can be prevented from being contaminated in the ion irradiation and from being damaged by impact of ions in the irradiation. The depth of a region where the damaged region 114 is formed can be controlled by acceleration energy and incident angle of the ion beam 130. The damaged region 114 is formed in a region at a depth the same or substantially the same as the average depth at which the ions have entered.

The thickness of the single crystal semiconductor layer which is separated from the single crystal semiconductor substrate 110 is determined depending on the depth at which the damaged region 114 is formed. The depth at which the damaged region 114 is formed is greater than or equal to 50 nm and less than or equal to 500 nm, preferably greater than or equal to 50 nm and less than or equal to 200 nm, from the surface of the single crystal semiconductor substrate 110.

In irradiating the single crystal semiconductor substrate 110 with ions, an ion implantation apparatus or an ion doping apparatus can be used. Embodiment Mode 1 can be referred to for the detailed description about such an apparatus.

Figure 7G:
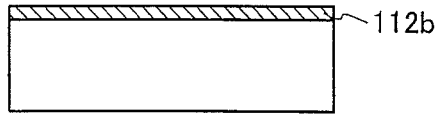

Next, the insulating layer 112a is removed and an insulating layer 112b is newly formed (see FIG. 7G). This is done because the insulating layer 112a is likely to be damaged in the ion irradiation. The newly formed insulating layer 112b can be formed using a material similar to that of the insulating layer 112a. Since the insulating layer 112b is a layer for bonding, the insulating layer 112b is preferably an insulating layer having high surface planarity.

Figure 7H:
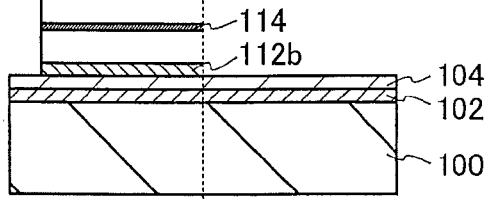

The single crystal semiconductor substrate 110 is bonded to part of the base substrate 100 on which the above-described treatment is performed (see FIG. 7H). Specifically, the base substrate 100 over which the non-single-crystal semiconductor layer 104 is formed and the single crystal semiconductor substrate 110 over which the insulating layer 112b is formed are cleaned by ultrasonic cleaning or the like. After that, part of the non-single-crystal semiconductor layer 104 and the insulating layer 112b are disposed in close contact with each other. In this manner, the non-single-crystal semiconductor layer 104 and the insulating layer 112b are bonded to each other. Note that as a mechanism of the bond, a mechanism involving van der Waals forces, a mechanism involving hydrogen bonding, or the like are given.

In this manner, by using the non-single-crystal semiconductor layer 104 as a layer for bonding, the non-single-crystal semiconductor layer 104 and the insulating layer 112b can be bonded to each other at normal temperature. Accordingly, as the base substrate 100, a substrate with low heat resistance, such as a glass substrate, can be used. Note that it is preferable to use silicon oxide which is formed by a plasma CVD method using organosilane is used as a bonding portion of the insulating layer 112b because the bond can be formed more favorably. Embodiment Mode 1 can be referred to for treatment in bonding or the like.

Figure 7I:
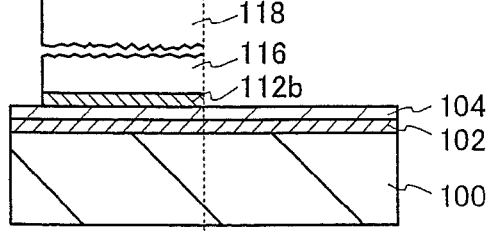

Next, the single crystal semiconductor substrate 110 is separated into a single crystal semiconductor layer 116 and a single crystal semiconductor substrate 118 (see FIG. 7I). The single crystal semiconductor substrate 110 is separated by heating the single crystal semiconductor substrate 110 after the non-single-crystal semiconductor layer 104 and the insulating layer 112b are bonded to each other. In this case as well, Embodiment Mode 1 can be referred to.

Figure 8A:
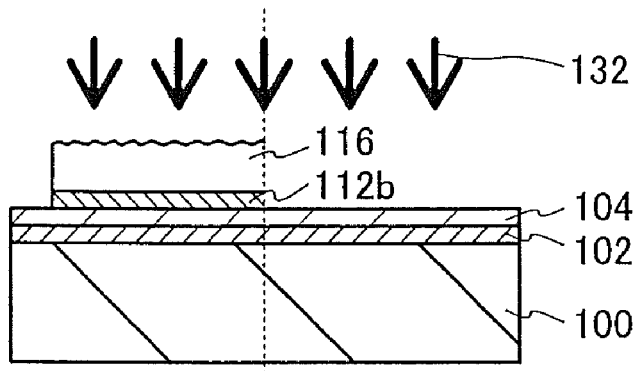
FIGS. 8A to 8C are views illustrating a method for manufacturing a semiconductor substrate.
Figure 8B:
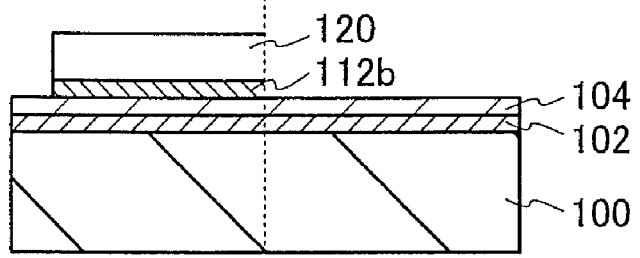
Figure 8C:
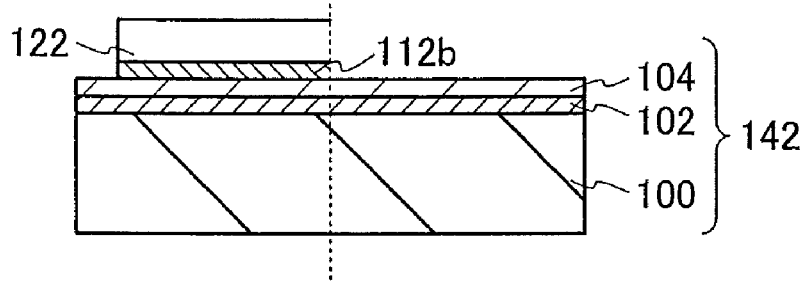

Next, the single crystal semiconductor layer 116 is irradiated with laser light 132 (see FIG. 8A). An upper surface of the single crystal semiconductor layer 116 is irradiated with the laser light 132 to be melted. After melting the upper surface of the single crystal semiconductor layer 116, the single crystal semiconductor layer 116 is cooled down and solidified, whereby a single crystal semiconductor layer 120 of which upper surface planarity is improved can be obtained (see FIG. 8B). In this embodiment mode, since the single crystal semiconductor layer 116 is melted by irradiation with the laser light 132, it is not necessary to heat the base substrate 100 separately and temperature rise of the base substrate 100 can be suppressed. Thus, a substrate having low heat resistance such as a glass substrate can be used as the base substrate 100. Embodiment Mode 1 can be referred to for other details.

After the irradiation with the laser light 132 is performed as described above, a step of thinning the single crystal semiconductor layer 120 may be performed. In order to thin the single crystal semiconductor layer 120 (etch back treatment), one of dry etching and wet etching or a combination of both of the etchings may be employed. Thus, a semiconductor substrate 142 having a thin single crystal semiconductor layer 122 over part of the non-single-crystal semiconductor layer 104 can be manufactured (see FIG. 8C).

Note that in this embodiment mode, an example is described in which etching treatment is performed after planarizing the surface by irradiation with the laser light; however, the present invention should not be construed as being limited thereto. For example, etching treatment may be performed before irradiation with the laser light. In this case, by the etching treatment, the unevenness or the defects of the surface of the semiconductor layer can be reduced to some extent. Alternatively, the etching treatment may be performed before and after irradiation with the laser light. Further alternatively, the laser irradiation and the etching treatment may be alternately repeated. By using the laser irradiation and the etching treatment (etch back treatment) in combination as just described, unevenness, defects, and the like of the surface of the semiconductor layer can be significantly reduced.

Further, after irradiation with the laser light 132, heat treatment may be performed at a temperature of lower than or equal to the upper temperature limit of the base substrate 100. Thus, the effect caused by irradiation with the laser light 132 is promoted, so that the defects can be removed efficiently and the planarity can be improved. Needless to say, it is not necessary that the above-described etching treatment, heat treatment, or the like is always performed. The planarity can be improved by CMP in addition to or instead of the above-described etching treatment or heat treatment.

This embodiment mode can be implemented in combination with Embodiment Mode 1 or 2, as appropriate.

Embodiment Mode 4

In this embodiment mode, another example of a method for manufacturing a semiconductor substrate will be described with reference to FIGS. 9A to 9G and FIGS. 10A to 10C. Note that the steps up to and including formation of an insulating layer 102 and a non-single-crystal semiconductor layer 104 over the base substrate 100 can be performed similar to the steps described in Embodiment Mode 1 or 3; therefore, the detailed description is omitted (see FIGS. 9A to 9C).

Next, a single crystal semiconductor substrate 110 is prepared (see FIG. 9D) and irradiated with an ion beam 130 to form a damaged region 114 (see FIG. 9E). The depth of a region where the damaged region 114 is formed can be controlled by acceleration energy and incident angle of the ion beam 130. The damaged region 114 is formed in a region at a depth the same or substantially the same as the average depth at which the ions have entered.

The thickness of the single crystal semiconductor layer which is separated from the single crystal semiconductor substrate 110 is determined depending on the depth at which the damaged region 114 is formed. The depth at which the damaged region 114 is formed is greater than or equal to 50 nm and less than or equal to 500 nm, preferably greater than or equal to 50 nm and less than or equal to 200 nm, from a surface of the single crystal semiconductor substrate 110.

In irradiating the single crystal semiconductor substrate 110 with ions, an ion implantation apparatus or an ion doping apparatus can be used. Embodiment Mode 1 can be referred to for the detailed description about such an apparatus.

After that, the single crystal semiconductor substrate 110 is bonded to part of the base substrate 100 on which the above treatment is performed (see FIG. 9F). Specifically, a surface of the non-single-crystal semiconductor layer 104 which is formed over the base substrate 100 and a surface of the single crystal semiconductor substrate 110 are washed by a method such as ultrasonic cleaning. After that, part of the non-single-crystal semiconductor layer 104 and the single crystal semiconductor substrate 110 are disposed in close contact with each other. In this manner, the non-single-crystal semiconductor layer 104 and the single crystal semiconductor substrate 110 are bonded to each other. Note that, as a mechanism of the bond, mechanism involving van der Waals' force, mechanism involving hydrogen bonding, or the like is given.

By using the non-single-crystal semiconductor layer 104 as a layer for bonding in this manner, the non-single-crystal semiconductor layer 104 and the single crystal semiconductor substrate 110 can be bonded to each other at room temperature. Accordingly, a substrate with low heat resistance, such as a glass substrate, can be used as the base substrate 100. Note that in this embodiment mode, an insulating layer is not provided over the single crystal semiconductor substrate 110, which leads to reduction in manufacturing cost of a semiconductor substrate as compared to a case of providing an insulating layer. Embodiment Mode 1 may be referred to for treatment or the like in bonding.

Next, the single crystal semiconductor substrate 110 is separated into a single crystal semiconductor layer 116 and a single crystal semiconductor substrate 118 (see FIG. 9G). The single crystal semiconductor substrate 110 is separated by heating the single crystal semiconductor substrate 110 after the non-single-crystal semiconductor layer 104 and the single crystal semiconductor substrate 110 are bonded to each other. In this case as well, Embodiment Mode 1 can be referred to.

Figure 10A:
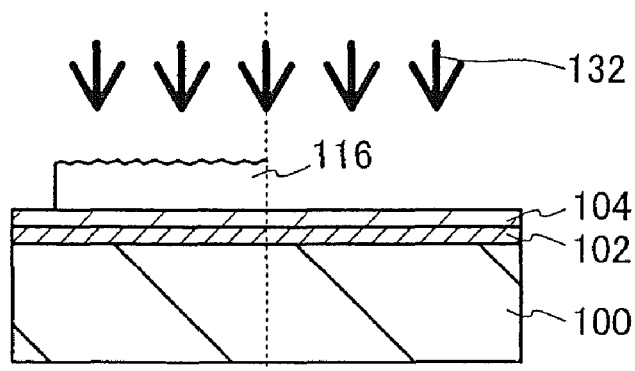
FIGS. 10A to 10C are views illustrating a method for manufacturing a semiconductor substrate.
Figure 10B:
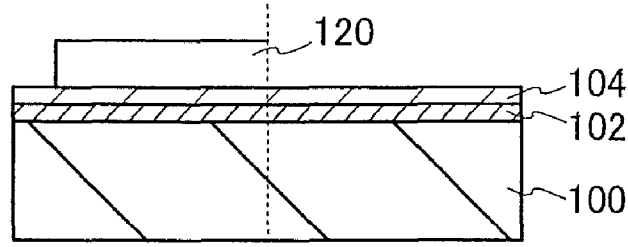
Figure 10C:
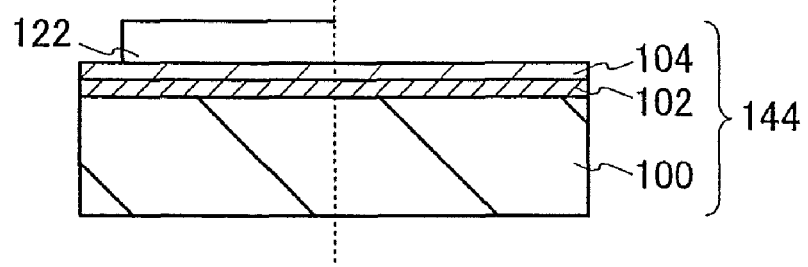

Next, the single crystal semiconductor layer 116 is irradiated with laser light 132 (see FIG. 10A). An upper surface of the single crystal semiconductor layer 116 is irradiated with the laser light 132 to be melted. After melting the upper surface of the single crystal semiconductor layer 116, the single crystal semiconductor layer 116 is cooled down and solidified, whereby a single crystal semiconductor layer 120 of which upper surface planarity is improved can be obtained (see FIG. 10B). In this embodiment mode, since irradiation with the laser light 132 is performed, it is not necessary to heat the base substrate 100 and temperature rise of the base substrate 100 can be suppressed. Accordingly, a substrate having low heat resistance, such as a glass substrate, can be used as the base substrate 100. Embodiment Mode 1 can be referred to for the other details.

After the irradiation with the laser light 132 is performed as described above, a step of thinning the single crystal semiconductor layer 120 may be performed. In order to thin the single crystal semiconductor layer 120 (etch back treatment), one of dry etching and wet etching or a combination of both of the etchings may be employed. Thus, a semiconductor substrate 144 having a thin single crystal semiconductor layer 122 over part of the non-single-crystal semiconductor layer 104 can be manufactured (see FIG. 10C).

Note that in this embodiment mode, an example is described in which etching treatment is performed after planarizing the surface by irradiation with the laser light; however, the present invention should not be construed as being limited thereto. For example, etching treatment may be performed before irradiation with the laser light. In this case, by the etching treatment, the unevenness or the defects of the surface of the semiconductor layer can be reduced to some extent. Alternatively, the etching treatment may be performed before and after irradiation with the laser light. Further alternatively, the laser irradiation and the etching treatment may be alternately repeated. By using the laser irradiation and the etching treatment (etch back treatment) in combination as just described, unevenness, defects, and the like of the surface of the semiconductor layer can be significantly reduced.

Further, after irradiation with the laser light 132, heat treatment may be performed at a temperature of lower than or equal to the upper temperature limit of the base substrate 100. Thus, the effect caused by irradiation with the laser light 132 is promoted, so that the defects can be removed efficiently and the planarity can be improved. Needless to say, it is not necessary that the above-described etching treatment, heat treatment, or the like is always performed. The planarity can be improved by CMP in addition to or instead of the above-described etching treatment or heat treatment.

This embodiment mode can be implemented in combination with Embodiment Modes 1 to 3, as appropriate.

Embodiment Mode 5

In this embodiment mode, an example of a method for manufacturing a semiconductor device of the present invention will be described with reference to FIGS. 11A to 11D, FIGS. 12A to 12C, FIGS. 13A to 13C, and FIGS. 14A and 14B. Note that a liquid crystal display device is given as an example of a semiconductor device in this embodiment mode; however, a semiconductor device of the present invention is not limited to a liquid crystal display device.

First, a semiconductor substrate having a non-single-crystal semiconductor layer and a single crystal semiconductor layer, which is manufactured by the method described in Embodiment Mode 1 or the like, is prepared (see FIG. 11A). Here, an insulating layer 1101 and a non-single-crystal semiconductor layer 1102 are formed in this order over a substrate 1100 (a base substrate) having an insulating surface, and an insulating layer 1103 and a single crystal semiconductor layer 1104 are formed in this order over part of the non-single-crystal semiconductor layer 1102; however, the present invention is not limited thereto. Embodiment Mode 1 can be referred to for the details. Note that the semiconductor substrate corresponds to the semiconductor substrate 140 of Embodiment Mode 1.

Next, the non-single-crystal semiconductor layer 1102 and the single crystal semiconductor layer 1104 are patterned to have desired shapes, thereby forming island-shaped semiconductor layers. Embodiment Mode 2 and the like can be referred to for the details. Note that as etching processing in patterning, either dry etching (plasma etching or the like) or wet etching can be used. For treating a large-area substrate, plasma etching is more suitable. As an etching gas, a fluorine-based gas or a chlorine-based gas such as $CF_4$, $NF_3$, $Cl_2$, or $BCl_3$ may be used, and an inert gas such as He or Ar may be added thereto as appropriate. Further, in the case of applying etching processing by atmospheric pressure discharge, local discharge processing can be realized, whereby etching can be performed without forming a mask layer over an entire surface of the substrate.

Island-shaped semiconductor layers may be formed to have a taper shape, or alternatively, end portions of the island-shaped semiconductor layers may be processed into a rounded shape. The island-shaped semiconductor layers are formed to have a taper shape, whereby good coverage of an insulating layer and a conductive layer to be formed later is obtained, so that disconnection of the insulating layer or the conductive layer can be prevented. Further, when the end portions of the island-shaped semiconductor layers have a rounded shape, concentration of electric field can be reduced, so that generation of malfunction of semiconductor elements can be prevented.

After the non-single-crystal semiconductor layer 1102 and the single crystal semiconductor layer 1104 are patterned, a p-type impurity such as boron, aluminum, or gallium may be added in order to control a threshold voltage. For example, as a p-type impurity, boron can be added at a concentration of greater than or equal to $5\times10^{16}$ $cm^{-3}$ and less than or equal to $1\times10^{18}$ $cm^{-3}$.

Next, a gate insulating layer 1108 which covers the island-shaped semiconductor layers is formed (see FIG. 11B). Note that for convenience, the island-shaped semiconductor layers which are formed by patterning are referred to as semiconductor layers 1110, 1112, and 1114 here. The gate insulating layer 1108 is formed of a silicon-containing insulating film by a plasma CVD method, a sputtering method, or the like, at a thickness of approximately greater than or equal to 10 nm and less than or equal to 150 nm. In specific, the gate insulating layer 1108 may be formed from a material such as an oxide material or a nitride material of silicon, which is typified by silicon nitride, silicon oxide, silicon oxynitride, and silicon nitride oxide. Note that the gate insulating layer 1108 may have a single-layer structure or a stacked-layer structure. Further, a thin silicon oxide film with a thickness of greater than or equal to 1 nm and less than or equal to 100 nm, preferably greater than or equal to 1 nm and less than or equal to 10 nm, more preferably greater than or equal to 2 nm and less than or equal to 5 nm may be formed between the semiconductor layer and the gate insulating layer. In order to form a gate insulating film having less leakage current at a low temperature, a rare gas element such as argon may be contained in a reaction gas.

Next, a first conductive film and a second conductive film, which serve as gate electrode layers, are stacked over the gate insulating layer 1108. The first conductive film may be formed at a thickness of about greater than or equal to 20 nm and less than or equal to 100 nm, and the second conductive film may be formed at a thickness of about greater than or equal to 100 nm and less than or equal to 400 nm. The first and second conductive films can be formed by a sputtering method, an evaporation method, a CVD method, or the like. The first and second conductive films may be formed of an element selected from tantalum, tungsten, titanium, molybdenum, aluminum, copper, chromium, neodymium, or the like; an alloy material or a compound material including any of those elements as its main component; or the like. Further, for the first and second conductive films, a semiconductor film typified by a polycrystalline silicon film doped with an impurity element such as phosphorus; an AgPdCu alloy; or the like may be used. Note that although a stacked-layer structure of a two-layer structure is described in this embodiment mode, the present invention is not limited thereto. Alternatively, a stacked-layer structure including three or more layers or a single-layer structure may be employed.

Then, masks 1116a, 1116b, 1116c, 1116d, and 1116e are formed from a resist material by a photolithography method. Then, the first conductive film and the second conductive film are processed into a desired shape with the use of the masks to form first gate electrode layers 1118a, 1118b, 1118c, 1118d and 1118e, and conductive layers 1120a, 1120b, 1120c, 1120d, and 1120e (see FIG. 11C).

Here, an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are regulated as appropriate, whereby etching can be performed so as to obtain a desired tapered shape. An angle and the like of the tapered shape may also be controlled by the shape of the masks. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used for the etching gas, as appropriate. In this embodiment mode, the second conductive film is etched using an etching gas containing $CF_4$, $Cl_2$, and $O_2$, and then, the first conductive film is continuously etched using an etching gas containing $CF_4$ and $Cl_2$.

Next, the conductive layers 1120a, 1120b, 1120c, 1120d, and 1120e are processed into a desired shape using the masks 1116a, 1116b, 1116c, 1116d, and 1116e. At this time, etching is performed under an etching condition in which the selectivity of the second conductive film, which forms the conductive layers, to the first conductive film, which forms the first gate electrode layers and the first conductive layer, is high. By the etching, second gate electrode layers 1122a, 1122b, 1122c, and 1122d, and a second conductive layer 1122e are formed. In this embodiment mode, each of the second gate electrode layers and the second conductive layer has a tapered shape, and a taper angle of each of the second gate electrode layers and the second conductive layer is larger than a taper angle of each of the first gate electrode layers and the first conductive layer. Here, a "taper angle" refers to an angle formed by the meeting of a bottom surface with a side surface of an object. Thus, when the taper angle is 90°, the conductive layer has a perpendicular side surface to the bottom surface. With each taper angle set to a degree of less than 90°, a film to be stacked thereover adequately covers the conductive layer; thus, defects can be reduced. Note that in this embodiment mode, $Cl_2$, $SF_6$, and $O_2$ are used as an etching gas for forming the second gate electrode layers and the second conductive layer.

Through the aforementioned processes, gate electrode layers 1124a and 1124b can be formed in a peripheral driver circuit region 1180, and gate electrode layers 1124c and 1124d and a conductive layer 1124e can be foimed in a pixel region 1182 (see FIG. 11D). Note that the masks 1116a, 1116b, 1116c, 1116d, and 1116e are removed after the aforementioned steps.

Next, an impurity element imparting n-type conductivity is added using the gate electrode layers 1124a, 1124b, 1124c, and 1124d as masks, thereby forming first n-type impurity regions 1126a, 1126b, 1128a, 1128b, 1130a, 1130b, and 1130c (see FIG. 12A). In this embodiment mode, doping is performed by using phosphine ($PH_3$) as a doping gas containing an impurity element. Here, doping is performed so that phosphorus (P) that is an impurity element imparting n-type conductivity is contained in the first n-type impurity regions at a concentration of approximately greater than or equal to $1\times10^{16}/cm^3$ and less than or equal to $5\times10^{19}/cm^3$.

Next, a mask 1132a which covers the semiconductor layer 1110 and masks 1132b and 1132c which cover part of the semiconductor layer 1114 are formed. An impurity element imparting n-type conductivity is added using the masks 1132a, 1132b, and 1132c, and the second gate electrode layer 1122b as masks. Accordingly, second n-type impurity regions 1134a and 1134b; third n-type impurity regions 1136a and 1136b; second n-type impurity regions 1140a, 1140b, and 1140c; and third n-type impurity regions 1142a, 1142b, 1142c, and 1142d are formed. In this embodiment mode, doping is performed by using phosphine ($PH_3$) as a doping gas containing an impurity element. Here, doping is performed so that phosphorus (P) that is an impurity element imparting n-type conductivity is contained in the second n-type impurity regions at a concentration of approximately greater than or equal to $1\times10^{17}/cm^3$ and less than or equal to $1\times10^{21}/cm^3$. An impurity element which imparts n-type conductivity is added to the third n-type impurity regions 1136a and 1136b so as to contain the impurity element imparting n-type conductivity at a concentration which is the same as or substantially the same as or at a slightly higher concentration than that of the third n-type impurity regions 1142a, 1142b, 1142c, and 1142d. In addition, channel formation regions 1138, 1144a, and 1144b are formed (see FIG. 12B).

Each of the second n-type impurity regions is a high-concentration impurity region and functions as a source or a drain. On the other hand, each of the third n-type impurity regions is a low-concentration impurity region and functions as a so-called LDD (lightly doped drain) region. Each of the third n-type impurity regions 1136a and 1136b is formed in a region overlapping with the first gate electrode layer 1118b. Accordingly, an electric field in the vicinity of a source or a drain can be relieved, and deterioration of on-state current due to hot carriers can be prevented. On the other hand, each of the third n-type impurity regions 1142a, 1142b, 1142c, and 1142d does not overlap with the gate electrode layer 1124c or 1124d; thus, an effect of reducing off-state current can be obtained.

Next, the masks 1132a, 1132b, and 1132c are removed, and a mask 1146a which covers the semiconductor layer 1112 and a mask 1146b which covers the semiconductor layer 1114 are formed. An impurity element imparting p-type conductivity is added using the masks 1146a and 1146b and the gate electrode layer 1124a as masks. Accordingly, first p-type impurity regions 1148a and 1148b, and second p-type impurity regions 1150a and 1150b are fowled. In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately greater than or equal to $1\times10^{18}/cm^3$ and less than or equal to $5\times10^{21}/cm^3$. Further, a channel formation region 1152 is formed (see FIG. 12C).

Each of the first p-type impurity regions is a high-concentration impurity region and functions as a source or a drain. On the other hand, each of the second p-type impurity regions is a low-concentration impurity region and functions as a so-called LDD (lightly doped drain) region.

Subsequently, the masks 1146a and 1146b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser irradiation, or the like may be performed to activate the impurity elements.

Subsequently, an interlayer insulating layer which covers the gate electrode layers and the gate insulating layer is formed. In this embodiment mode, a stacked-layer structure of insulating films 1154 and 1156 is employed (see FIG. 13A). A silicon nitride oxide film is formed as the insulating film 1154 with a thickness of 100 nm and a silicon oxynitride film is formed as the insulating film 1156 with a thickness of 900 nm. Although the two-layer structure is employed in this embodiment mode, a single-layer structure or a stacked-layer structure including three or more layers may be employed. In this embodiment mode, the insulating films 1154 and 1156 are successively formed by a plasma CVD method without being exposed to the air. Note that materials for the insulating films 1154 and 1156 are not limited to the above-described material.

The insulating films 1154 and 1156 can also be formed using a material selected from substances including silicon oxide, silicon nitride, aluminum oxide, aluminum nitride, aluminum oxynitride, aluminum nitride oxide containing more nitrogen than oxygen, diamond-like carbon (DLC), a carbon film containing nitrogen, and other substances containing an inorganic insulating material. Further, a siloxane resin may be used as well. Note that a siloxane resin is a resin containing a Si—O—Si bond. Siloxane is composed of a skeleton formed by the bond of silicon (Si) and oxygen (O). An organic group (such as an alkyl group and an aryl group) or a fluoro group may used as a substituent. A fluoro group may be included in the organic group. Alternatively, an organic insulating material such as polyimide, acrylic, polyamide, polyimide amide, benzocyclobutene, or polysilazane can be used.

Next, contact holes (openings) that reach the semiconductor layers and the gate electrode layer are formed in the insulating films 1154 and 1156 and the gate insulating layer 1108, using a mask made of a resist material. Etching may be performed once or a plurality of times depending on the selectivity of materials to be used. In this embodiment mode, first etching is performed under a condition that selectivity of the insulating film 1156 that is a silicon oxynitride film to each of the insulating film 1154 that is a silicon nitride oxide film and the gate insulating layer 1108 can be obtained; thus, the insulating film 1156 is removed. Next, the insulating film 1154 and the gate insulating layer 1108 are removed by second etching, and openings each of which reaches a source or a drain are formed.

Then, a conductive film is formed so as to cover the openings, and the conductive film is etched. Accordingly, source or drain electrode layers 1158a, 1158b, 1160a, 1160b, 1162a, and 1162b which are each electrically connected to part of a source or drain region are formed. For each source or drain electrode layer, one or a plurality of elements selected from aluminum, tantalum, titanium, molybdenum, tungsten, neodymium, chromium, nickel, platinum, gold, silver, copper, magnesium, scandium, cobalt, zinc, niobium, silicon, phosphorus, boron, arsenic, gallium, indium, and tin; a compound or an alloy material that contains any of the above-mentioned elements as its main component (for example, indium tin oxide (ITO), indium zinc oxide (IZO), indium tin oxide to which silicon oxide has been added (ITSO), zinc oxide, aluminum-neodymium (Al—Nd), magnesium-silver (Mg—Ag), or the like); a material that is a combination of any of these compounds; or the like can be used. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Through the above processes, a p-channel thin film transistor 1164 and an n-channel thin film transistor 1166 are formed in the peripheral driver circuit region 1180, and an n-channel thin film transistor 1168 and a capacitor wiring 1170 are formed in the pixel region 1182 (see FIG. 13B).

Next, an insulating film 1172 is formed as a second interlayer insulating layer. The insulating film 1172 can be formed from a material selected from silicon oxide, silicon nitride, silicon oxynitride, silicon nitride oxide, aluminum oxide, aluminum nitride, aluminum oxynitride, aluminum nitride oxide containing more nitrogen than oxygen, aluminum oxide, diamond-like carbon (DLC), carbon containing nitrogen, phosphosilicate glass (PSG), borophosphosilicate glass (BPSG), polysilazane, or other substances containing an inorganic insulating material. Further, a siloxane resin may be used as well. Alternatively, an organic insulating material such as polyimide, acrylic, polyamide, polyimide amide, or benzocyclobutene can be used.

Next, a contact hole is formed in the insulating film 1172 of the pixel region 1182 to form a pixel electrode layer 1174 (see FIG. 13C). The pixel electrode layer 1174 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition including a conductive high molecule (also referred to as a conductive polymer) can be used for the pixel electrode layer 1174. A thin film of a conductive composition preferably has a sheet resistance of less than or equal to 10000 Ω/sq. When a thin film of a conductive composition is formed as a pixel electrode layer having a light-transmitting property, light transmittance is preferably greater than or equal to 70% at a wavelength of 550 nm. In addition, the resistance of the conductive high molecule which is contained in the conductive composition is preferably less than or equal to 0.1 Ω·cm.

As the conductive high molecule, a so-called 3 electron conjugated conductive high molecule can be used. For example, polyaniline and a derivative thereof, polypyrrole and a derivative thereof, polythiophene and a derivative thereof, a copolymer of those materials, and the like can be given.

Specific examples of the conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above conductive high molecule may be used alone, or an organic resin may be added thereto in order to adjust the characteristics of the films.

Furthermore, by doping a conductive composition with an acceptor type dopant or a donor type dopant, an oxidation-reduction potential of a conjugated electron of a conjugated conductive high molecule may be changed, whereby electrical conductivity may be adjusted.

The conductive composition as described above is dissolved in water or an organic solvent (e.g., an alcohol-based solvent, a ketone-based solvent, an ester-based solvent, a hydrocarbon-based solvent, or an aromatic-based solvent), so that a thin film which serves as the pixel electrode layer 1174 can be formed by an application method, a coating method, a droplet discharge method (also referred to as an ink-jet method), a printing method, or the like.

Figure 14A:
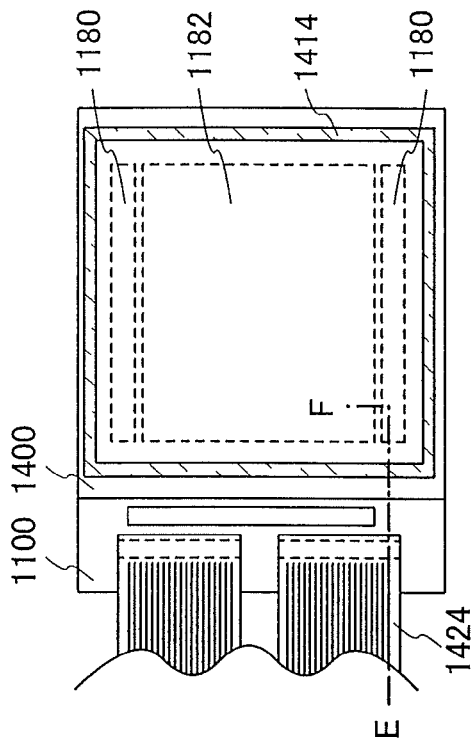
FIG. 14A and FIG. 14B are a plane view and a cross-sectional view of a semiconductor device, respectively.
Figure 14B:
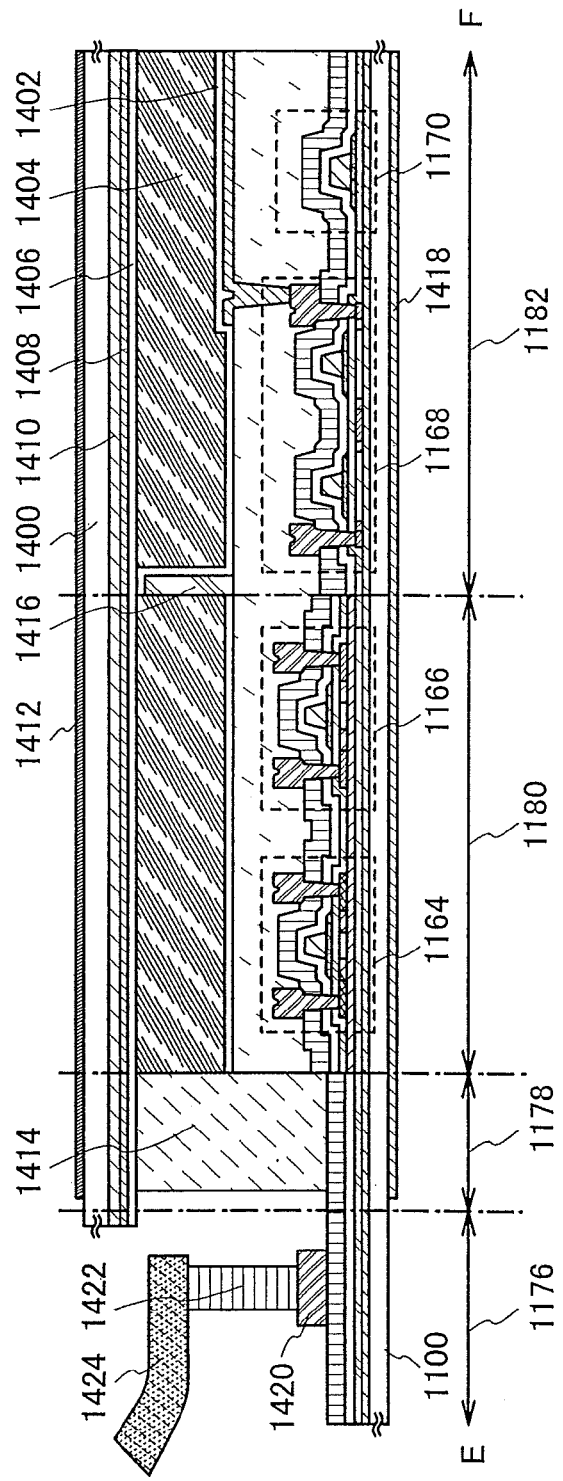

Subsequently, an insulating layer 1402 referred to as an alignment film is formed to cover the pixel electrode layer 1174 and the insulating film 1172 (see FIG. 14B). The insulating layer 1402 can be formed by a screen printing method or an offset printing method. Note that FIGS. 14A and 14B illustrate a plan view and a cross-sectional view of a semiconductor device, respectively. FIG. 14A is a plan view of a semiconductor device, and FIG. 14B is a cross-sectional view taken along line C-D of FIG. 14A. The semiconductor device includes an external terminal connection region 1176, a sealing region 1178, the peripheral driver circuit region 1180, and the pixel region 1182.

After forming the insulating layer 1402, rubbing treatment is performed. An insulating layer 1406 which serves as an alignment film can be formed in a manner similar to the insulating layer 1402.

Then, a counter substrate 1400 is attached to the substrate 1100 having the insulating surface with a sealing material 1414 and a spacer 1416 interposed therebetween, and a liquid crystal layer 1404 is provided in a gap therebetween. Note that the counter substrate 1400 is provided with the insulating layer 1406 which serves as an alignment film, a conductive layer 1408 which serves as a counter electrode, a coloring layer 1410 which serves as a color filter, a polarizer 1412 (also referred to as a polarizing plate), or the like. Note that although the substrate 1100 having the insulating surface is provided with a polarizer 1418 (a polarizing plate), the present invention is not limited thereto. For example, a polarizer may be provided on one side in a reflective type liquid crystal display device.

Subsequently, an FPC 1424 is connected to a terminal electrode layer 1420 that is electrically connected to the pixel region, with an anisotropic conductive layer 1422 interposed therebetween. The FPC 1424 has a function of transmitting a signal from the external. The liquid crystal display device can be manufactured by the above-described process.

In this embodiment mode, a liquid crystal display device is manufactured using the semiconductor substrate manufactured by the method described in Embodiment Mode 1. Therefore, a semiconductor element of a pixel region can be formed using a non-single-crystal semiconductor layer and a semiconductor element of a driver circuit region can be formed using a single crystal semiconductor layer. Thus, a liquid crystal display device having a large-area display region and an excellent driver circuit can be provided. Further, since the liquid crystal display device is a device where a driver circuit is integrated, reduction in thickness of the display device, a reduction in area of a frame region thereof or the like can be realized. Furthermore, since a pixel region can be formed using the non-single-crystal semiconductor layer, the display device can be made larger very easily. Furthermore, since it is not necessary to provide a layer for bonding separately, manufacturing cost of a display device can be reduced.

In the semiconductor substrate described in Embodiment Mode 1, characteristics of the non-single-crystal semiconductor layer and the single crystal semiconductor layer can be improved at one time by laser irradiation. Thus, a step of microcrystallizing or polycrystallizing the non-single-crystal semiconductor layer and a step of reducing defects of the single crystal semiconductor layer and improving planarity thereof can be performed at one time; therefore, increase in the number of steps can be suppressed, so that manufacturing cost of a semiconductor substrate can be reduced. That is, a high performance display device can be manufactured at low cost.

Note that a method for manufacturing a liquid crystal display device is described in this embodiment mode; however, the present invention is not limited to this. This embodiment mode can be combined with any of Embodiment Modes 1 to 4 as appropriate.

Embodiment Mode 6

In this embodiment mode, a semiconductor device having a light-emitting element related to the present invention (an electroluminescence display device) will be described. Note that as to a method for manufacturing transistors which are used for a peripheral circuit region, a pixel region, and the like, it is possible to refer to Embodiment Mode 5; thus, the details are omitted.

As to a semiconductor device having a light-emitting element, any one of bottom emission, top emission, and dual emission can be employed. In this embodiment mode, a semiconductor device employing bottom emission will be described with reference to FIGS. 15A and 15B; however, the present invention is not limited thereto.

Figure 15A:
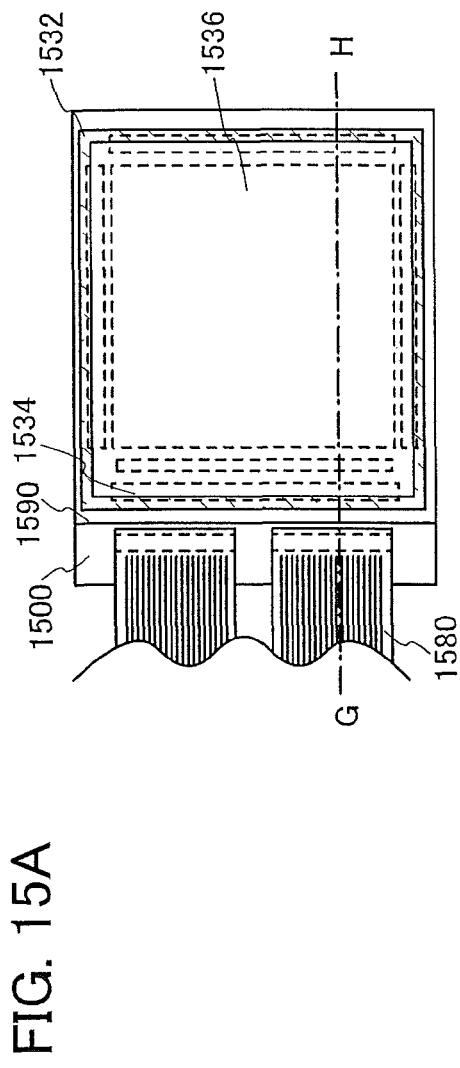
FIG. 15A and FIG. 15B are a plane view and a cross-sectional view of a semiconductor device, respectively.
Figure 15B:
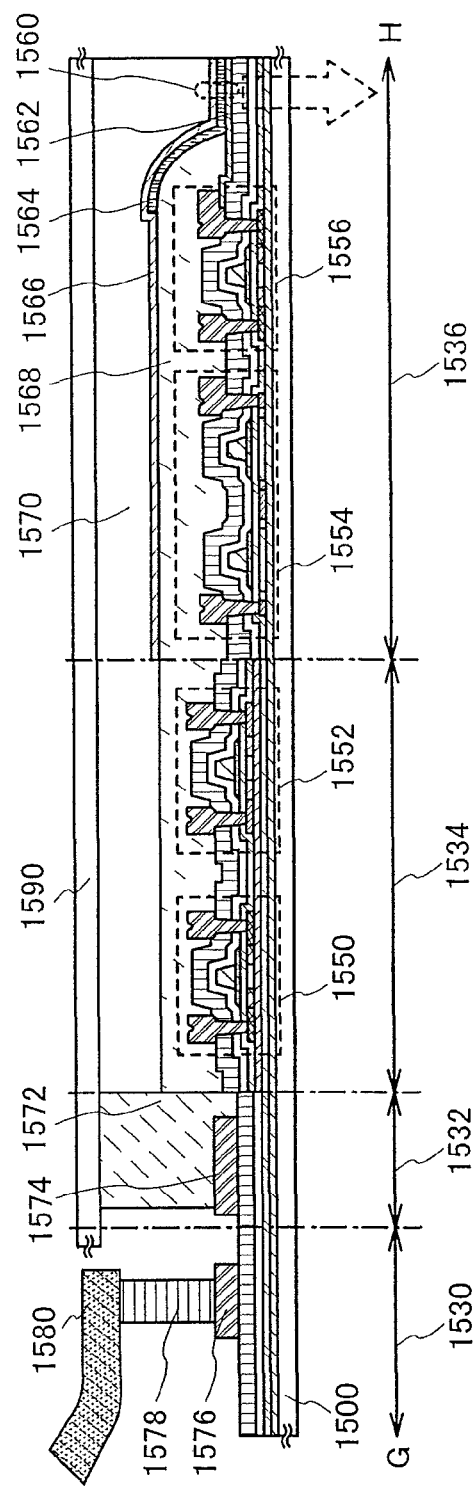

In a semiconductor device illustrated in FIGS. 15A and 15B, light is emitted downwardly (in a direction indicated by an arrow). Here, FIG. 15A is a plan view of the semiconductor device, and FIG. 15B is a cross-sectional view taken along line G-H of FIG. 15A. In FIGS. 15A and 15B, the semiconductor device includes an external terminal connection region 1530, a sealing region 1532, a driver circuit region 1534, and a pixel region 1536.

The semiconductor device illustrated in FIGS. 15A and 15B includes an element substrate 1500, thin film transistors 1550, 1552, 1554, and 1556, a light-emitting element 1560, an insulating layer 1568, a filler 1570, a sealant 1572, a wiring layer 1574, a terminal electrode layer 1576, an anisotropic conductive layer 1578, an FPC 1580, a sealing substrate 1590, and the like. Note that the light-emitting element 1560 includes a first electrode layer 1562, a light-emitting layer 1564, and a second electrode layer 1566.

As the first electrode layer 1562, a light-transmitting conductive material is used so that light emitted from the light-emitting layer 1564 can be transmitted. On the other hand, as the second electrode layer 1566, a conductive material which can reflect light emitted from the light-emitting layer 1564 is used.

As the first electrode layer 1562, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide to which silicon oxide is added (ITSO), or the like may also be used.

A conductive composition containing a conductive high molecule (also referred to as a conductive polymer) can also be used as the first electrode layer 1562. Note that as to the details, it is possible to refer to Embodiment Mode 2; thus, the descriptions are omitted.

As the second electrode layer 1566, a conductive film formed of titanium, tungsten, nickel, gold, platinum, silver, copper, tantalum, molybdenum, aluminum, magnesium, calcium, lithium, or an alloy thereof may be used. A substance having high reflectivity in a visible region is preferable, and an aluminum film is used in this embodiment mode.

Note that in the case of employing each of top emission and dual emission, the design of the electrode layers may be changed, as appropriate. Specifically, in the case of top emission, the first electrode layer 1562 is formed using a reflective material, and the second electrode layer 1566 is formed using a light-transmitting material. In the case of dual emission, the first electrode layer 1562 and the second electrode layer 1566 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted.

Note that even a material like metal which is generally considered to have no light-transmitting property can transmit light when it has a small thickness (approximately greater than or equal to 5 nm and less than or equal to 30 nm). Accordingly, an electrode layer which transmits light can also be formed using the above-described light-reflecting material.

In the case of employing top emission or dual emission, the sealing substrate 1590 may be provided with a color filter (a coloring layer). The color filter (a coloring layer) can be formed by an evaporation method or a droplet discharge method. Alternatively, a color conversion layer may be used.

In this embodiment mode, an electroluminescence display device is manufactured using the semiconductor substrate manufactured by the method described in Embodiment Mode 1. Therefore, a semiconductor element of a pixel region can be formed using a non-single-crystal semiconductor layer and a semiconductor element of a driver circuit region can be formed using a single crystal semiconductor layer. Thus, an electroluminescence display device having a large-area display region and an excellent driver circuit can be provided. Further, since the electroluminescence display device is a device where a driver circuit is integrated, reduction in thickness of the display device, a reduction in area of a frame region thereof or the like can be realized. Furthermore, since a pixel region can be formed using the non-single-crystal semiconductor layer, the display device can be made larger very easily. Furthermore, since it is not necessary to provide a layer for bonding separately, manufacturing cost of a display device can be reduced.

In the semiconductor substrate described in Embodiment Mode 1, characteristics of the non-single-crystal semiconductor layer and the single crystal semiconductor layer can be improved at one time by laser irradiation. Thus, a step of microcrystallizing or polycrystallizing the non-single-crystal semiconductor layer and a step of reducing defects of the single crystal semiconductor layer and improving planarity thereof can be performed at one time; therefore, increase in the number of steps can be suppressed, so that manufacturing cost of a semiconductor substrate can be reduced. That is, a high performance display device can be manufactured at low cost.

Note that this embodiment mode is described using an electroluminescence display device; however, the present invention is not limited thereto. This embodiment mode can be implemented by being combined with any of Embodiment Modes 1 to 5, as appropriate.

Embodiment Mode 7

In this embodiment mode, another example of a semiconductor device of the present invention will be described with reference to FIGS. 16 and 17. Note that a microprocessor and an electronic tag are given as examples in this embodiment mode; however, the semiconductor device of the present invention is not limited thereto.

Figure 16:
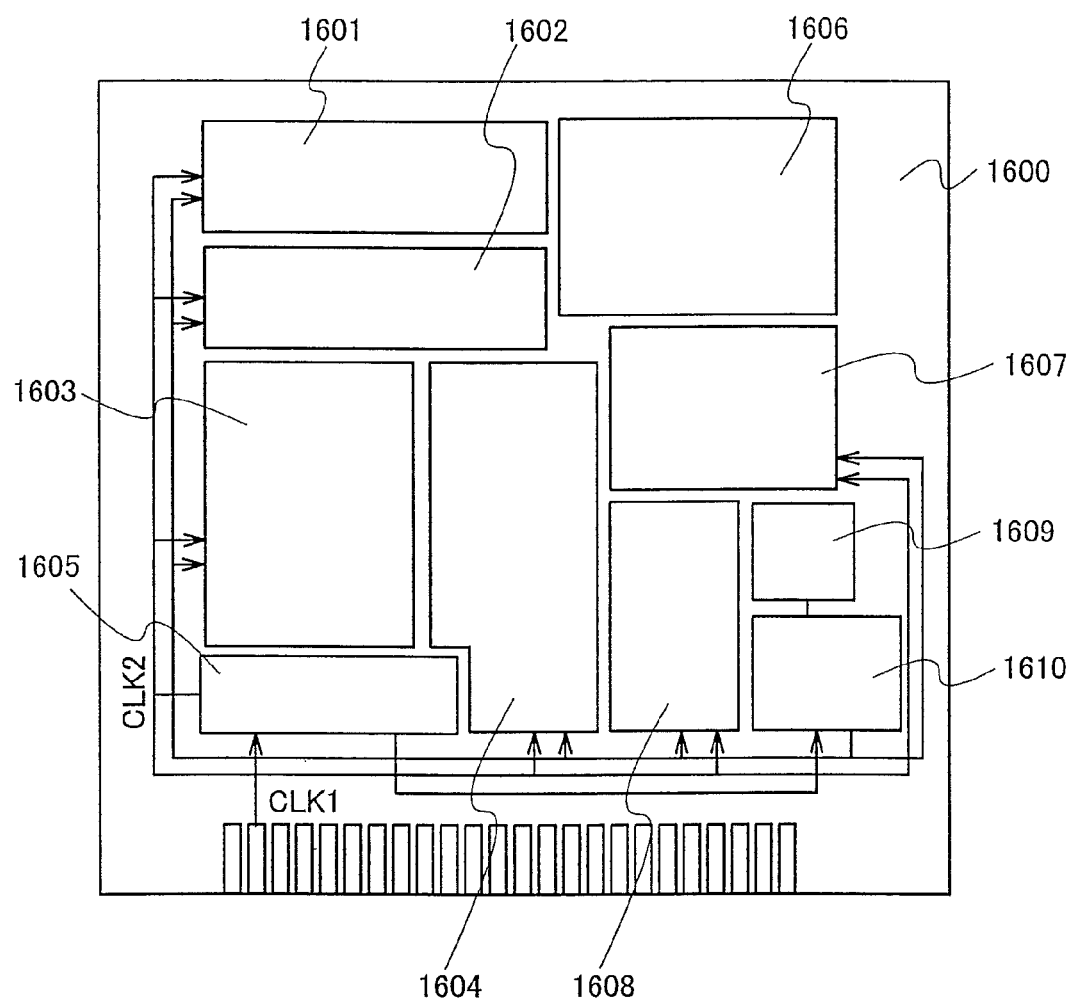
FIG. 16 is a view illustrating a structure of a semiconductor device.
Figure 17:
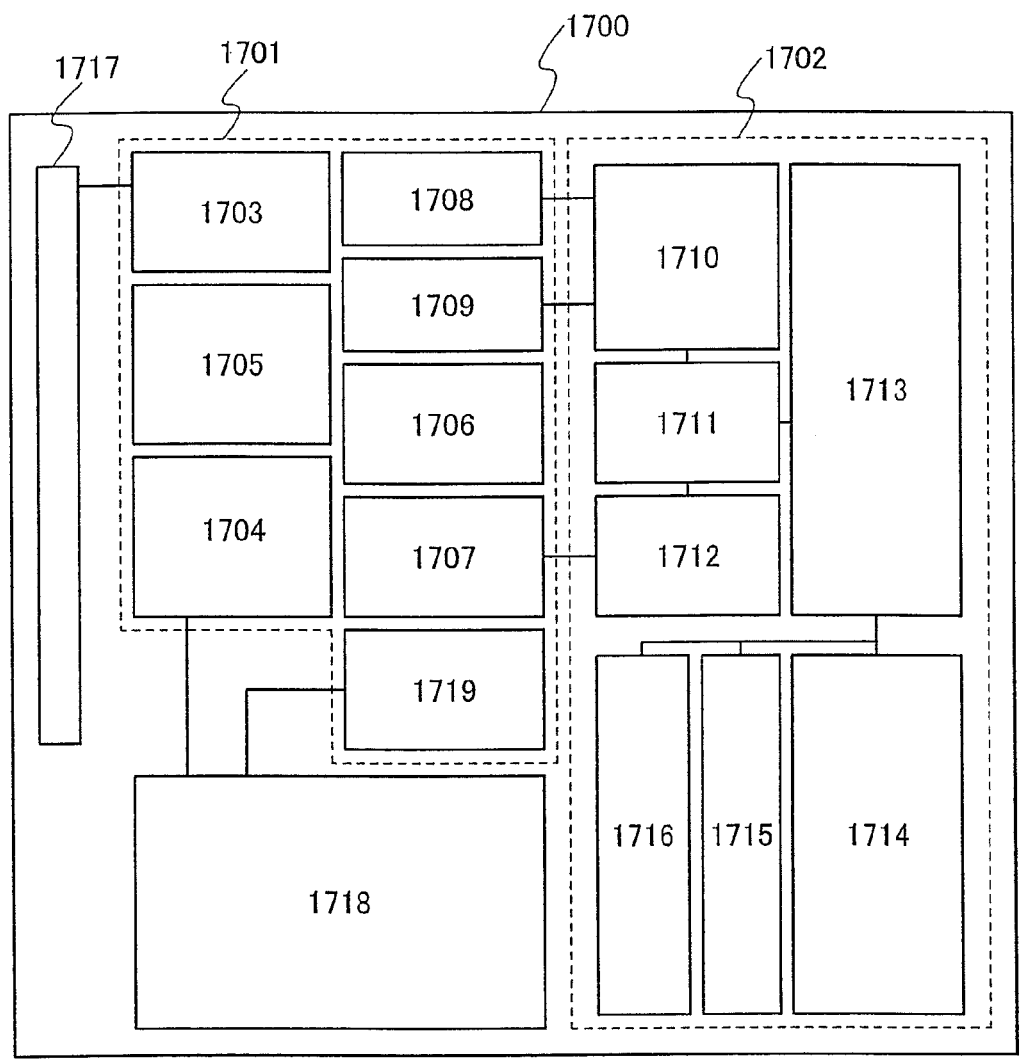
FIG. 17 is a view illustrating a structure of a semiconductor device.

FIG. 16 illustrates an example of a microprocessor of the present invention. A microprocessor 1600 in FIG. 16 is manufactured using the semiconductor substrate of the present invention. This microprocessor 1600 has an arithmetic logic unit (ALU) 1601, an ALU controller 1602, an instruction decoder 1603, an interrupt controller 1604, a timing controller 1605, a register 1606, a register controller 1607, a bus interface (Bus I/F) 1608, a read-only memory (ROM) 1609, and a ROM interface (ROM I/F) 1610.

An instruction input to the microprocessor 1600 through the bus interface 1608 is input to the instruction decoder 1603, decoded therein, and then input to the ALU controller 1602, the interrupt controller 1604, the register controller 1607, and the timing controller 1605. The ALU controller 1602, the interrupt controller 1604, the register controller 1607, and the timing controller 1605 conduct various controls based on the decoded instruction. In specific, the ALU controller 1602 generates signals for controlling the operation of the ALU 1601. While the microprocessor 1600 is executing a program, the interrupt controller 1604 processes an interrupt request from an external input/output device or a peripheral circuit based on its priority or the like. The register controller 1607 generates an address of the register 1606, and reads and writes data from and to the register 1606 in accordance with the state of the microprocessor 1600. The timing controller 1605 generates signals for controlling timing of operation of the ALU 1601, the ALU controller 1602, the instruction decoder 1603, the interrupt controller 1604, and the register controller 1607. For example, the timing controller 1605 is provided with an internal clock generator for generating an internal clock signal CLK2 based on a reference clock signal CLK1, and supplies the internal clock signal CLK2 to the above-mentioned various circuits. Note that the structure of the microprocessor 1600 illustrated in FIG. 16 is merely an example, and can be changed as appropriate depending on the uses.

In this embodiment mode, a microprocessor is manufactured using a semiconductor substrate described in Embodiment Mode 1 and the like. Accordingly, a single crystal semiconductor layer can be used only for a region which requires high speed operation. Therefore, manufacturing cost of a semiconductor device can be reduced and a high performance semiconductor device can be provided. Further, the microprocessor can be formed so as to be integrated with the display device.

Next, an example of a semiconductor device having an arithmetic function and capable of contactless data transmission and reception is described with reference to FIG. 17. FIG. 17 illustrates an example of a wireless tag which transmits and receives signals to/from an external device by wireless communication. Note that the wireless tag of the present invention includes a central processing unit (CPU), so to speak, a miniaturized computer. A wireless tag 1700 has an analog circuit portion 1701 and a digital circuit portion 1702. The analog circuit portion 1701 has a resonance circuit 1703 with a resonance capacitor, a rectifier circuit 1704, a constant voltage circuit 1705, a reset circuit 1706, an oscillator circuit 1707, a demodulator circuit 1708 and a modulator circuit 1709. The digital circuit portion 1702 has an RF interface 1710, a control register 1711, a clock controller 1712, a CPU interface 1713, a CPU 1714, a RAM 1715, and a ROM 1716.

The operation of the wireless tag 1700 having such a structure is described below. When an antenna 1717 receives a signal from outside, an induced electromotive force is generated in the resonance circuit 1703 based on the signal. A capacitor portion 1718 is charged with the induced electromotive force which has passed through the rectifier circuit 1704. This capacitor portion 1718 is preferably formed using a capacitor such as a ceramic capacitor or an electric double layer capacitor, or the like. The capacitor portion 1718 may be formed over the same substrate as the wireless tag 1700 or may be attached as another component to a substrate having an insulating surface that partially constitutes the wireless tag 1700.

The reset circuit 1706 generates a signal for resetting and initializing the digital circuit portion 1702. For example, a signal that rises after an increase in power supply voltage is generated as the reset signal. The oscillator circuit 1707 changes the frequency and duty ratio of a clock signal in response to a control signal generated by the constant voltage circuit 1705. The demodulator circuit 1708 having a low pass filter binarizes changes in amplitude of an amplitude-modulated (ASK) reception signals, for example. The modulator circuit 1709 varies the amplitude of an amplitude-modulated (ASK) transmission signal and transmits the signal. The modulator circuit 1709 varies the resonance point of the resonance circuit 1703, thereby varying the amplitude of communication signals. The clock controller 1712 generates a control signal for changing the frequency and duty ratio of a clock signal in accordance with the power supply voltage or a consumption current of the CPU 1714. The power supply voltage is monitored by the power management circuit 1719.

A signal that is input to the wireless tag 1700 from the antenna 1717 is demodulated by the demodulator circuit 1708, and then divided into a control command, data, and the like by the RF interface 1710. The control command is stored in the control register 1711. The control command includes a reading instruction of data stored in the ROM 1716, a writing instruction of data to the RAM 1715, an arithmetic instruction to CPU 1714, and the like. The CPU 1714 accesses the ROM 1716, the RAM 1715, and the control register 1711 via the CPU interface 1713. The CPU interface 1713 has a function to generate an access signal for any one of the ROM 1716, the RAM 1715, and the control register 1711 based on an address requested by the CPU 1714.

As an arithmetic method of the CPU 1714, a method may be employed in which the ROM 1716 stores an operating system (OS) and a program is read and executed at the time of starting operation. Alternatively, a method may be employed in which an arithmetic circuit is formed and an arithmetic process is conducted using hardware. In a method in which both hardware and software are used, a method can be employed in which the circuit dedicated to arithmetic conducts part of process and the CPU 1714 conducts the other part of the arithmetic process by using a program.

In this embodiment mode, a wireless tag is manufactured using a semiconductor substrate described in Embodiment Mode 1. Accordingly, a single crystal semiconductor layer can be used only for a region which requires high speed operation. Therefore, manufacturing cost of a semiconductor device can be reduced and a high performance semiconductor device can be provided. Further, the wireless tag can be formed so as to be integrated with the display device.

Note that this embodiment mode can be implemented by being combined with any of Embodiment Modes 1 to 6, as appropriate.

Embodiment Mode 8

In this embodiment mode describes an electronic device using a semiconductor device of the present invention, particularly using a display device will be described with reference to FIGS. 18A to 18H and FIGS. 19A to 19C.

As electronic devices manufactured using the semiconductor device (particularly, display device) of the present invention, the following can be given: a camera such as a video camera or a digital camera, a goggle type display (a head mounted display), a navigation system, an audio reproducing device (car audio set, or the like), a computer, a ganie machine, a portable information terminal (mobile computer, a cellular phone, a portable game machine, an e-book reader, or the like), and an image reproducing device provided with a recording medium (specifically, a device provided with a display that can reproduce a recording medium such as a digital versatile disc (DVD) and display the image), and the like.

Figure 18A:
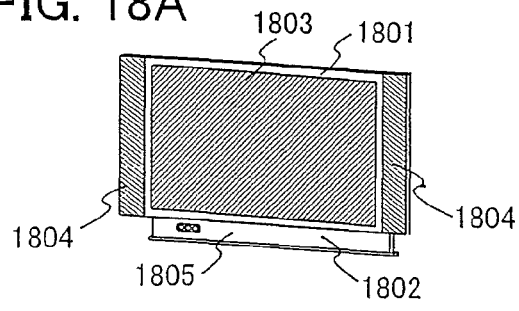
FIGS. 18A to 18H are views each illustrating an electronic appliance using a semiconductor device.

FIG. 18A illustrates a television set or a monitor of a personal computer. The television set or monitor of a personal computer includes a housing 1801, a support stand 1802, a display portion 1803, speaker portions 1804, video input terminals 1805, and the like. The semiconductor device of the present invention is used for the display portion 1803. According to the present invention, high-performance television sets or high-performance monitors of personal computers can be provided at low cost.

Figure 18B:
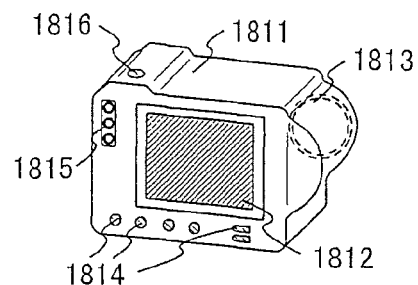

FIG. 18B illustrates a digital camera. On the front side part of a main body 1811, an image receiver 1813 is provided, and on the top side part of the main body 1811, a shutter button 1816 is provided. Furthermore, on the back side part of the main body 1811, a display portion 1812, operation keys 1814, and an external connection port 1815 are provided. The semiconductor device of the present invention is used for the display portion 1812. According to the present invention, high-performance digital cameras can be provided at low cost.

Figure 18C:
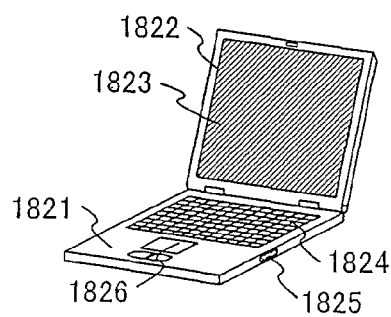

FIG. 18C illustrates a notebook personal computer. In a main body 1821, a keyboard 1824, an external connection port 1825, and a pointing device 1826 are provided. Furthermore, a housing 1822 that has a display portion 1823 is attached to the main body 1821. The semiconductor device of the present invention is used for the display portion 1823. According to the present invention, high-performance notebook personal computers can be provided at low cost.

Figure 18D:
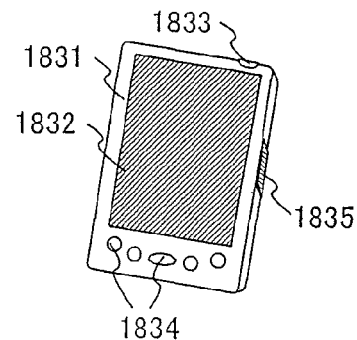

FIG. 18D illustrates a mobile computer that includes a main body 1831, a display portion 1832, a switch 1833, operation keys 1834, an infrared port 1835, and the like. Furthermore, an active matrix display device is provided in the display portion 1832. The semiconductor device of the present invention is used for the display portion 1832. According to the present invention, high-performance mobile computers can be provided at low cost.

Figure 18E:
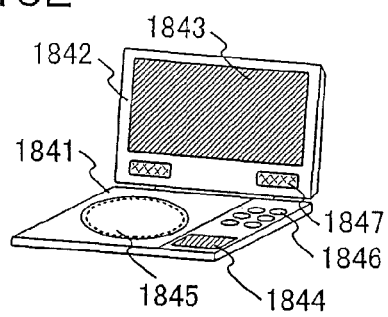

FIG. 18E illustrates an image reproducing device. In a main body 1841, a display portion B 1844, a storage media reader 1845, and operation keys 1846 are provided. Furthermore, a housing 1842 that has speaker portions 1847 and a display portion A 1843 is attached to the main body 1841. The semiconductor device of the present invention is used for each of the display portion A 1843 and the display portion B 1844. According to the present invention, high-performance image reproducing devices can be provided at low cost.

Figure 18F:
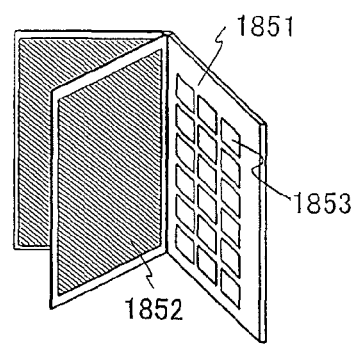

FIG. 18F illustrates an electronic book reader. In a main body 1851, operation keys 1853 are provided. Furthermore, a plurality of display portions 1852 is attached to the main body 1851. The semiconductor device of the present invention is used for the display portion 1852. According to the present invention, high-performance electronic book readers can be provided at low cost.

Figure 18G:
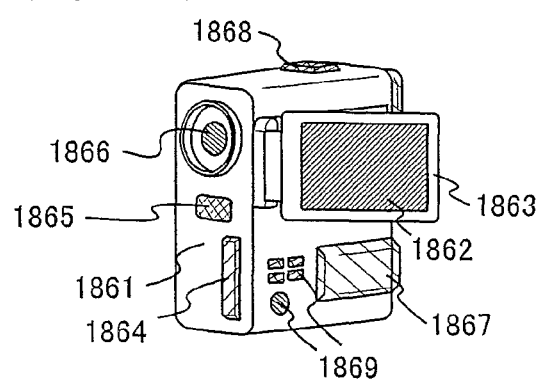

FIG. 18G illustrates a video camera. In a main body 1861, an external connection port 1864, a remote control receiver 1865, an image receiver 1866, a battery 1867, an audio input portion 1868, operation keys 1869 are provided. Furthermore, a housing 1863 that has a display portion 1862 is attached to the main body 1861. The semiconductor device of the present invention is used for the display portion 1862. According to the present invention, high-performance video cameras can be provided at low cost.

Figure 18H:
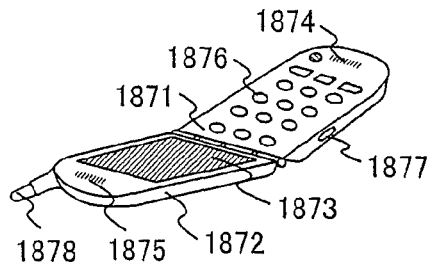

FIG. 18H illustrates a mobile phone, which includes a main body 1871, a housing 1872, a display portion 1873, an audio input portion 1874, an audio output portion 1875, operation keys 1876, an external connection port 1877, an antenna 1878, and the like. The semiconductor device of the present invention is used for the display portion 1873. According to the present invention, a high-performance mobile phone can be provided at low cost.

Figure 19A:
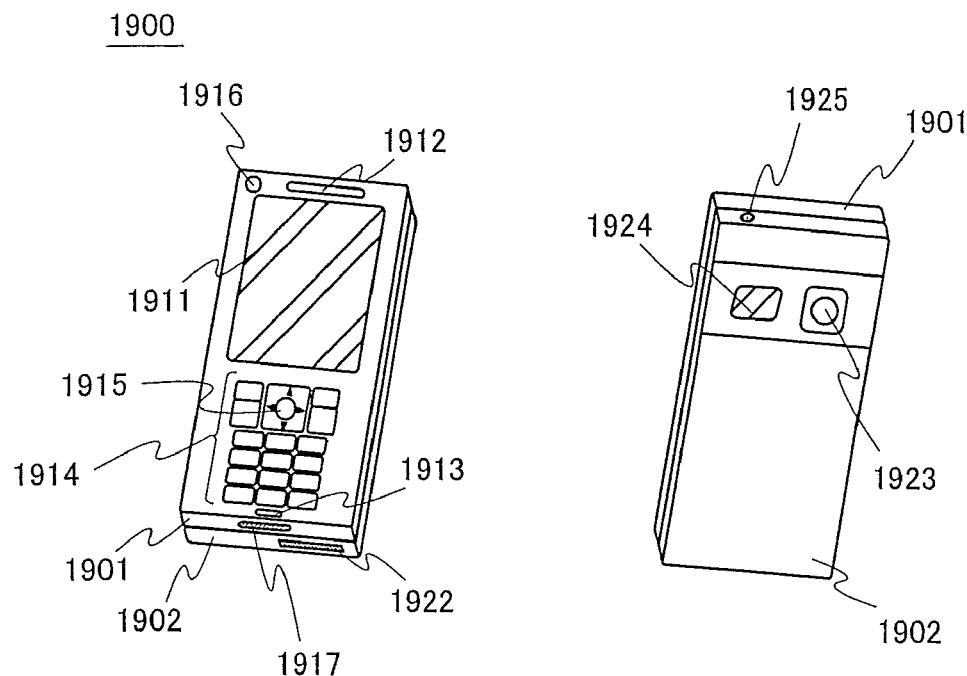
FIGS. 19A to 19C are views illustrating an electronic appliance using a semiconductor device.
Figure 19B:
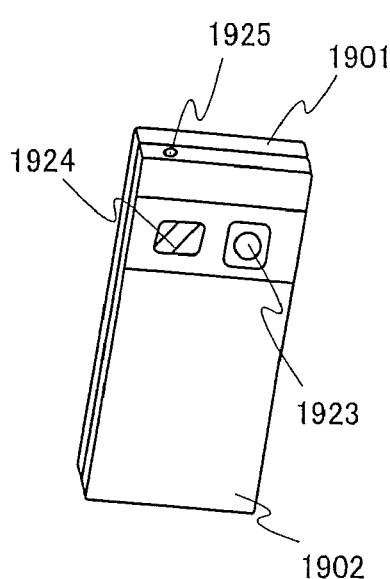
Figure 19C:
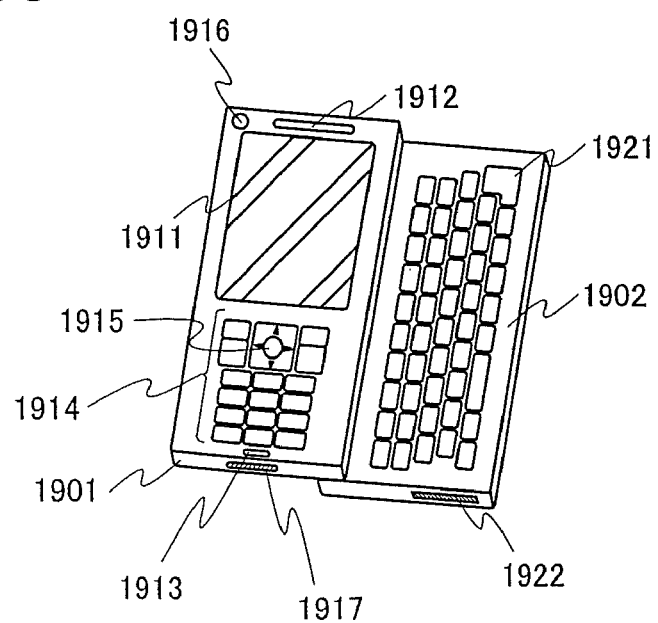
Figure 20A:
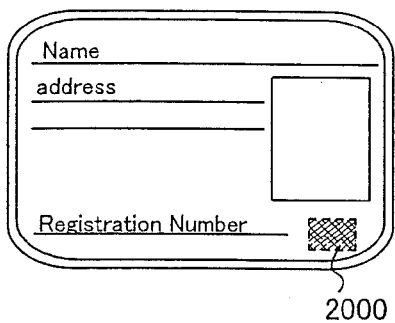
FIGS. 20A to 20F are views illustrating use modes of a semiconductor device.
Figure 20B:
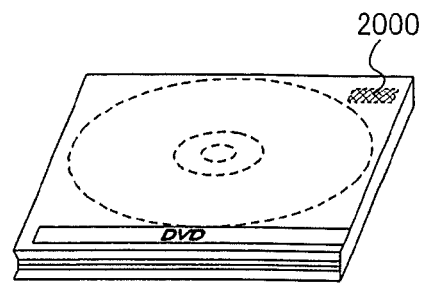
Figure 20C:
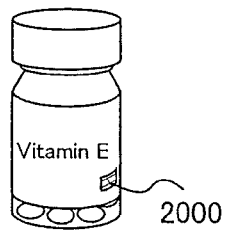
Figure 20D:
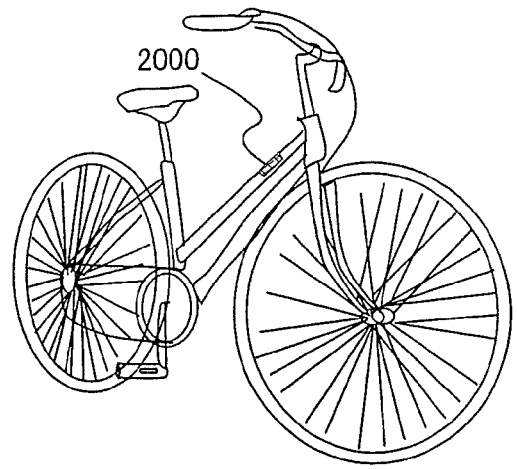
Figure 20E:
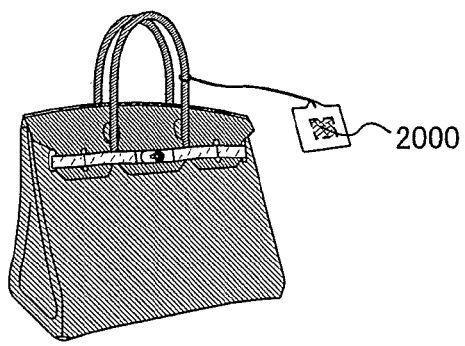
Figure 20F:
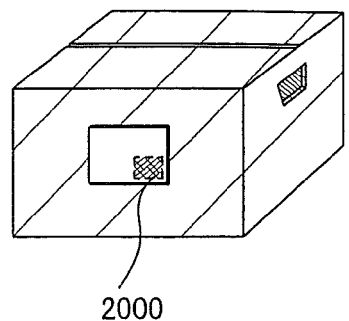
Figure 21A:
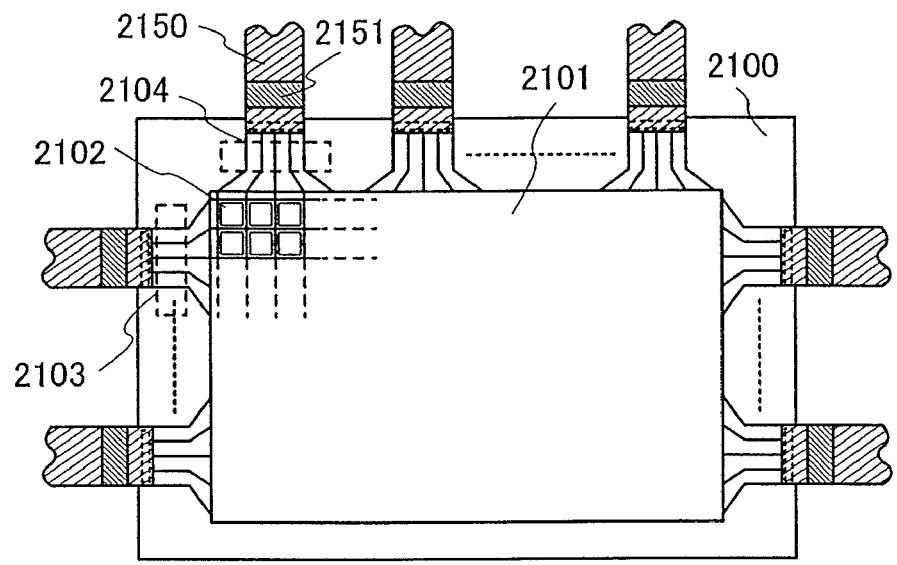
FIGS. 21A and 21B are views illustrating a conventional semiconductor device.
Figure 21B:
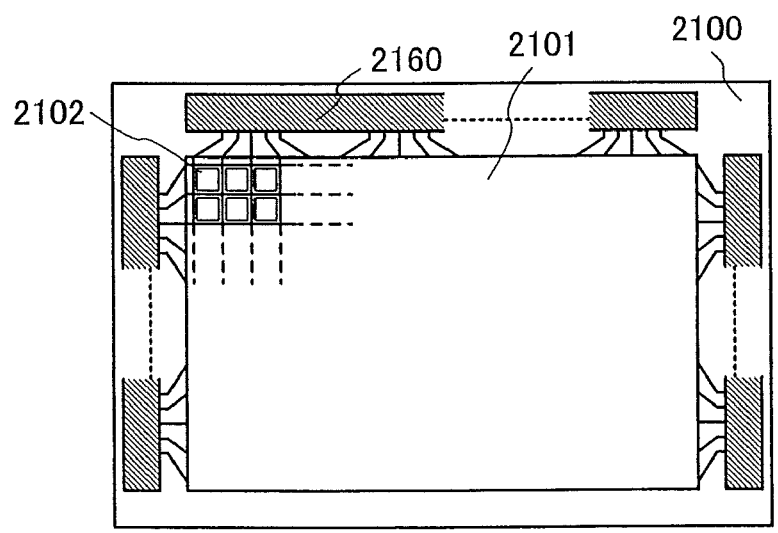

FIGS. 19A to 19C illustrate a structural example of a portable electronic device 1900 having functions as a telephone and an information terminal. FIG. 19A is a front view, FIG. 19B is a back view, and FIG. 19C is a developed view. The portable electronic device 1900 has functions as both a telephone and an information terminal and is an electronic device so-called a smartphone which is capable of various data processing in addition to voice call.

The portable electronic device 1900 includes housings 1901 and 1902. The housing 1901 is provided with a display portion 1911, a speaker 1912, a microphone 1913, operation keys 1914, a pointing device 1915, a lens 1916 for camera, an external connection terminal 1917, and the like. The housing 1902 is provided with a keyboard 1921, an external memory slot 1922, a lens 1923 for camera, a light 1924, an earphone terminal 1925, and the like. Moreover, an antenna is built into the housing 1901. In addition to the above-described structure, a non-contact IC chip, a small size memory device, or the like can be built therein.

The display portion 1911 includes a transistor formed using a single crystal semiconductor. An image displayed (and direction in which the image is displayed) in the display portion 1911 variously changes depending on a use mode of the portable electronic device 1900. Moreover, since the display portion 1911 and the lens 1916 for camera are provided on the same surface, voice call (so-called videophone) with images can be possible. Note that the speaker 1912 and the microphone 1913 can be used not only for voice call but also for recording, reproducing, or the like. In the case where a still image and a moving image are shot by using the lens 1923 for camera (and the light 1924), the display portion 1911 is used as a finder. The operation keys 1914 are used for incoming/outgoing of phone call, inputting simple information such as e-mail, screen scrolling, moving cursor, and the like.

The housings 1901 and 1902 overlapped with each other (FIG. 19A) slide and can be developed as illustrated in FIG. 19C, so that the portable electronic device 1900 can be used as an information terminal. In that case, smooth operation with the keyboard 1921 and the pointing device 1915 can be performed. The external connection terminal 1917 can be connected to various cables such as an AC adapter or a USB cable, whereby the portable electronic device 1900 can be charged or can perform data communication with a computer or the like. Moreover, by inserting a recording medium into the external memory slot 1922, the portable electronic device 400 can deal with storing and moving data with higher capacitance. In addition to the above-described functions, a function of wireless communication by using electromagnetic waves such as infrared rays, a function of receiving television, and the like can be included. According to the present invention, a high-performance portable electronic device can be provided at low cost.

As described above, the present invention can be widely applied to and used in electronic devices in a wide variety of fields. Note that this embodiment mode can be implemented by being combined with any of Embodiment Modes 1 to 7, as appropriate.

Embodiment Mode 9

In this embodiment mode describes applications of a semiconductor device, in particular, a wireless tag of the present invention will be described with reference to FIGS. 20A to 20F.

According to the present invention, a semiconductor device which functions as a wireless tag can be formed. A wireless tag can be used in a wide variety of applications, and may be used by being mounted on objects such as bills, coins, securities, bearer bonds, certificates (driver's licenses, resident cards, and the like, see FIG. 20A), containers for wrapping objects (wrapping paper, bottles, and the like, see FIG. 20C), recording media (DVD software, video tapes, and the like, see FIG. 20B), vehicles (bicycles and the like, see FIG. 20D), personal belongings (bags, glasses, and the like), foods, plants, clothes, lifestyle goods, and products such as electronic devices, or shipping tags of baggage (see FIGS. 20E and 20F). Note that the wireless tag is indicated by reference numeral 2000 in each of FIGS. 20A to 20F.

Note that the electronic device indicates a liquid crystal display device, an EL display device, a television unit (also simply referred to as a TV, a TV receiver, or a television receiver), a cellular phone, and the objects shown in Embodiment Mode 5, for example. The semiconductor device may also be mounted on animals, human body, and the like.

The wireless tag is attached to a surface of an object, or embedded to be fixed on an object. For example, the RFID tag may be embedded in paper of a book, or an organic resin of a container for wrapping an object to be fixed on each object. Counterfeits can be prevented by providing a wireless tag on the bills, coins, securities, bearer bonds, certificates, and the like. Further, by providing a wireless tag in containers for wrapping objects, recording media, personal belongings, foods, clothes, lifestyle goods, electronic devices, and the like, inspection systems, rental systems and the like can be performed more efficiently. The wireless tag that can be formed according to the present invention has high reliability though it is inexpensive, and can be applied to a wide variety of objects.

When a wireless tag that can be formed according to the present invention is applied to a management system or a distribution system of articles, the system can have high functionality. For example, information which is recorded in a wireless tag provided in a tag is read by a reader/writer provided near a conveyor belt, then information about a distribution process, a delivery destination, or the like is read out, and inspection of merchandise or distribution of goods can be easily carried out. Further, by integrating the wireless tag with the display device, a recognition by human eyes may be made possible.

As described above, the present invention can be widely applied to and used for a wide variety of objects. Note that this embodiment mode can be implemented by being combined with any of Embodiment Modes 1 to 8, as appropriate. This application is based on Japanese Patent Application serial no. 2007-305289 filed with Japan Patent Office on Nov. 27, 2007, the entire contents of which are hereby incorporated by reference.

What is claimed is:
1. A semiconductor device comprising:
an insulating layer over a substrate;
a first non-single-crystal semiconductor layer over the insulating layer;
a second non-single-crystal semiconductor layer over the insulating layer; and
a single crystal semiconductor layer over the second non-single-crystal semiconductor layer,
wherein the single crystal semiconductor layer overlaps with a part of the second non-single-crystal semiconductor layer,
wherein a semiconductor element of a pixel region comprises the first non-single-crystal semiconductor layer; and
wherein a semiconductor element of a driver circuit region comprises the single crystal semiconductor layer.
2. An electronic appliance using the semiconductor device according to claim 1.
3. A semiconductor device comprising:
a first insulating layer over a substrate;
a first non-single-crystal semiconductor layer over the first insulating layer;
a second non-single-crystal semiconductor layer over the first insulating layer;
a second insulating layer over the second non-single-crystal semiconductor layer; and
a single crystal semiconductor layer over the second insulating layer, wherein the single crystal semiconductor layer overlaps with a part of the second non-single-crystal semiconductor layer, wherein a semiconductor element of a pixel region comprises the first non-single-crystal semiconductor layer; and wherein a semiconductor element of a driver circuit region comprises the single crystal semiconductor layer.

4. An electronic appliance using the semiconductor device according to claim 3.

* * * * *